(12) United States Patent
Yamazaki

(10) Patent No.: US 10,147,823 B2
(45) Date of Patent: Dec. 4, 2018

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 51 days.

(21) Appl. No.: 15/070,713

(22) Filed: Mar. 15, 2016

(65) Prior Publication Data
US 2016/0276488 A1   Sep. 22, 2016

(30) Foreign Application Priority Data

Mar. 19, 2015  (JP) ................................. 2015-056580
Mar. 19, 2015  (JP) ................................. 2015-056585

(51) Int. Cl.
*H01L 29/78*    (2006.01)
*H01L 29/786*   (2006.01)
(Continued)

(52) U.S. Cl.
CPC .......... *H01L 29/7869* (2013.01); *H01L 29/24* (2013.01); *H01L 29/4908* (2013.01);
(Continued)

(58) Field of Classification Search
CPC ........... H01L 29/7869; H01L 29/78696; H01L 29/78648; H01L 29/24; H01L 29/78603;
(Continued)

(56) References Cited

U.S. PATENT DOCUMENTS 5,528,032 A   6/1996   Uchiyama et al.
5,731,856 A   3/1998   Kim et al.
(Continued)

FOREIGN PATENT DOCUMENTS

EP   1737044 A   12/2006
EP   2226847 A    9/2010
(Continued)

OTHER PUBLICATIONS

Morosawa N et al. , "35.3: Distinguished Paper: A Novel Self-Aligned Top-Gate Oxide TFT for AM-OLED Displays", *SID Digest '11: SID International Sumposium Digest of Technical Papers*, May 17, 2011, pp. 479-482.

(Continued)

*Primary Examiner* — Syed Gheyas
*Assistant Examiner* — S. M. S Imtiaz
(74) *Attorney, Agent, or Firm* — Fish & Richardson P.C.

(57) ABSTRACT

A transistor with stable electrical characteristics. A semiconductor device that includes an oxide semiconductor, a first conductor, a first insulator, a second insulator, a third insulator, and a fourth insulator. The oxide semiconductor is positioned over the first insulator. The second insulator is positioned over the oxide semiconductor. The third insulator is positioned over the second insulator. The first conductor is positioned over the third insulator. The fourth insulator is positioned over the first conductor. The fourth insulator includes a region in contact with a top surface of the second insulator. The oxide semiconductor includes a region overlapping with the first conductor with the second insulator and the third insulator positioned therebetween. When seen from above, a periphery of the first insulator and a periphery of the second insulator are located outside a periphery of the oxide semiconductor.

13 Claims, 44 Drawing Sheets

(51) Int. Cl.
*H01L 29/24* (2006.01)
*H01L 29/51* (2006.01)
*H01L 29/49* (2006.01)

(52) U.S. Cl.
CPC .......... *H01L 29/513* (2013.01); *H01L 29/517* (2013.01); *H01L 29/78603* (2013.01); *H01L 29/78648* (2013.01); *H01L 29/78696* (2013.01)

(58) Field of Classification Search
CPC .. H01L 29/517; H01L 29/4908; H01L 29/513
See application file for complete search history.

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,003,981 B2 | 8/2011 | Iwasaki et al. |
| 8,164,090 B2 | 4/2012 | Iwasaki et al. |
| 8,421,068 B2 | 4/2013 | Yamazaki et al. |
| 8,421,069 B2 | 4/2013 | Yamazaki et al. |
| 9,048,323 B2 | 6/2015 | Yamazaki et al. |
| 9,166,060 B2 | 10/2015 | Yamazaki et al. |
| 9,202,925 B2 | 12/2015 | Yamazaki et al. |
| 9,209,307 B2 | 12/2015 | Yamazaki et al. |
| 9,281,408 B2 | 3/2016 | Yamazaki et al. |
| 9,385,238 B2 | 7/2016 | Yamazaki |
| 9,484,466 B2 * | 11/2016 | Takeuchi ............ H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0140098 A1 * | 10/2002 | Takayanagi ............ C23C 16/401 257/758 |
| 2003/0189401 A1 | 10/2003 | Kido et al. |
| 2003/0207511 A1 | 11/2003 | Yamazaki |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118869 A1 * | 6/2006 | Lan ................... H01L 29/42384 257/347 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0073705 A1 * | 3/2008 | Hisamoto .......... G11C 16/0425 257/326 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0098710 A1 | 4/2009 | Yamazaki |
| 2009/0098720 A1 | 4/2009 | Isobe et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109003 A1 * | 5/2010 | Akimoto ............ H01L 27/1225 257/43 |
| 2010/0193772 A1 | 8/2010 | Morosawa et al. |
| 2010/0301326 A1 * | 12/2010 | Miyairi ............... H01L 27/1225 257/43 |
| 2011/0204362 A1 * | 8/2011 | Akimoto ............ H01L 29/41733 257/52 |
| 2011/0240998 A1 | 10/2011 | Morosawa et al. |
| 2011/0281394 A1 * | 11/2011 | Yamazaki .......... H01L 21/0237 438/104 |
| 2012/0001167 A1 | 1/2012 | Morosawa |
| 2012/0315730 A1 | 12/2012 | Koezuka et al. |
| 2012/0315735 A1 | 12/2012 | Koezuka et al. |
| 2012/0319114 A1 | 12/2012 | Yamazaki et al. |
| 2013/0009209 A1 | 1/2013 | Yamazaki |
| 2013/0020571 A1 | 1/2013 | Yamazaki et al. |
| 2013/0056828 A1 * | 3/2013 | Jeong ................ H01L 29/42384 257/347 |
| 2013/0082263 A1 * | 4/2013 | Honda ................ H01L 29/7869 257/57 |
| 2013/0240875 A1 * | 9/2013 | Endo ................. H01L 29/78621 257/43 |

(56) References Cited

U.S. PATENT DOCUMENTS

| | | | | |
|---|---|---|---|---|
| 2013/0288426 | A1* | 10/2013 | Akimoto | H01L 29/66765 438/104 |
| 2014/0008647 | A1* | 1/2014 | Yamazaki | H01L 29/7869 257/43 |
| 2014/0339548 | A1 | 11/2014 | Yamazaki et al. | |
| 2015/0084044 | A1 | 3/2015 | Tanaka et al. | |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 06-275697 | A | 9/1994 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2011-228622 | A | 11/2011 |
| JP | 2012-015436 | A | 1/2012 |
| WO | WO-2004/114391 | | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul, 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:the "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters), Sep. 27, 2004, vol.85, No. 13, pp. 2541-2543.

Fung.T et al., "2-D Numerical Simulation of High Performance Amorphous In—Ga—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 33, pp. 1330-1833.

Hsieh.H et al., "P-29:Modeling of Amorphous Oxide Semiconductor Thin Film Transistors and Subgap Density of States", SID Digest '08: SID International Symposium Digest Of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 13, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06: Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07: SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 8th International-Display Workshops, Dec. 3, 2008, pp. 581-584.
Nakamura.M et al., "The phase relations in the In2O3—Ga2ZnO4—ZnO system at 1350°C", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 53, pp. 4303-4308.
Nomura.K et al., "Carrier transport in transparent oxide semiconductor with intrinsic structural randomness probed using single-crystalline InGaOS(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 399-902.
Oba.F et al., "Defect energetics in ZnO: A hybrid Hartree-Fock density functional study", Phys. Rev. B. (Physical Review. B); 2008, vol. 77, pp. 245262-1-245202-6.
Oh.M et al., "Improving the Gate Stability of ZNO Thin-Film Transistors With Aluminum Oxide Dielectric Layers", J. Electrochem. Soc. (Journal of The Electrochemical Society), 2008, vol. 155, No. 12, pp. H1009-H1014.
OHara.H et al., "21.3:4.0 In. QVGA AMOLED Display Using In—Ga—Zn-Oxide TFTS With a Novel Passivation Layer", SID Digest '09: SID International Symposium Digest of Technical Papers, May 31, 2009, pp. 284-287.
OHara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09: SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the device characteristics of amorphous indium gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZNO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (GazO3—InzO3—ZnO) TFT", SID Digest '08: SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.
Tsuda.K et al., "Ultra Low Power Consumption Technologies for Mobile TFT-LCDs ", IDW'02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 12A
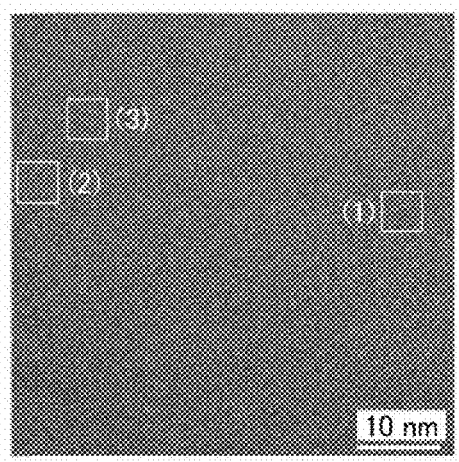
FIG. 12B     FIG. 12C     FIG. 12D
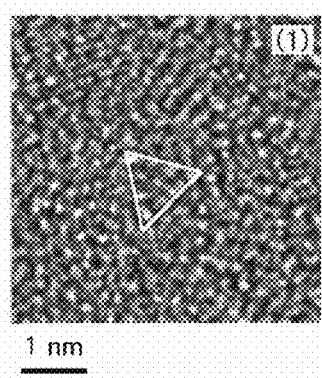 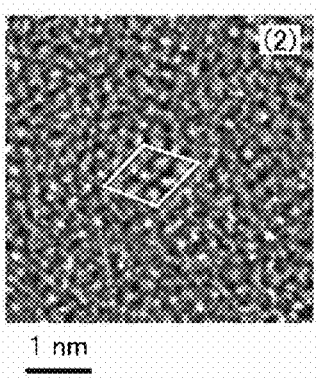 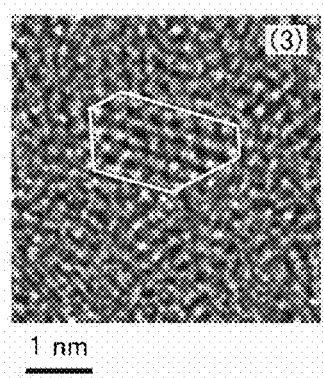

FIG. 14A
FIG. 14B
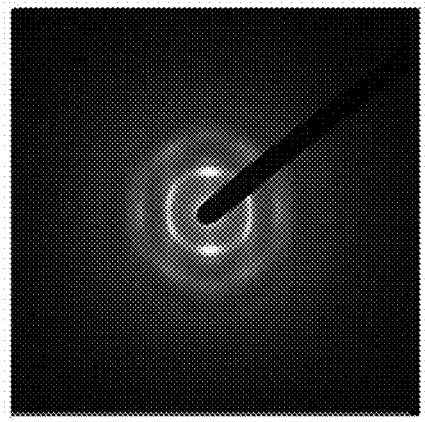
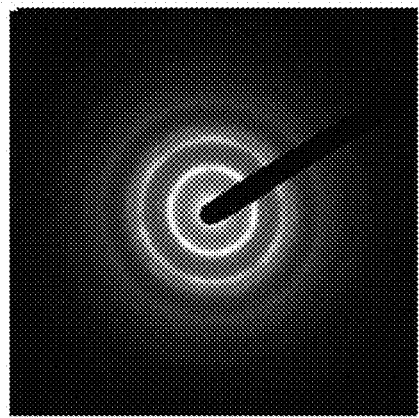

FIG. 38A1
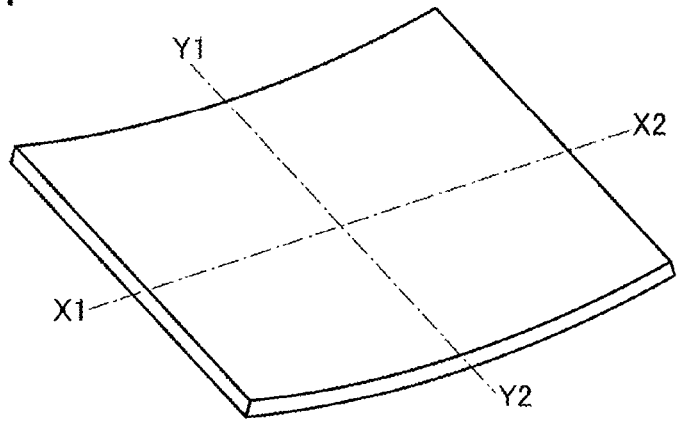
FIG. 38A2
FIG. 38A3
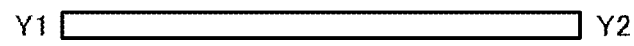
FIG. 38B1
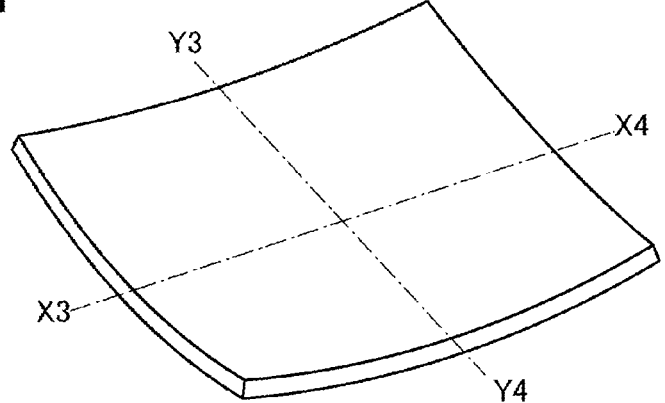
FIG. 38B2
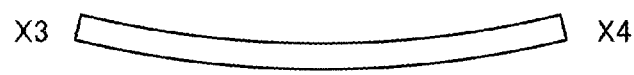
FIG. 38B3
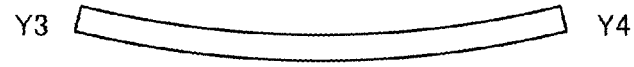

SEMICONDUCTOR DEVICE

BACKGROUND OF THE INVENTION

1. Field of the Invention

The present invention relates to, for example, a transistor or a semiconductor device. The present invention relates to, for example, a method for manufacturing a transistor or a semiconductor device. The present invention relates to, for example, a display device, a light-emitting device, a lighting device, a power storage device, a memory device, a processor, or an electronic device. The present invention relates to a method for manufacturing a display device, a liquid crystal display device, a light-emitting device, a memory device, or an electronic device. The present invention relates to a driving method of a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. On the other hand, in the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed. Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

The transistor including an oxide semiconductor has different features from a transistor including amorphous silicon or polycrystalline silicon. For example, a display device in which a transistor including an oxide semiconductor is used is known to have low power consumption. An oxide semiconductor can be formed by a sputtering method or the like, and thus can be used in a transistor included in a large display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

REFERENCE

Patent Document

[Patent Document 1] Japanese Published Patent Application No. S63-239117
[Patent Document 2] Japanese translation of PCT international application No. H11-505377

SUMMARY OF THE INVENTION

An object is to provide a transistor with stable electrical characteristics. Another object is to provide a transistor having a low leakage current in an off state. Another object is to provide a transistor having a high on-state current. Another object is to provide a transistor with normally-off electrical characteristics. Another object is to provide a transistor with a small subthreshold swing value. Another object is to provide a highly reliable transistor.

Another object is to provide a semiconductor device including the transistor. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device that includes an oxide semiconductor, a first conductor, a first insulator, a second insulator, a third insulator, and a fourth insulator. The oxide semiconductor is positioned over the first insulator. The second insulator is positioned over the oxide semiconductor. The third insulator is positioned over the second insulator. The first conductor is positioned over the third insulator. The fourth insulator is positioned over the first conductor. The fourth insulator includes a region in contact with a top surface of the second insulator. The oxide semiconductor includes a region overlapping with the first conductor with the second insulator and the third insulator positioned therebetween. When seen from above, a periphery of the first insulator and a periphery of the second insulator are located outside a periphery of the oxide semiconductor.

In the above semiconductor device, it is preferable that the fourth insulator include a first element, the second insulator include a first region overlapping with the first conductor and a second region and a third region not overlapping with the first conductor, and the second region and the third region have a higher concentration of the first element than the first region.

In the above semiconductor device, the first element is preferably aluminum, boron, magnesium, silicon, titanium, vanadium, chromium, nickel, zinc, gallium, germanium, yttrium, zirconium, niobium, molybdenum, indium, tin, lanthanum, cerium, neodymium, hafnium, tantalum, or tungsten.

In any of the above semiconductor devices, it is preferable that the oxide semiconductor include oxygen and a second element, and the first insulator and/or the second insulator include oxygen and the second element. The second element may be gallium.

Any of the above semiconductor devices may further include a fifth insulator and may have a structure in which the fifth insulator is positioned under the first insulator, the fifth insulator includes a projection, and when seen from above, a periphery of the projection of the fifth insulator is located inside the periphery of the oxide semiconductor.

Any of the above semiconductor devices may further include a fifth insulator and a second conductor and may have a structure in which the fifth insulator is positioned under the first insulator, the second conductor is positioned under the fifth insulator, and the oxide semiconductor includes a region overlapping with the second conductor with the first insulator and the fifth insulator positioned therebetween.

(2) One embodiment of the present invention is a semiconductor device that includes an oxide semiconductor, a first conductor, a first insulator, a second insulator, a third insulator, a fourth insulator, and a fifth insulator. The oxide semiconductor is positioned over the first insulator. The second insulator is positioned over the oxide semiconductor. The third insulator is positioned over the second insulator. The first conductor is positioned over the third insulator. The fourth insulator is positioned in contact with a side surface of the first conductor. The fifth insulator is positioned over the first conductor and the fourth insulator. The fourth insulator and the fifth insulator each include a region in contact with a top surface of the third insulator. The oxide semiconductor includes a region overlapping with the first conductor with the second insulator and the third insulator positioned therebetween. When seen from above, a periphery of the first insulator and a periphery of the second insulator are located outside a periphery of the oxide semiconductor.

In the above semiconductor device, it is preferable that the fifth insulator include a first element, the second insulator include a first region overlapping with at least one of the first conductor and the fourth insulator and a second region and a third region not overlapping with at least one of the first conductor and the fourth insulator, and the second region and the third region have a higher concentration of the first element than the first region.

In the above semiconductor device, the first element is preferably aluminum, boron, magnesium, silicon, titanium, vanadium, chromium, nickel, zinc, gallium, germanium, yttrium, zirconium, niobium, molybdenum, indium, tin, lanthanum, cerium, neodymium, hafnium, tantalum, or tungsten.

In any of the above semiconductor devices, it is preferable that the first region include a fourth region overlapping with the first conductor and a fifth region overlapping with the fourth insulator, and the fifth region have a higher concentration of helium, neon, argon, krypton, xenon, boron, nitrogen, fluorine, phosphorus, chlorine, or arsenic than the fourth region.

In any of the above semiconductor devices, it is preferable that the oxide semiconductor include oxygen and a second element, and the first insulator and/or the second insulator include oxygen and the second element. The second element may be gallium.

Any of the above semiconductor devices may further include a sixth insulator and may have a structure in which the sixth insulator is positioned under the first insulator, the sixth insulator includes a projection, and when seen from above, a periphery of the projection of the sixth insulator is located inside the periphery of the oxide semiconductor.

Any of the above semiconductor devices may further include a sixth insulator and a second conductor and may have a structure in which the sixth insulator is positioned under the first insulator, the second conductor is positioned under the sixth insulator, and the oxide semiconductor includes a region overlapping with the second conductor with the first insulator and the sixth insulator positioned therebetween.

A transistor with stable electrical characteristics can be provided. A transistor having a low leakage current in an off state can be provided. A transistor having a high on-state current can be provided. A transistor with normally-off electrical characteristics can be provided. A transistor with a small subthreshold swing value can be provided. A highly reliable transistor can be provided.

A semiconductor device including the transistor can be provided. A module including the semiconductor device can be provided. An electronic device including the semiconductor device or the module can be provided. A novel semiconductor device can be provided. A novel module can be provided. A novel electronic device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 12A to 12D are Cs-corrected high-resolution TEM images of a plane of a CAAC-OS.

FIGS. 14A and 14B show electron diffraction patterns of a CAAC-OS.

FIGS. 38A1, 38A2, 38A3, 38B1, 38B2, and 38B3 are perspective views and cross-sectional views illustrating semiconductor devices of embodiments of the present invention.

DETAILED DESCRIPTION OF THE INVENTION

Figure 1A:
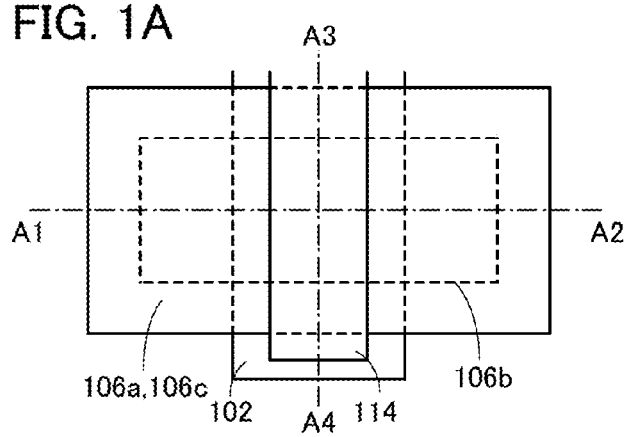
FIGS. 1A to 1E are a top view and cross-sectional views illustrating a transistor of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential. Note that in general, a potential (a voltage) is relative and is determined depending on the amount relative to a reference potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values might be different from those calculated by using an effective channel width.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, structures of semiconductor devices of embodiments of the present invention will be described with reference to FIGS. 1A to 1E, FIGS. 2A to 2D, and FIGS. 3A to 3C.

<Structure 1 of Transistor>

Structures of transistors, which are examples of the semiconductor devices of embodiments of the present invention, will be described below.

Figure 1B:
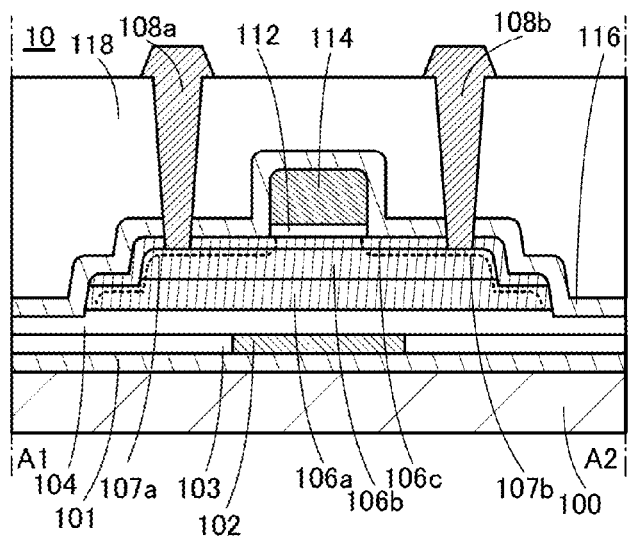
Figure 1C:
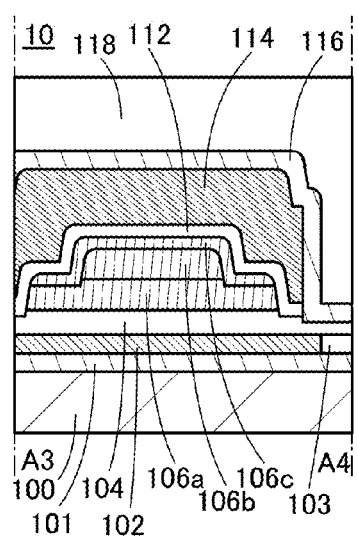

A structure of a transistor 10 will be described with reference to FIGS. 1A to 1C. FIG. 1A is a top view of the transistor 10. FIG. 1B is a cross-sectional view taken along dashed-dotted line A1-A2 in FIG. 1A. FIG. 1C is a cross-sectional view taken along dashed-dotted line A3-A4 in FIG. 1A. A region along dashed-dotted line A1-A2 shows a structure of the transistor 10 in the channel length direction, and a region along dashed-dotted line A3-A4 shows a structure of the transistor 10 in the channel width direction. The channel length direction of a transistor refers to a direction in which carriers move between a source (source region or source electrode) and a drain (drain region or drain electrode). The channel width direction refers to a direction perpendicular to the channel length direction in a plane parallel to a substrate. Note that in FIG. 1A, some components (e.g., an insulating film functioning as a protective insulating film) of the transistor 10 are not illustrated to avoid complexity. As in FIG. 1A, some components are not illustrated in some cases in top views of transistors described below.

The transistor 10 includes a semiconductor 106*b*, a conductor 114, an insulator 106*a*, an insulator 106*c*, an insulator 112, and an insulator 116. The semiconductor 106*b* is provided over the insulator 106*a*, the insulator 106*c* is provided over the semiconductor 106*b*, the insulator 112 is provided over the insulator 106*c*, and the conductor 114 is provided over the insulator 112. The insulator 116 is provided over the conductor 114 and includes a region in contact with a top surface of the insulator 106c. The semiconductor 106b includes a region that overlaps with the conductor 114 with the insulator 106c and the insulator 112 provided therebetween. When seen from above as illustrated in FIG. 1A, the peripheries of the insulator 106a and the insulator 106c are located outside the periphery of the semiconductor 106b.

For example, as illustrated in FIGS. 1A to 1C, the transistor 10 includes an insulator 101, a conductor 102, an insulator 103, and an insulator 104 that are formed over a substrate 100; the insulator 106a, the semiconductor 106b, and the insulator 106c that are formed over the insulator 104; an insulator 112 and a conductor 114 formed over the insulator 106c; and an insulator 116, an insulator 118, a conductor 108a, and a conductor 108b that are formed over the conductor 114.

Here, the insulator 101, the insulator 103, the insulator 104, the insulator 106a, the insulator 106c, the insulator 112, the insulator 116, and the insulator 118 can also be referred to as insulating films or insulating layers. The conductor 102, the conductor 108a, the conductor 108b, and the conductor 114 can also be referred to as conductive films or conductive layers. The semiconductor 106b can also be referred to as a semiconductor film or a semiconductor layer.

The insulator 103 is formed over the insulator 101 formed over the substrate 100, and the conductor 102 is formed to be embedded in the insulator 103. The insulator 104 is formed over the insulator 103 and the conductor 102. Here, the insulator 101 is preferably formed using an insulator that has an effect of blocking oxygen, hydrogen, water, and the like. The insulator 104 is preferably formed using an insulator containing oxygen.

Figure 1D:
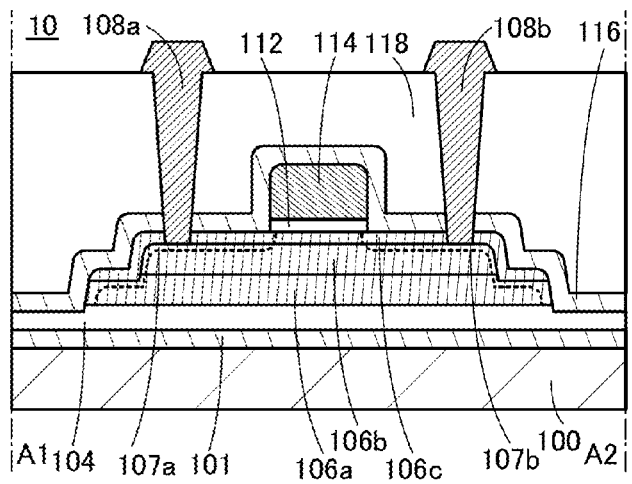
Figure 1E:
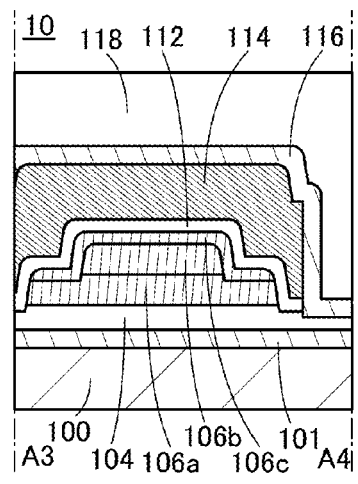

Although the transistor 10 includes the conductor 102 and the insulator 103, a structure of a semiconductor device in this embodiment is not limited to this structure. For example, a structure without the conductor 102 and the insulator 103 as illustrated in FIGS. 1D and 1E may be employed.

The insulator 106a is formed over the insulator 104, the semiconductor 106b is formed in contact with a top surface of the insulator 106a, and the insulator 106c is formed in contact with the top surface of the insulator 106a and a top surface of the semiconductor 106b. Here, it is preferable that at least part of the semiconductor 106b overlap with the conductor 102. An end portion of a side surface of the semiconductor 106b, especially, an end portion of a side surface thereof in the channel width direction is in contact with the insulator 106a and the insulator 106c. An end portion of a side surface of the insulator 106a, especially, an end portion of a side surface thereof in the channel width direction is substantially aligned with an end portion of a side surface of the insulator 106c, especially, an end portion of a side surface thereof in the channel width direction. Accordingly, in the transistor 10 described in this embodiment, the semiconductor 106b is surrounded by the insulator 106a and the insulator 106c.

Patterning is performed such that the end portion of the side surface of the semiconductor 106b is located inward from the end portion of the side surface of the insulator 106a as illustrated in FIGS. 1B and 1C, whereby the number of times of etching the insulator 104 at the time of etching the insulator 106a or the semiconductor 106b can be reduced. A portion of a surface of the insulator 104 that is to be etched can be away from the conductor 102, leading to an improvement in withstand voltage characteristics of the transistor 10.

Although the end portion of the side surface of the insulator 106a and the end portion of the side surface of the insulator 106c are substantially aligned with each other in FIGS. 1B and 1C, the transistor described in this embodiment is not limited to this structure. For example, the periphery of the insulator 106a may be located outward from the periphery of the insulator 106c and the periphery of the insulator 106c may be located outward from the periphery of the insulator 106a.

A low-resistance region 107a and a low-resistance region 107b are formed in the vicinity of the interface between the insulator 116 and the insulator 106a, the semiconductor 106b, and the insulator 106c (indicated with a dotted line in FIG. 1B). The low-resistance region 107a and the low-resistance region 107b contain at least one of the elements contained in the insulator 116. It is preferable that the low-resistance region 107a and the low-resistance region 107b be partly and substantially in contact with a region of the semiconductor 106b overlapping with the conductor 114 (channel formation region) or partly overlap with the region.

Since a large region of the insulator 106c is in contact with the insulator 116, the low-resistance region 107a and the low-resistance region 107b are easily formed in the insulator 106c. The concentration of the element contained in the insulator 116 is higher in the low-resistance region 107a and the low-resistance region 107b included in the insulator 106c than in a region of the insulator 106c other than the low-resistance region 107a and the low-resistance region 107b (e.g., a region of the insulator 106c overlapping with the conductor 114).

The insulator 112 is formed over the insulator 106c, and the conductor 114 is formed over the insulator 112. At least part of each of the insulator 112 and the conductor 114 overlaps with the conductor 102 and the semiconductor 106b. It is preferable that an end portion of a side surface of the conductor 114 in the channel length direction be substantially aligned with an end portion of a side surface of the insulator 112 in the channel length direction. Here, the insulator 112 serves as a gate insulating film of the transistor 10 and the conductor 114 serves as a gate electrode of the transistor 10.

The insulator 116 is formed over the conductor 114, the insulator 106c, and the insulator 104. The insulator 116 is preferably in contact with a region of the insulator 106c that does not overlap with the insulator 112. The insulator 116 may be in contact with at least part of the insulator 104. The insulator 118 is formed over the insulator 116. Here, the insulator 116 serves as a protective insulating film of the transistor 10 and the insulator 118 serves as an interlayer insulating film of the transistor 10. The insulator 116 is preferably formed using an insulator that has an effect of blocking oxygen.

The conductor 108a and the conductor 108b are formed over the insulator 118. The conductor 108a and the conductor 108b are in contact with the low-resistance region 107a and the low-resistance region 107b through openings formed in the insulator 118, the insulator 116, and the insulator 106c. The conductor 108a and the conductor 108b are spaced and are preferably formed to face each other with the conductor 114 provided therebetween as illustrated in FIG. 1B. Here, the conductor 108a functions as one of a source electrode and a drain electrode of the transistor 10, and the conductor 108b functions as the other of the source electrode and the drain electrode of the transistor 10. Although the conductor 108a and the conductor 108b are in contact with the semiconductor 106b in FIG. 1B, this embodiment is not limited to this structure. As long as the contact resistance with the low-resistance region 107a and the low-resistance region 107b is sufficiently low, the conductor 108a and the conductor 108b may be in contact with the insulator 106c.

<Semiconductor>

The structure of the semiconductor 106b is described in detail below.

In this section, a detailed structure of each of the insulator 106a and the insulator 106c will be described in addition to that of the semiconductor 106b.

The semiconductor 106b is an oxide semiconductor containing indium, for example. The semiconductor 106b can have high carrier mobility (electron mobility) by containing indium. The semiconductor 106b preferably contains an element M. The element M is preferably Ti, Ga, Y, Zr, La, Ce, Nd, Sn, or Hf. Note that two or more of the above elements may be used in combination as the element M in some cases. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 106b preferably contains zinc. When the oxide semiconductor contains zinc, the oxide semiconductor is easily crystallized, in some cases.

Note that the semiconductor 106b is not limited to the oxide semiconductor containing indium. The semiconductor 106b may be, for example, an oxide semiconductor which does not contain indium and contains zinc, an oxide semiconductor which does not contain indium and contains gallium, or an oxide semiconductor which does not contain indium and contains tin, e.g., zinc tin oxide and gallium tin oxide.

The insulator 106a and the insulator 106c include one or more elements, or two or more elements other than oxygen included in the semiconductor 106b. Since the insulator 106a and the insulator 106c each include one or more elements, or two or more elements other than oxygen included in the semiconductor 106b, a defect state is less likely to be formed at the interface between the insulator 106a and the semiconductor 106b and the interface between the semiconductor 106b and the insulator 106c.

The insulator 106a, the semiconductor 106b, and the insulator 106c preferably include at least indium. In the case of using an In-M-Zn oxide as the insulator 106a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 106b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the insulator 106c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the insulator 106a or the insulator 106c does not necessarily contain indium in some cases. For example, the insulator 106a or the insulator 106c may be gallium oxide or a Ga—Zn oxide. Note that the atomic ratio between the elements included in the insulator 106a, the semiconductor 106b, and the insulator 106c is not necessarily a simple integer ratio.

In the case of deposition using a sputtering method, typical examples of the atomic ratio between the metal elements of a target that is used for the insulator 106a or the insulator 106c include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, and In:M:Zn=1:6:9. The atomic ratio between the metal elements of the target that is used for the insulator 106a may be M:Zn=10:1.

In the case of deposition using a sputtering method, typical examples of the atomic ratio between the metal elements of a target that is used for the semiconductor 106b include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and In:M:Zn=4:2:4.1. In particular, when a sputtering target containing In, Ga, and Zn at an atomic ratio of 4:2:4.1 is used, the deposited semiconductor 106b may contain In, Ga, and Zn at an atomic ratio of around 4:2:3.

An indium gallium oxide has small electron affinity and a high oxygen-blocking property. Therefore, the insulator 106c preferably includes an indium gallium oxide. The gallium atomic ratio [Ga/(In+Ga)] is, for example, higher than or equal to 70%, preferably higher than or equal to 80%, further preferably higher than or equal to 90%.

For the semiconductor 106b, an oxide with a wide energy gap may be used, for example. For example, the energy gap of the semiconductor 106b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Here, the energy gap of the insulator 106a is larger than that of the semiconductor 106b. The energy gap of the insulator 106c is larger than that of the semiconductor 106b.

As the semiconductor 106b, an oxide having an electron affinity larger than that of the insulator 106a or the insulator 106c is used. For example, as the semiconductor 106b, an oxide having an electron affinity larger than that of the insulator 106a or the insulator 106c by 0.07 eV or higher and 1.3 eV or lower, preferably 0.1 eV or higher and 0.7 eV or lower, and further preferably 0.15 eV or higher and 0.4 eV or lower is used. Note that the electron affinity refers to an energy difference between the vacuum level and the conduction band minimum. In other words, the energy gap between the conduction band minimum of the insulator 106a or the insulator 106c and the vacuum level is closer than the energy gap between that of the semiconductor 106b and the vacuum level.

In such a case, gate voltage application results in channel formation not in the insulator 106a or the insulator 106c but in the semiconductor 106b having a higher electron affinity.

The insulator 106a and the insulator 106c are formed using a substance that can function as a conductor, a semiconductor, or an insulator when they are used alone. However, when the transistor is formed using a stack including the insulator 106a, the semiconductor 106b, and the insulator 106c, electrons flow in the semiconductor 106b, in the vicinity of the interface between the semiconductor 106b and the insulator 106a, and in the vicinity of the interface between the semiconductor 106b and the insulator 106c; thus, the insulator 106a and the insulator 106c have a region not functioning as a channel of the transistor. For that reason, in this specification and the like, the insulator 106a and the insulator 106c are not referred to as a semiconductor but an insulator. Note that the reason why the insulator 106a and the insulator 106c are referred to as an insulator is because they are closer to an insulator than the semiconductor 106b is in terms of their function in the transistor; thus, a substance that can be used for the semiconductor 106b is used for the insulator 106a and the insulator 106c in some cases.

Here, in some cases, there is a mixed region of the insulator 106a and the semiconductor 106b between the insulator 106a and the semiconductor 106b. Furthermore, in some cases, there is a mixed region of the insulator 106c and the semiconductor 106b between the insulator 106c and the semiconductor 106b. The mixed region has a low density of defect states. For that reason, the stack including the insulator 106a, the semiconductor 106b, and the insulator 106c has a band structure where energy is changed continuously at each interface and in the vicinity of the interface (continuous junction). Note that the boundary between the insulator 106a and the semiconductor 106b and the boundary between the insulator 106c and the semiconductor 106b are not clear in some cases.

At this time, electrons move mainly in the semiconductor 106b, not in the insulator 106a and the insulator 106c. As described above, when the density of defect states at the interface between the insulator 106a and the semiconductor 106b and the density of defect states at the interface between the insulator 106c and the semiconductor 106b are decreased, electron movement in the semiconductor 106b is less likely to be inhibited and the on-sate current of the transistor can be increased.

As factors in inhibiting electron movement are decreased, the on-state current of the transistor can be increased. For example, in the case where there is no factor in inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of a top surface or a bottom surface of the semiconductor 106b (a formation surface; here, the top surface of the insulator 106a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

Moreover, the thickness of the insulator 106c is preferably as small as possible to increase the on-state current of the transistor. It is preferable that the thickness of the insulator 106c is smaller than that of the insulator 106a and smaller than that of the semiconductor 106b. For example, the insulator 106c is formed to include a region having a thickness of less than 10 nm, preferably less than or equal to 5 nm, further preferably less than or equal to 3 nm. Meanwhile, the insulator 106c has a function of blocking entry of elements other than oxygen (such as hydrogen and silicon) included in the adjacent insulator into the semiconductor 106b where a channel is formed. For this reason, it is preferable that the insulator 106c have a certain thickness. For example, the insulator 106c is formed to include a region having a thickness of greater than or equal to 0.3 nm, preferably greater than or equal to 1 nm, further preferably greater than or equal to 2 nm.

To improve reliability, preferably, the thickness of the insulator 106a is large. For example, the insulator 106a includes a region with a thickness of, for example, greater than or equal to 10 nm, preferably greater than or equal to 20 nm, further preferably greater than or equal to 40 nm, still further preferably greater than or equal to 60 nm. When the thickness of the insulator 106a is made large, a distance from an interface between the adjacent insulator and the insulator 106a to the semiconductor 106b in which a channel is formed can be large. Since the productivity of the semiconductor device might be decreased, the insulator 106a has a region with a thickness of, for example, less than or equal to 200 nm, preferably less than or equal to 120 nm, further preferably less than or equal to 80 nm.

For example, silicon in the oxide semiconductor might serve as a carrier trap or a carrier generation source. Therefore, the silicon concentration in the semiconductor 106b is preferably as low as possible. For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 106b and the insulator 106a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 106b and the insulator 106c.

It is preferable to reduce the hydrogen concentration in the insulator 106a and the insulator 106c in order to reduce the hydrogen concentration in the semiconductor 106b. The insulator 106a and the insulator 106c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the nitrogen concentration in the insulator 106a and the insulator 106c in order to reduce the nitrogen concentration in the semiconductor 106b. The insulator 106a and the insulator 106c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

Each of the insulator 106a, the semiconductor 106b, and the insulator 106c described in this embodiment, particularly the semiconductor 106b, is an oxide semiconductor with a low impurity concentration and a low density of defect states (a small number of oxygen vacancies) and thus can be referred to as a highly purified intrinsic or substantially highly purified intrinsic oxide semiconductor. Since a highly purified intrinsic or substantially highly purified intrinsic oxide semiconductor has few carrier generation sources, the carrier density can be low. Thus, a transistor in which a channel region is formed in the oxide semiconductor rarely has a negative threshold voltage (is rarely normally on). A highly purified intrinsic or substantially highly purified intrinsic oxide semiconductor has a low density of defect states and accordingly has a low density of trap states in some cases. Furthermore, a highly purified intrinsic or substantially highly purified intrinsic oxide semiconductor has an extremely low off-state current; the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V even when an element has a channel width (W) of $1 \times 10^6$ μm and a channel length (L) of 10 μm.

Accordingly, the transistor in which the channel region is formed in the highly purified intrinsic or substantially highly purified intrinsic oxide semiconductor can have a small change in electrical characteristics and high reliability. Charges trapped by the trap states in the oxide semiconductor take a long time to be released and may behave like fixed charges. Thus, the transistor whose channel region is formed in the oxide semiconductor having a high density of trap states has unstable electrical characteristics in some cases. Examples of impurities include hydrogen, nitrogen, alkali metal, and alkaline earth metal.

Hydrogen contained in the insulator 106a, the semiconductor 106b, and the insulator 106c reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Hydrogen trapped by an oxygen vacancy might form a shallow donor level in a band structure of a semiconductor. Thus, a transistor including an oxide semiconductor that contains hydrogen is likely to be normally on. For this reason, it is preferable that hydrogen be reduced as much as possible in the insulator 106a, the semiconductor 106b, and the insulator 106c. Specifically, the hydrogen concentration in the insulator 106a, the semiconductor 106b, and the insulator 106c, which is measured by SIMS, is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$, yet further preferably lower than or equal to $1 \times 10^{18}$ atoms/cm$^3$, even further preferably lower than or equal to $5 \times 10^{17}$ atoms/cm$^3$, and further preferably lower than or equal to $1 \times 10^{16}$ atoms/cm$^3$.

When the insulator 106a, the semiconductor 106b, and the insulator 106c contain silicon or carbon, which is one of elements belonging to Group 14, oxygen vacancies in the insulator 106a and the semiconductor 106b are increased, which makes the insulator 106a, the semiconductor 106b, and the insulator 106c n-type. Thus, the concentration of silicon or carbon (measured by SIMS) in the insulator 106a, the semiconductor 106b, and the insulator 106c or the concentration of silicon or carbon (measured by SIMS) in the vicinity of the interface with the insulator 106a, the semiconductor 106b, and the insulator 106c is set to be lower than or equal to $2 \times 10^{18}$ atoms/cm$^3$, preferably lower than or equal to $2 \times 10^{17}$ atoms/cm$^3$.

In addition, the concentration of an alkali metal or alkaline earth metal in the insulator 106a, the semiconductor 106b, and the insulator 106c, which is measured by SIMS, is set to be lower than or equal to $1 \times 10^{18}$ atoms/cm$^3$, preferably lower than or equal to $2 \times 10^{16}$ atoms/cm$^3$. An alkali metal and an alkaline earth metal might generate carriers when bonded to an oxide semiconductor, in which case the off-state current of the transistor might be increased. Thus, it is preferable to reduce the concentration of an alkali metal or alkaline earth metal in the insulator 106a, the semiconductor 106b, and the insulator 106c.

Furthermore, when containing nitrogen, the insulator 106a, the semiconductor 106b, and the insulator 106c tend to be n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

As described above, the insulator 106a, the semiconductor 106b, and the insulator 106c described in this embodiment are oxides that have a low impurity concentration and a low density of defect states (few oxygen vacancies) and thus, the insulator 106a, the semiconductor 106b, and the insulator 106c have a low carrier density. As a result, the insulator 106, the semiconductor 106b, and the insulator 106c tend to have large contact resistance with the conductor 108a and the conductor 108b serving as the source electrode and the drain electrode. In view of this, in the transistor 10 described in this embodiment, the conductor 108a or the conductor 108b is connected to the insulator 106a, the semiconductor 106b, or the insulator 106c through the low-resistance region 107a or the low-resistance region 107b to reduce contact resistance.

As described above, the low-resistance region 107a and the low-resistance region 107b are formed in the insulator 106a, the semiconductor 106b, and the insulator 106c in the vicinity of the interface with the insulator 116 shown in FIG. 1B. In the low-resistance region 107a and the low-resistance region 107b, an element contained in the insulator 116 is added to cause formation of a defect. Such a defect is formed in such a manner that, for example, oxygen is extracted owing to the element added from the insulator 116 and an oxygen vacancy is formed, or the element added from the insulator 116 serves as a carrier generation source. Such a defect forms a donor level and carrier density is increased; thus, the regions to which the element contained in the insulator 116 is added serve as the low-resistance region 107a and the low-resistance region 107b.

Because many oxygen vacancies are formed in the low-resistance region 107a and the low-resistance region 107b, the oxygen concentration measured by SIMS in these regions is lower than that in the region of the semiconductor 106b other than the low-resistance region 107a and the low-resistance region 107b (e.g., a region of the semiconductor 106b that overlaps with the conductor 114).

Because the element contained in the insulator 116 is added to the low-resistance region 107a and the low-resistance region 107b, the concentration of the element measured by SIMS in these regions is higher than that in the region of the semiconductor 106b other than the low-resistance region 107a and the low-resistance region 107b (e.g., a region of the semiconductor 106b that overlaps with the conductor 114).

The element added to the low-resistance region 107a and the low-resistance region 107b is preferably boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, or tungsten, for example. These elements relatively easily form an oxide that can serve as a semiconductor or an insulator and thus, these elements are favorable as the element added to the insulator 106a, the semiconductor 106b, or the insulator 106c. For example, the low-resistance region 107a and the low-resistance region 107b preferably contain the above element at higher than or equal to $1 \times 10^{14}/cm^2$ and lower than or equal to $2 \times 10^{16}/cm^2$. The concentration of the above element is higher in the low-resistance region 107a and the low-resistance region 107b included in the insulator 106c than in a region of the insulator 106c other than the low-resistance region 107a and the low-resistance region 107b (e.g., a region of the insulator 106c overlapping with the conductor 114).

Because addition of nitrogen to the low-resistance region 107a and the low-resistance region 107b makes these regions n-type, the concentration of nitrogen measured by SIMS in these regions is higher than that in the region of the semiconductor 106b other than the low-resistance region 107a and the low-resistance region 107b (e.g., a region of the semiconductor 106b that overlaps with the conductor 114).

The formation of the low-resistance region 107a and the low-resistance region 107b leads to a reduction in contact resistance between the conductor 108a or 108b and the insulator 106a, the semiconductor 106b, or the insulator 106c, whereby the transistor 10 can have high on-state current.

As illustrated in FIG. 1B, it is preferable that the end portion of the side surface of the conductor 114 in the channel length direction be substantially aligned with the end portion of the side surface of the insulator 112 in the channel length direction. With such a structure, the low-resistance regions 107a and 107b are substantially in contact with the region of the semiconductor 106b that overlaps with the conductor 114 (channel formation region), whereby on-state current can be increased.

In the transistor 10, the semiconductor 106b is surrounded by the insulator 106a and the insulator 106c. Accordingly, the end portion of the side surface of the semiconductor 106b, especially, the vicinity of the end portion of the side surface thereof in the channel width direction is in contact with the insulator 106a and the insulator 106c. As a result, in the vicinity of the end portion of the side surface of the semiconductor 106b, continuous junction is formed between the insulator 106a and the semiconductor 106b or between the insulator 106c and the semiconductor 106b and the density of defect states is reduced. Thus, even when on-state current easily follows owing to the low-resistance region 107a and the low-resistance region 107b, the end portion of the side surface of the semiconductor 106b in the channel width direction does not serve as a parasitic channel, which enables stable electrical characteristics.

Note that the three-layer structure including the insulator 106a, the semiconductor 106b, and the insulator 106c is an example. For example, a two-layer structure not including the insulator 106a or the insulator 106c may be employed. Alternatively, a single-layer structure not including the insulator 106a and the insulator 106c may be employed. Further alternatively, it is possible to employ an n-layer structure (n is an integer of four or more) that includes any of the insulator, semiconductor, and conductor given as examples of the insulator 106a, the semiconductor 106b, and the insulator 106c.

Note that an oxide semiconductor which can be used for the insulator 106a, the semiconductor 106b, and the insulator 106c will be described in detail in Embodiment 5.

<Substrate, Insulator, and Conductor>

Components other than the semiconductor of the transistor 10 are described in detail below.

As the substrate 100, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate formed using silicon, germanium, or the like or a semiconductor substrate formed using silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate resistant to heat treatment performed in manufacture of the transistor may be used as the substrate 100. As a method for providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor. As the substrate 100, a sheet, a film, a foil, or the like containing a fiber may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 µm and less than or equal to 700 µm, preferably greater than or equal to 10 µm and less than or equal to 500 µm, or further preferably greater than or equal to 15 µm and less than or equal to 300 µm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1 \times 10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 100 because of its low coefficient of linear expansion.

As the insulator 101, an insulator having a function of blocking hydrogen or water is used. Hydrogen and water in the insulator that is provided in the vicinity of the insulator 106a, the semiconductor 106b, and the insulator 106c cause carriers to be generated in the insulator 106a, the semiconductor 106b, and the insulator 106c that contain oxide semiconductors. As a result, the reliability of the transistor 10 might decrease. Particularly when the substrate 100 is a substrate that is provided with a silicon-based semiconductor element such as a switching element, hydrogen used to terminate a dangling bond in the semiconductor element might be diffused to the transistor 10. In that case, the insulator 101 that has a function of blocking hydrogen or water can inhibit diffusion of hydrogen or water from below the transistor 10, increasing the reliability of the transistor 10.

The insulator 101 preferably has a function of blocking oxygen. When oxygen diffused from the insulator 104 is blocked by the insulator 101, oxygen can be effectively supplied from the insulator 104 to the insulator 106a, the semiconductor 106b, and the insulator 106c.

The insulator 101 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 101 to function as an insulating film blocking diffusion of oxygen, hydrogen, or water. The insulator 101 can be formed using, for example, silicon nitride or silicon nitride oxide. The use of such a material enables the insulator 101 to function as an insulating film blocking diffusion of hydrogen or water.

At least part of the conductor 102 preferably overlaps with the semiconductor 106b in a region positioned between the conductor 108a and the conductor 108b. The conductor 102 functions as a back gate of the transistor 10. The conductor 102 can control the threshold voltage of the transistor 10. Control of the threshold voltage can prevent the transistor 10 from being turned on when voltage applied to the gate (conductor 114) of the transistor 10 is low, e.g., 0 V or lower. Thus, the electrical characteristics of the transistor 10 can be easily made normally-off characteristics.

The conductor 102 may be connected to the conductor 114 serving as the gate of the transistor 10 through an opening provided in the insulator 104 and the insulator 116.

The conductor 102 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy and a compound of the above element may be used, for example. Specifically, a conductor containing aluminum, a conductor containing copper and titanium, a conductor containing copper and manganese, a conductor containing indium, tin, and oxygen, a conductor containing titanium and nitrogen, and the like may be used.

Although the transistor 10 includes the conductor 102 and the insulator 103, a structure of a semiconductor device in this embodiment is not limited to this structure. For example, a structure without the conductor 102 and the insulator 103 may be employed.

The insulator 103 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 103 preferably includes silicon oxide or silicon oxynitride.

Top surfaces of the insulator 103 and the conductor 102 preferably have improved planarity as illustrated in FIG. 1B by being subjected to planarization treatment performed by a chemical mechanical polishing (CMP) method or the like. In that case, the planarity of the surface over which the semiconductor 106b is formed is not lowered by the conductor 102 serving as the back gate; thus, carrier mobility can be improved and the transistor 10 can have increased on-state current.

Although the conductor 102 is embedded in the insulator 103, the semiconductor device described in this embodiment is not limited to the above structure; for example, the insulator 103 may be provided to cover the conductor 102. In that case, the insulator 103 preferably has a function of blocking oxygen. Providing the insulator 103 can prevent oxidation of the conductor 102, or extraction of oxygen from the insulator 104 by the conductor 102. Accordingly, oxygen can be effectively supplied from the insulator 104 to the insulator 106a, the semiconductor 106b, and the insulator 106c.

The insulator 104 contains oxygen and preferably contains excess oxygen. Furthermore, the insulator 104 preferably transmits more oxygen than the insulator 101. Such insulator 104 makes it possible to supply oxygen from the insulator 104 to the insulator 106a, the semiconductor 106b, and the insulator 106c. The supplied oxygen can reduce oxygen vacancies which are to be defects in the semiconductor 106b which is an oxide semiconductor. Accordingly, the density of defect states in the semiconductor 106b can be reduced, whereby the semiconductor 106b can be an oxide semiconductor with stable characteristics.

In this specification and the like, excess oxygen refers to oxygen in excess of the stoichiometric composition, for example. Alternatively, excess oxygen refers to oxygen released from a film or layer containing the excess oxygen by heating, for example. Excess oxygen can move inside a film or a layer. Excess oxygen moves between atoms in a film or a layer, or replaces oxygen that is a constituent of a film or a layer and moves like a billiard ball, for example.

The insulator 104 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 104 preferably includes silicon oxide or silicon oxynitride.

The insulator 104 containing excess oxygen preferably includes a region that releases oxygen molecules, the number of which is greater than or equal to $1.0\times10^{14}$ molecules/cm$^2$ and less than or equal to $1.0\times10^{16}$ molecules/cm$^2$ and preferably greater than or equal to $1.0\times10^{15}$ molecules/cm$^2$ and less than or equal to $5.0\times10^{15}$ molecules/cm$^2$ in thermal desorption spectroscopy (TDS) analysis in the range of a surface temperature of 100° C. to 700° C. or 100° C. to 500° C.

The method for measuring the amount of released oxygen using TDS analysis will be described below.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to be from oxygen molecules. Note that $CH_3OH$, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is not taken into consideration either because the proportion of such a molecule in the natural world is negligible.

$$N_{O2} = N_{H2}/S_{H2} \times S_{O2} \times \alpha$$

The value $N_{H2}$ is obtained by conversion of the number of hydrogen molecules desorbed from the reference sample into densities. The value $S_{H2}$ is the integral value of ion intensity when the reference sample is subjected to the TDS analysis. Here, the reference value of the reference sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the number of the released oxygen atoms can also be estimated through the measurement of the number of the released oxygen molecules.

Note that $N_{O2}$ is the number of the released oxygen molecules. The amount of released oxygen in the case of being converted into oxygen atoms is twice the amount of the released oxygen molecules.

Furthermore, the insulator 104 containing excess oxygen may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

The insulator 104 may have a function of preventing diffusion of impurities from the substrate 100. The insulator 104 may be an insulator that has a hydrogen trap.

As described above, the top surface or the bottom surface of the semiconductor 106b preferably has high planarity. Thus, to improve the planarity, the top surface of the insulator 104 may be subjected to planarization treatment performed by a CMP method or the like.

The insulator 112 functions as a gate insulating film of the transistor 10. Like the insulator 104, the insulator 112 may be an insulator containing excess oxygen. Such insulator 112 makes it possible to supply oxygen from the insulator 112 to the insulator 106a, the semiconductor 106b, and the insulator 106c. As a result, the semiconductor 106b can be an oxide semiconductor with a low density of defect states and stable characteristics.

The insulator 112 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 112 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 114 functions as the gate electrode of the transistor 10. The conductor 114 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

It is preferable that the end portion of the side surface of the conductor 114 in the channel length direction be substantially aligned with the end portion of the side surface of the insulator 112 in the channel length direction. With such a structure, the low-resistance regions 107a and 107b are substantially in contact with or partly overlap with the region of the semiconductor 106b that overlaps with the conductor 114 (channel formation region), whereby on-state current can be increased.

The insulator 116 functions as the protective insulating film of the transistor 10 and has a function of adding an element to the insulator 106a, the semiconductor 106b, and the insulator 106c. As described above, the insulator 116 gives an element to the insulator 106a, the semiconductor 106b, and the insulator 106c in the vicinity of the interface and then, the low-resistance region 107a and the low-resistance region 107b are formed. This leads to a reduction in contact resistance between the conductor 108a or 108b and the insulator 106a, the semiconductor 106b, or the insulator 106c, whereby the transistor 10 can have high on-state current.

The insulator 116 preferably has a function of blocking oxygen. Providing the insulator 118 can prevent oxygen from being externally released to above the insulator 104 at the time of supply of oxygen from the insulator 104 to the insulator 106a, the semiconductor 106b, and the insulator 106c. Accordingly, oxygen can be effectively supplied from the insulator 104 to the insulator 106a, the semiconductor 106b, and the insulator 106c. Here, the thickness of the insulator 116 can be greater than or equal to 5 nm, or greater than or equal to 20 nm, for example. The insulator 116 is preferably formed by a sputtering method or the like.

The insulator 116 can be formed using, for example, an oxide, an oxynitride, a nitride oxide, or a nitride containing one or more elements selected from boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. Note that in this specification, "oxynitride" refers to a material that contains oxygen at a higher proportion than nitrogen, and "nitride oxide" refers to a material that contains nitrogen at a higher proportion than oxygen.

These elements relatively easily form an oxide that can serve as a semiconductor or an insulator and thus, these elements are favorable as the element added to the insulator 106a, the semiconductor 106b, or the insulator 106c.

In the case where the insulator 116 is formed using a nitride or a nitride oxide, aluminum, silicon, titanium, nickel, zinc, gallium, molybdenum, indium, tin, tungsten, or the like is preferably used, in which case the nitride or nitride oxide has a stable physical property or a stable structure.

The insulator 116 is preferably formed using an insulator containing oxygen and aluminum, e.g., aluminum oxide. Aluminum oxide is suitable for the insulator 116 because it is highly effective in preventing transmission of both oxygen and impurities such as hydrogen and moisture.

The insulator 116 preferably has a blocking effect against oxygen, hydrogen, water, alkali metal, alkaline earth metal, copper, and the like. As such an insulator, for example, a nitride insulating film can be used. As examples of the nitride insulating film, a silicon nitride film, a silicon nitride oxide film, an aluminum nitride film, an aluminum nitride oxide film, and the like can be given. Note that instead of the nitride insulating film, an oxide insulating film having a blocking effect against oxygen, hydrogen, water, and the like, may be provided. As examples of the oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

The above-described oxide that can be used for the insulator 106a or the insulator 106c can also be used for the insulator 116. The insulator 116 is preferably formed using an oxide insulator containing In, such as an In—Al oxide, an In—Ga oxide, or an In—Ga—Zn oxide. An oxide insulator containing In can be favorably used for the insulator 116 because the number of particles generated at the time of the deposition by a sputtering method is small.

The insulator 118 functions as the interlayer insulating film. The insulator 118 may be formed to have a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum, for example.

The conductors 108a and 108b serve as a source electrode and a drain electrode of the transistor 10.

The conductors 108a and 108b may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The conductor 108a and the conductor 108b are embedded in the insulator 118 and may be connected to a wiring over the insulator 118. In that case, top surfaces of the insulator 118, the conductor 108a, and the conductor 108b are preferably subjected to planarization treatment by a CMP method or the like to improve the planarity.

With the above structure, a transistor with stable electrical characteristics can be provided. A transistor having a low leakage current in an off state can be provided. A transistor having a high on-state current can be provided. A transistor with normally-off electrical characteristics can be provided. A transistor with a small subthreshold swing value can be provided. A highly reliable transistor can be provided.

Modification Example 1 of Transistor

Modification examples of the transistor 10 are described below with reference to FIGS. 2A to 2D and FIGS. 3A to 3C. FIGS. 2A to 2D and FIGS. 3A to 3C are cross-sectional views of the transistors in the channel length direction and those in the channel width direction like FIGS. 1B and 1C. Note that the components in the following modification examples of the transistor 10 can be combined with each other as appropriate.

Figure 2A:
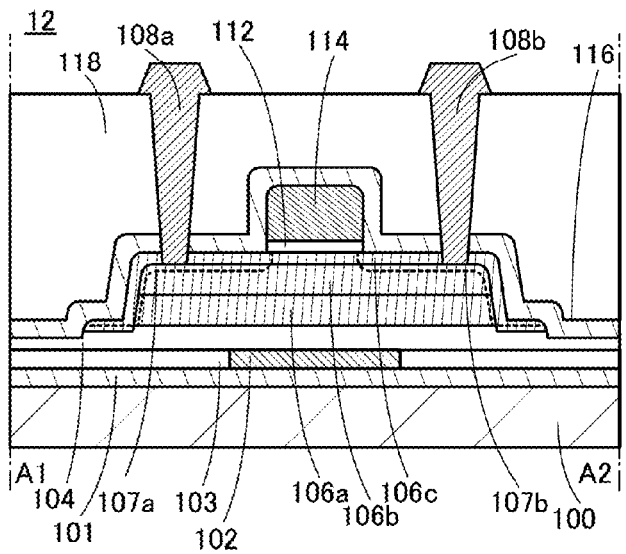
FIGS. 2A to 2D are cross-sectional views illustrating transistors of embodiments of the present invention.
Figure 2B:
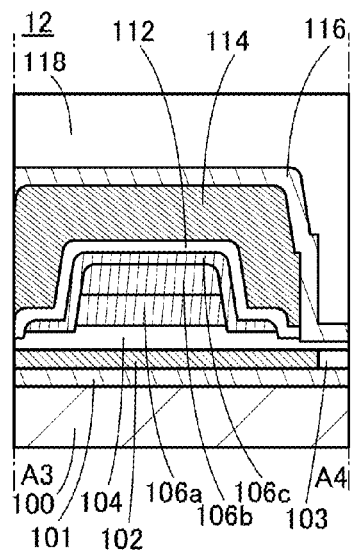
Figure 2C:
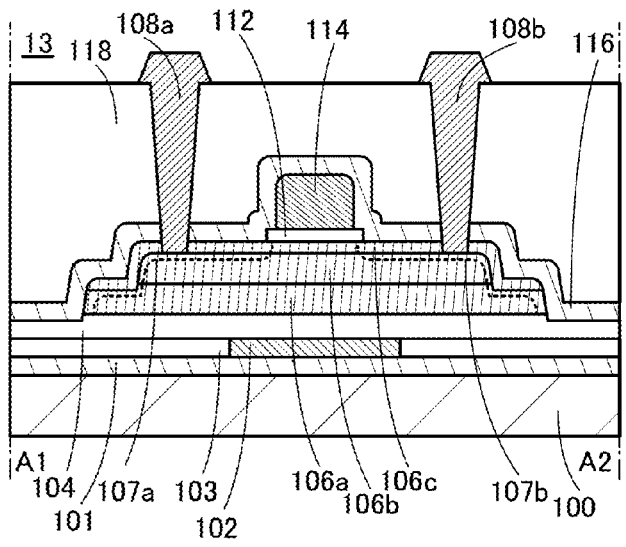
Figure 2D:
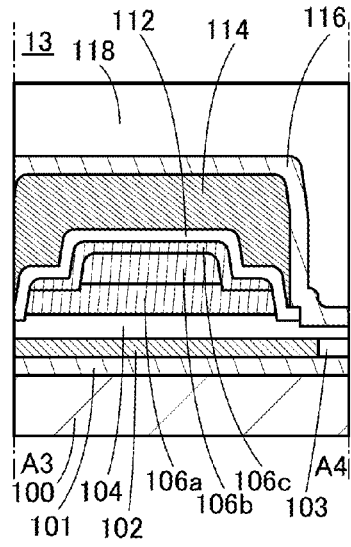

A transistor 12 illustrated in FIGS. 2A and 2B is different from the transistor 10 in that the end portion of the side surface of the insulator 106a is substantially aligned with the end portion of the side surface of the semiconductor 106b. Here, the thickness of the insulator 106a is preferably larger than the sum of the thicknesses of the insulator 106c and the insulator 112. With such a structure, substantially the entire side surface of the semiconductor 106b in the channel width direction can face the conductor 114 with the insulator 106c and the insulator 112 positioned therebetween.

With the above structure, as illustrated in FIG. 2B, the semiconductor 106b can be electrically surrounded by an electric field of the conductor 114 (a structure in which a semiconductor is electrically surrounded by an electric field of a conductor is referred to as a surrounded channel (s-channel) structure). Therefore, a channel is formed in the entire semiconductor 106b in some cases. In the s-channel structure, a large amount of current can flow between a source and a drain of a transistor, so that a high on-state current can be obtained.

In the case where the transistor has the s-channel structure, a channel is formed also in the side surface of the semiconductor 106b. Therefore, as the semiconductor 106b has a larger thickness, the channel region becomes larger. In other words, the thicker the semiconductor 106b is, the larger the on-state current of the transistor is. In addition, when the semiconductor 106b is thicker, the proportion of the region with a high carrier controllability increases, leading to a smaller subthreshold swing value. For example, the semiconductor 106b has a region with a thickness greater than or equal to 10 nm, preferably greater than or equal to 20 nm, further preferably greater than or equal to 30 nm, still further preferably greater than or equal to 50 nm. Since the productivity of the semiconductor device might be decreased, the semiconductor 106b has a region with a thickness of, for example, less than or equal to 300 nm, preferably less than or equal to 200 nm, further preferably less than or equal to 150 nm. In some cases, when the channel formation region is reduced in size, electrical characteristics of the transistor with a smaller thickness of the semiconductor 106b may be improved. Therefore, the semiconductor 106b may have a thickness less than 10 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, still further preferably less than or equal to 20 nm and a region having a channel width of preferably less than or equal to 40 nm, further preferably less than or equal to 30 nm, still further preferably less than or equal to 20 nm.

In the transistor 10 illustrated in FIGS. 1A and 1B, the end portion of the side surface of the conductor 114 in the channel length direction is substantially aligned with the end portion of the side surface of the insulator 112 in the channel length direction; however, the structure described in this embodiment is not limited to the above structure. For example, as in a transistor 13 illustrated in FIGS. 2C and 2D, the width of the conductor 114 in the channel length direction may be smaller than the width of the insulator 112 in the channel length direction.

Figure 3A:
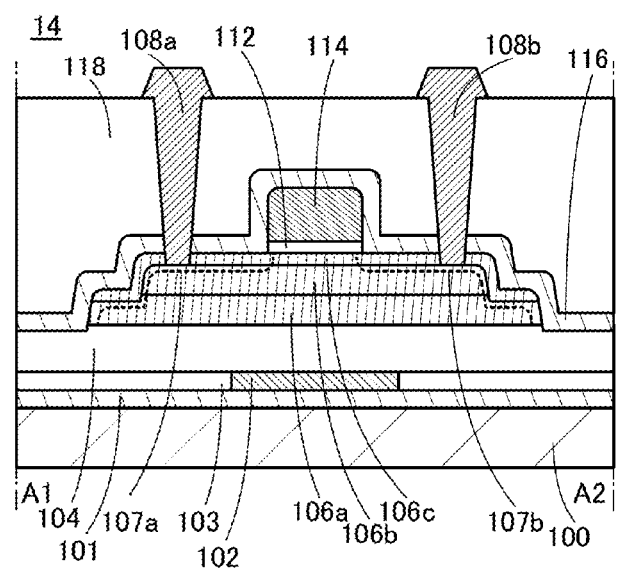
FIGS. 3A to 3C are cross-sectional views illustrating a transistor of one embodiment of the present invention.
Figure 3B:
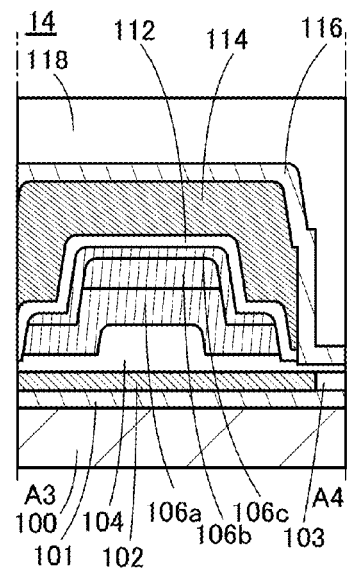

A transistor 14 illustrated in FIGS. 3A and 3B is different from the transistor 10 in that part of the insulator 104 has a larger thickness. An end portion of a side surface of the thick region of the insulator 104 in the channel width direction is preferably located inward from the end portion of the side surface of the semiconductor 106b in the channel width direction. In other words, the insulator 104 has a projection and when seen from above, the periphery of the projection is located inside the periphery of the semiconductor 106b. It is further preferable that the end portion of the side surface of the thick region of the insulator 104 in the channel width direction be located inward from the end portion of the side surface of the semiconductor 106b in the channel width direction by a distance approximately equal to the thickness of the insulator 106a. Here, a difference between the thickness of the thick region of the insulator 104 and the thin region thereof is preferably larger than the sum of the thicknesses of the insulator 106c and the insulator 112. With such a structure, substantially the entire side surface of the semiconductor 106b in the channel width direction can face the conductor 114 with the insulator 106c and the insulator 112 positioned therebetween.

With the above structure, the transistor 14 can have an s-channel structure similarly to the above transistor 12. Thus, in the transistor 14, a large amount of current can flow between a source and a drain, so that a high on-state current can be obtained.

Figure 3C:
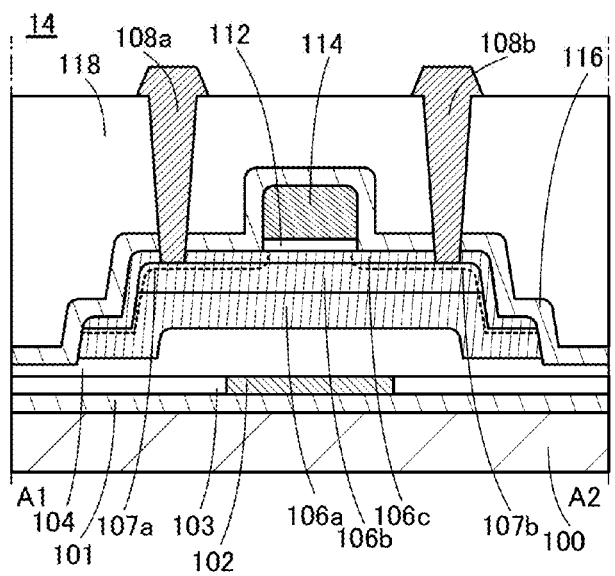

Although the thick region of the insulator 104 extends in the channel length direction in the transistor 14 illustrated in FIG. 3A, the structure described in this embodiment is not limited to the above structure. For example, as illustrated in FIG. 3C, the end portion of the side surface of the thick region of the insulator 104 in the channel length direction may be located inward from the end portion of the side surface of the semiconductor 106b in the channel length direction.

The structure and method described in this embodiment can be implemented by being combined as appropriate with any of the structures and methods described in the other embodiments.

Embodiment 2

In this embodiment, a method for manufacturing the semiconductor device of one embodiment of the present invention will be described with reference to FIGS. 4A to 4F and FIGS. 5A to 5D.
<Method 1 for Manufacturing Transistor>
A method for manufacturing the transistor 10 illustrated in FIGS. 1A to 1E will be described below.

First, the substrate 100 is prepared. Any of the above-mentioned substrates can be used for the substrate 100.

Next, the insulator 101 is formed. Any of the above-mentioned insulators can be used for the insulator 101.

The insulator 101 can be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. Thus, when an ALD method is employed, a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. For that reason, a formed film is less likely to have a pinhole or the like. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow rate ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity in some cases.

In a conventional deposition apparatus utilizing a CVD method, one or a plurality of source gases for reaction are supplied to a chamber at the same time at the time of deposition. In a deposition apparatus utilizing an ALD method, a source gas (also called precursor) for reaction and a gas serving as a reactant are alternately introduced into a chamber, and then the gas introduction is repeated. Note that the gases to be introduced can be switched using the respective switching valves (also referred to as high-speed valves).

For example, deposition is performed in the following manner. First, precursors are introduced into a chamber and adsorbed onto a substrate surface (first step). Here, the precursors are adsorbed onto the substrate surface, whereby a self-limiting mechanism of surface chemical reaction works and no more precursors are adsorbed onto a layer of the precursors over the substrate. Note that the proper range of substrate temperatures at which the self-limiting mechanism of surface chemical reaction works is also referred to as an ALD window. The ALD window depends on the temperature characteristics, vapor pressure, decomposition temperature, and the like of a precursor. Next, an inert gas (e.g., argon or nitrogen) or the like is introduced into the chamber, so that excessive precursors, a reaction product, and the like are released from the chamber (second step). Instead of introduction of an inert gas, vacuum evacuation can be performed to release excessive precursors, a reaction product, and the like from the chamber. Then, a reactant (e.g., an oxidizer such as $H_2O$ and $O_3$) is introduced into the chamber to react with the precursors adsorbed onto the substrate surface, whereby part of the precursors is removed while the molecules of the film are adsorbed onto the substrate (third step). After that, introduction of an inert gas or vacuum evacuation is performed, whereby excessive reactant, a reaction product, and the like are released from the chamber (fourth step).

A first single layer can be formed on the substrate surface in the above manner. By performing the first to fourth steps again, a second single layer can be stacked over the first single layer. With the introduction of gases controlled, the first to fourth steps are repeated plural times until a film having a desired thickness is obtained, whereby a thin film with excellent step coverage can be formed. The thickness of the thin film can be adjusted by the number of repetition times; therefore, an ALD method makes it possible to adjust a thickness accurately and thus is suitable for manufacturing a minute transistor.

In an ALD method, a film is formed through reaction of the precursor using thermal energy. An ALD method in which the reactant becomes a radical state with the use of plasma in the above-described reaction of the reactant is sometimes called a plasma ALD method. An ALD method in which reaction between the precursor and the reactant is performed using thermal energy is sometimes called a thermal ALD method.

By an ALD method, an extremely thin film can be formed to have a uniform thickness. In addition, the coverage of an uneven surface with the film is high.

When the plasma ALD method is employed, the film can be formed at a lower temperature than when the thermal ALD method is employed. With the plasma ALD method, for example, the film can be formed without decreasing the deposition rate even at 100° C. or lower. Furthermore, in the plasma ALD method, any of a variety of reactants, including a nitrogen gas, can be used without being limited to an oxidizer; therefore, it is possible to form various kinds of films of not only an oxide but also a nitride, a fluoride, a metal, and the like.

In the case where the plasma ALD method is employed, as in an inductively coupled plasma (ICP) method or the like, plasma can be generated apart from a substrate. When plasma is generated in this manner, plasma damage can be minimized.

Then, the insulator 103 is formed. Any of the above-described insulators can be used for the insulator 103. The insulator 103 can be formed by a sputtering method, a CVD method, an MBE method, a PLD method, an ALD method, or the like.

Next, a resist or the like is formed over the insulator 103 and an opening is formed in the insulator 103. Note that the case where the resist is simply formed also includes the case where an anti-reflective layer is formed below the resist.

The resist or the like is removed after the object is processed by etching or the like. For the removal of the resist or the like, plasma treatment and/or wet etching are/is used. Note that as the plasma treatment, plasma ashing is preferable. In the case where the removal of the resist or the like is not enough, the remaining resist or the like may be removed using ozone water and/or hydrofluoric acid at a concentration higher than or equal to 0.001 weight % and lower than or equal to 1 weight %, and the like.

Next, a conductor to be the conductor 102 is formed. Any of the above-described conductors can be used for the conductor to be the conductor 102. The conductor to be the conductor 102 can be formed by a sputtering method, a CVD method, an MBE method, a PLD method, an ALD method, or the like.

Next, the conductor to be the conductor 102 over the insulator 103 is removed by CMP treatment. As a result, the conductor 102 remains only in the opening formed in the insulator 103.

Figure 4A:
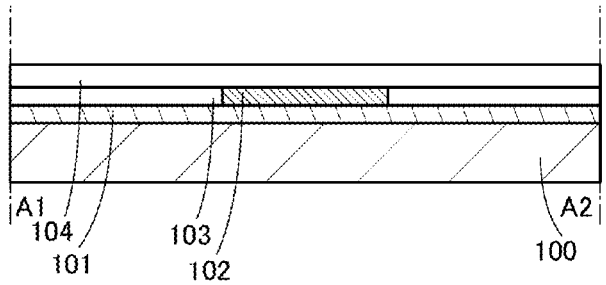
FIGS. 4A to 4F are cross-sectional views illustrating a method for manufacturing a transistor of one embodiment of the present invention.
Figure 4B:
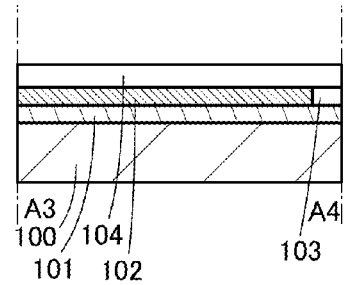

Then, the insulator 104 is formed (see FIGS. 4A and 4B). Any of the above-described insulators can be used for the insulator 104. The insulator 104 can be formed by a sputtering method, a CVD method, an MBE method, a PLD method, an ALD method, or the like.

The top surface or the bottom surface of the semiconductor 106b to be formed later preferably has high planarity. Thus, to improve the planarity, the top surface of the insulator 104 may be subjected to planarization treatment such as CMP.

Then, an insulator to be the insulator 106a in a later step is formed. Any of the above-described insulators, semiconductors, and conductors that can be used for the insulator 106a can be used for the insulator. The insulator can be formed by a sputtering method, a CVD method, an MBE method, a PLD method, an ALD method, or the like.

Here, it is preferable that the insulator to be the insulator 106a be formed by a sputtering method and it is further preferable that the insulator to be the insulator 106a be formed by a sputtering method in an atmosphere containing oxygen. For the sputtering, a parallel-plate-type sputtering apparatus or a facing-targets sputtering apparatus may be used. As will be described later, deposition using a facing-targets sputtering apparatus causes less damage to a formation surface and thus facilitates the formation of a film with high crystallinity. For this reason, a facing-targets sputtering apparatus is preferably used for the deposition of the CAAC-OS described later in some cases.

Deposition using the parallel-plate-type sputtering apparatus can also be referred to as parallel electrode sputtering (PESP). Deposition using the facing-targets sputtering apparatus can also be referred to as vapor deposition sputtering (VDSP).

When the insulator to be the insulator 106a is formed by a sputtering method, oxygen is sometimes added to a surface of the insulator 104 and the vicinity of the surface (after the insulator 106a is formed, the interface between the insulator 106a and the insulator 104 and the vicinity of the interface) at the same time as the formation. Although the oxygen is added to the insulator 104 as an oxygen radical here, for example, the state of the oxygen at the time of being added is not limited thereto. The oxygen may be added to the insulator 104 as an oxygen atom, an oxygen ion, or the like. By adding oxygen to the insulator 104, the insulator 104 can contain excess oxygen.

In a region in the vicinity of the interface between the insulator 104 and the insulator to be the insulator 106a, a mixed region is formed in some cases. The mixed region contains components of the insulator 104 and components of the insulator to be the insulator 106a.

Next, a semiconductor to be the semiconductor 106b in a later step is formed. Any of the above-described semiconductors that can be used for the semiconductor 106b can be used for the semiconductor. The semiconductor can be formed by a sputtering method, a CVD method, an MBE method, a PLD method, an ALD method, or the like. A PESP method or a VDSP method can be employed. Note that successive film formation of the insulator to be the insulator 106a and the semiconductor to be the semiconductor 106b without exposure to the air can reduce entry of impurities into the films and their interface.

It is preferable to use, as a deposition gas, a mixed gas of a rare gas such as argon (other examples include helium, neon, krypton, and xenon) and oxygen. For example, the proportion of oxygen is less than 50 vol %, preferably less than or equal to 33 vol %, further preferably less than or equal to 20 vol %, still further preferably less than or equal to 15 vol %.

When deposition is performed by a sputtering method, the substrate temperature may be set high. By setting the substrate temperature high, migration of sputtered particles at the top surface of the substrate can be promoted. Thus, an oxide with higher density and higher crystallinity can be deposited. Note that the substrate temperature is, for example, higher than or equal to 100° C. and lower than or equal to 450° C., preferably higher than or equal to 150° C. and lower than or equal to 400° C., further preferably higher than or equal to 170° C. and lower than or equal to 350° C.

Next, heat treatment is preferably performed. The heat treatment can reduce the hydrogen concentration of the insulator 106a and the semiconductor 106b formed in later steps in some cases. The heat treatment can reduce oxygen vacancies in the insulator 106a and the semiconductor 106b formed in later steps in some cases. The heat treatment is performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator 106a and the semiconductor 106b formed in later steps and can remove impurities, such as hydrogen and water, for example. For the heat treatment, lamp heating can be performed with the use of an RTA apparatus.

By the heat treatment, oxygen can be supplied from the insulator 104 to the insulator to be the insulator 106a and the semiconductor to be the semiconductor 106b. Owing to the heat treatment performed on the insulator 104, oxygen can be supplied to the insulator to be the insulator 106a and the semiconductor to be the semiconductor 106b very easily.

Here, the insulator 101 functions as a barrier film that blocks oxygen. The insulator 101 is provided below the insulator 104, thereby preventing the oxygen diffused in the insulator 104 from being diffused below the insulator 104.

Oxygen is supplied to the insulator to be the insulator 106a and the semiconductor to be the semiconductor 106b to reduce oxygen vacancies in this manner, whereby a highly purified intrinsic or substantially highly purified intrinsic oxide semiconductor with a low density of defect states can be obtained.

Furthermore, high-density plasma treatment or the like may be performed. High-density plasma may be generated using microwaves. For the high-density plasma treatment, an oxidation gas such as oxygen or nitrous oxide may be used, for example. Alternatively, a mixed gas of an oxidation gas and a rare gas such as He, Ar, Kr, or Xe may be used. In the high-density plasma treatment, a bias may be applied to the substrate, in which case oxygen ions or the like in the plasma can be attracted to the substrate side. The high-density plasma treatment may be performed while the substrate is heated. In the case where the high-density plasma treatment is performed instead of the heat treatment, for example, an effect similar to that of the heat treatment can be obtained at lower temperatures. The high-density plasma treatment may be performed before the deposition of the insulator to be the insulator 106a, after the deposition of the insulator 112, or after the deposition of the insulator 116.

Figure 4C:
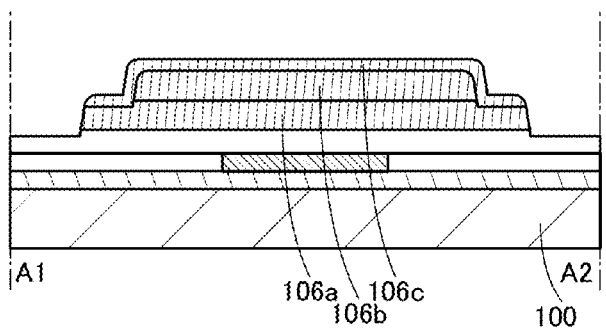
Figure 4D:
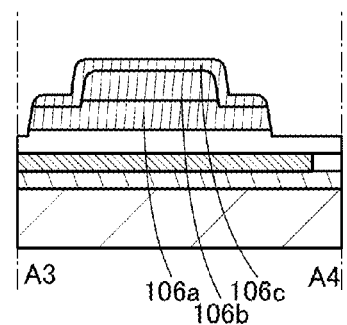

Next, a resist or the like is formed over the semiconductor, which becomes the semiconductor 106b, and processing is performed using the resist or the like, whereby the semiconductor 106b is formed. As illustrated in FIGS. 4C and 4D, an exposed surface of the insulator 106a is removed at the time of formation of the semiconductor 106b in some cases.

Then, an insulator to be the insulator 106c in a later step is formed. Any of the above-described insulators, semiconductors, and conductors can be used for the insulator. The insulator can be formed by a sputtering method, a CVD method, an MBE method, a PLD method, an ALD method, or the like. A PESP method or a VDSP method can be employed.

Next, a resist or the like is formed over the insulator to be the insulator 106c and processing is performed using the resist or the like, whereby the insulator 106a and the insulator 106c are formed (see FIGS. 4C and 4D). As illustrated in FIGS. 4C and 4D, an exposed surface of the insulator 104 is removed at the time of formation of the insulator 106a and the insulator 106c in some cases.

Here, patterning is performed such that the end portions of the side surfaces of the insulator 106a and the insulator 106c are located outward from the end portion of the side surface of the semiconductor 106b. It is particularly preferable that as illustrated in FIG. 4D, patterning be performed such that the end portions of the side surfaces of the insulator 106a and the insulator 106c in the channel width direction are located outward from the end portion of the side surface of the semiconductor 106b in the channel width direction. When the insulator 106a and the insulator 106c are formed in the above manner, the semiconductor 106b is surrounded by the insulator 106a and the insulator 106c.

In the above structure, the end portion of the side surface of the semiconductor 106b, especially, the vicinity of the end portion of the side surface thereof in the channel width direction is in contact with the insulator 106a and the insulator 106c. As a result, in the vicinity of the end portion of the side surface of the semiconductor 106b, continuous junction is formed between the insulator 106a and the semiconductor 106b or between the insulator 106c and the semiconductor 106b and the density of defect states is reduced. Thus, even when on-state current easily follows owing to the low-resistance region 107a and the low-resistance region 107b, the end portion of the side surface of the semiconductor 106b in the channel width direction does not serve as a parasitic channel, which enables stable electrical characteristics.

Then, an insulator to be the insulator 112 in a later step is formed. Any of the above-described insulators that can be used for the insulator 112 can be used for the insulator. The insulator can be formed by a sputtering method, a CVD method, an MBE method, a PLD method, an ALD method, or the like.

Next, a conductor to be the conductor 114 in a later step is formed. Any of the above-described conductors that can be used for the conductor 114 can be used for the conductor. The conductor can be formed by a sputtering method, a CVD method, an MBE method, a PLD method, an ALD method, or the like.

Figure 4E:
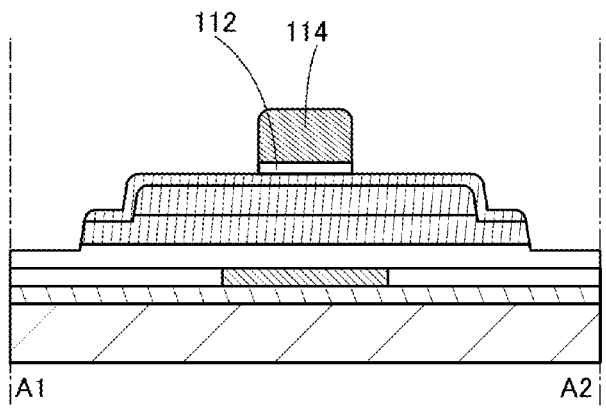
Figure 4F:
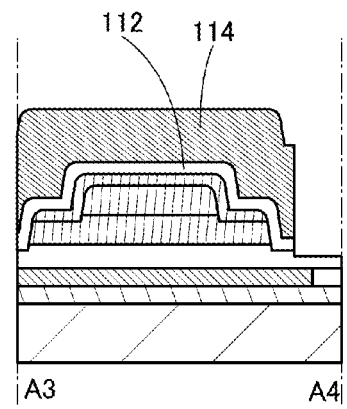

Next, a resist or the like is formed over the conductor to be the conductor 114 and processing is performed with the resist or the like, whereby the insulator 112 and the conductor 114 are formed (see FIGS. 4E and 4F). Here, after the insulator 112 and the conductor 114 are formed such that the end portion of the side surface of the conductor 114 in the channel length direction is substantially aligned with the end portion of the side surface of the insulator 112 in the channel length direction, only the conductor 114 may be selectively etched by wet etching or the like using the same mask. When such etching is performed, as in the transistor 13 illustrated in FIGS. 2C and 2D, the width of the conductor 114 in the channel length direction can be smaller than the width of the insulator 112 in the channel length direction.

Figure 5A:
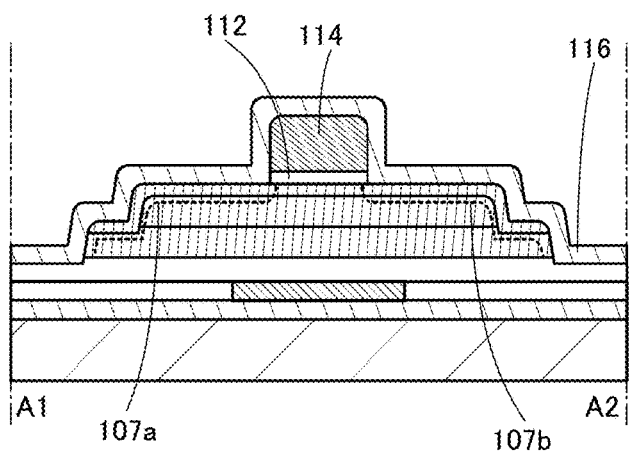
FIGS. 5A to 5D are cross-sectional views illustrating a method for manufacturing a transistor of one embodiment of the present invention.
Figure 5B:
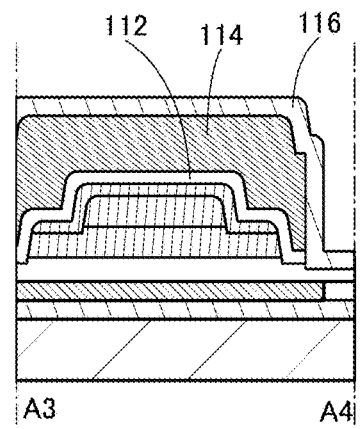

Then, the insulator 116 is formed (see FIGS. 5A and 5B). Any of the above-described insulators can be used for the insulator 116. The insulator 116 can be formed by a sputtering method, a CVD method, an MBE method, a PLD method, an ALD method, or the like. By the formation of the insulator 116, the low-resistance region 107a and the low-resistance region 107b are formed in the vicinity of the interface between the insulator 116 and the insulator 106a, the semiconductor 106b, and the insulator 106c.

When the insulator 116 is formed by a sputtering method, a metal target or an oxide target may be used. When a metal target is used for the deposition, the flow rate of oxygen is preferably intermediate between the flow rate of oxygen for forming a film of an element that is contained in the metal target and the flow rate of oxygen for forming an oxide film satisfying the stoichiometric composition including an element that is contained in the metal target. When formed with the flow rate of oxygen set in the above manner, the insulator 116 can be an oxide film including a suboxide, so that oxygen in the insulator 106a, the semiconductor 106b, and the insulator 106c is extracted and the low-resistance region 107a and the low-resistance region 107b can be easily formed. Here, the suboxide is an intermediate formed in the reaction process for forming the oxide. Thus, the suboxide is more deficient in oxygen than the oxide is. Specifically, the oxygen concentration of a suboxide is lower than that of an oxide by 1 at % or more, 2 at % or more, 5 at % or more, or 10 at % or more.

When the insulator 116 is formed by a sputtering method using an oxide target, the oxygen concentration of the deposition atmosphere is preferably low. When the oxygen concentration of the deposition atmosphere is low, oxygen vacancies are easily formed in the insulator 106a, the semiconductor 106b, and the insulator 106c, whereby the low-resistance region 107a and the low-resistance region 107b can be easily formed. For example, the oxygen concentration of the deposition atmosphere for the insulator 116 is lower than that of the deposition atmosphere for the semiconductor 106b, and the proportion of oxygen in the deposition atmosphere is less than 5 vol %, preferably less than 2 vol %, further preferably less than 1 vol %, still further preferably less than 0.5 vol %. Furthermore, when formed using an oxide target, the insulator 116 may be formed in an atmosphere not containing oxygen. In that case, for example, deposition can be performed using a rare gas (e.g., argon, krypton, or xenon) as a deposition gas.

When deposition is performed by a sputtering method, the substrate temperature may be set high. By setting the substrate temperature high, addition of an element contained in the insulator 116 to the insulator 106a, the semiconductor 106b, and the insulator 106c can be promoted. Note that the substrate temperature is, for example, higher than or equal to 100° C. and lower than or equal to 450° C., preferably higher than or equal to 150° C. and lower than or equal to 400° C., further preferably higher than or equal to 170° C. and lower than or equal to 350° C.

When deposition is performed by a sputtering method or the like, an atmosphere containing nitrogen is preferably used because nitrogen is added to the insulator 106a, the semiconductor 106b, and the insulator 106c and the insulator 106a, the semiconductor 106b, and the insulator 106c become n-type.

It is also possible to directly deposit, as the insulator 116, the above-described oxide, oxynitride, nitride oxide, or nitride containing boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, tungsten, or the like by a reactive sputtering method or the like. Alternatively, the oxide or oxynitride containing any of the above elements may be obtained in such a manner that a film containing any of the above elements is formed and then heat treatment is performed. The heat treatment here may be performed at a temperature higher than or equal to 250° C. and lower than or equal to 650° C., preferably higher than or equal to 350° C. and lower than or equal to 450° C., for example.

The insulator 116 is preferably formed using an insulator containing oxygen and aluminum, e.g., aluminum oxide ($AlO_x$). Aluminum oxide has an effect of blocking oxygen, hydrogen, moisture, and the like.

The above-described oxide that can be used for the insulator 106a or the insulator 106c can also be used for the insulator 116. The insulator 116 is preferably formed using an oxide insulator containing In, such as an In—Al oxide, an In—Ga oxide, or an In—Ga—Zn oxide. An oxide insulator containing In can be favorably used for the insulator 116 because the number of particles generated at the time of the deposition by a sputtering method is small.

Any of the above elements or a rare gas (e.g., helium, neon, argon, krypton, or xenon) may be added after deposition of the insulator 116 to further reduce the resistance of the low-resistance region 107a and the low-resistance region 107b. By the above addition, an element contained in the insulator 116 can be pushed into (knocked on) the insulator 106a, the semiconductor 106b, and the insulator 106c. Examples of the method for the addition include an ion implantation method, an ion doping method, and a plasma immersion ion implantation method.

Next, heat treatment is preferably performed. By the heat treatment, oxygen can be supplied from the insulator 104 or the like to the insulator 106a, the semiconductor 106b, and the insulator 106c. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with the use of an RTA apparatus.

This heat treatment is preferably performed at a temperature lower than that of the heat treatment performed after formation of the semiconductor to be the semiconductor 106b. A temperature difference between the heat treatment and the heat treatment performed after formation of the semiconductor to be the semiconductor 106b is to be 20° C. or more and 150° C. or less, preferably 40° C. or more and 100° C. or less. Accordingly, superfluous release of excess oxygen (oxygen) from the insulator 104 and the like can be inhibited. Note that in the case where heating at the time of formation of the layers (e.g., heating at the time of formation of the insulator 116) doubles as the heat treatment after formation of the insulator 116, the heat treatment after formation of the insulator 116 is not necessarily performed.

At that time, since the insulator 106a, the semiconductor 106b, and the insulator 106c are surrounded by the insulator 101 and the insulator 116 having a function of blocking oxygen, outward diffusion of oxygen can be prevented. Accordingly, oxygen can be effectively supplied to the insulator 106a, the semiconductor 106b, and the insulator 106c, especially a region of the semiconductor 106b where a channel is formed. Oxygen is supplied to the insulator 106a, the semiconductor 106b, and the insulator 106c to reduce oxygen vacancies in this manner, whereby a highly purified intrinsic or substantially highly purified intrinsic oxide semiconductor with a low density of defect states can be obtained.

Then, the insulator 118 is formed. Any of the above-described insulators can be used for the insulator 118. The insulator 118 can be formed by a sputtering method, a CVD method, an MBE method, a PLD method, an ALD method, or the like.

Next, a resist or the like is formed over the insulator 118, and openings are formed in the insulator 118, the insulator 116, and the insulator 106c. Then, a conductor to be the conductor 108a and the conductor 108b is formed. Any of the above-described conductors can be used for the conductor to be the conductor 108a and the conductor 108b. The conductor can be formed by a sputtering method, a CVD method, an MBE method, a PLD method, an ALD method, or the like.

Figure 5C:
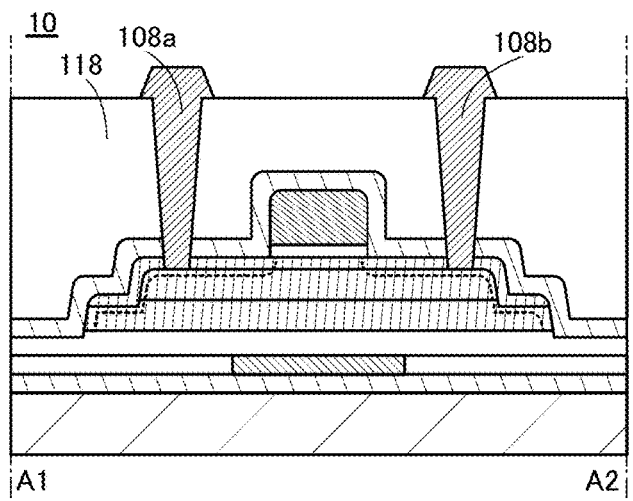
Figure 5D:
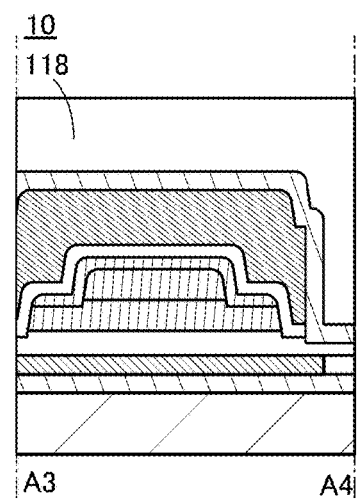

Then, a resist or the like is formed over the conductor to be the conductor 108a and the conductor 108b, and the conductor is processed with the use of the resist or the like; thus, the conductor 108a and the conductor 108b are formed (see FIGS. 5C and 5D).

Through the above steps, the transistor 10 of one embodiment of the present invention can be manufactured.

When the above-described manufacturing method is employed, in a line where top-gate transistors are formed by a gate-first method using low-temperature polysilicon (LTPS), LTPS can be easily replaced with an oxide semiconductor. Here, the gate-first method is a transistor manufacturing process in which a gate is formed before formation of a source region and a drain region.

With the above structure, a transistor with stable electrical characteristics can be provided. A transistor having a low leakage current in an off state can be provided. A transistor having a high on-state current can be provided. A transistor with normally-off electrical characteristics can be provided. A transistor with a small subthreshold swing value can be provided. A highly reliable transistor can be provided.

The structure and method described in this embodiment can be implemented by being combined as appropriate with any of the structures and methods described in the other embodiments.

Embodiment 3

In this embodiment, structures of semiconductor devices of embodiments of the present invention will be described with reference to FIGS. 6A to 6E, FIGS. 7A to 7D, and FIGS. 8A to 8C.

<Structure 2 of Transistor>

Structures of transistors, which are examples of the semiconductor devices of embodiments of the present invention, will be described below.

Figure 6A:
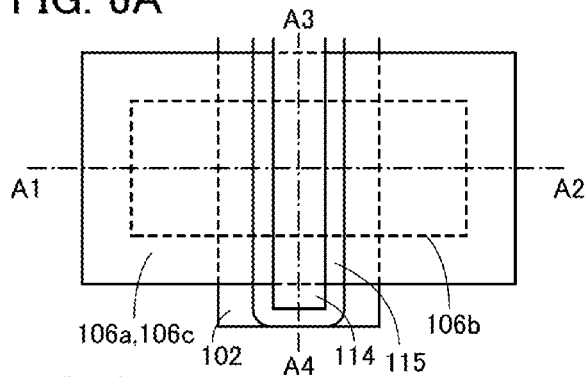
FIGS. 6A to 6E are a top view and cross-sectional views illustrating a transistor of one embodiment of the present invention.
Figure 6B:
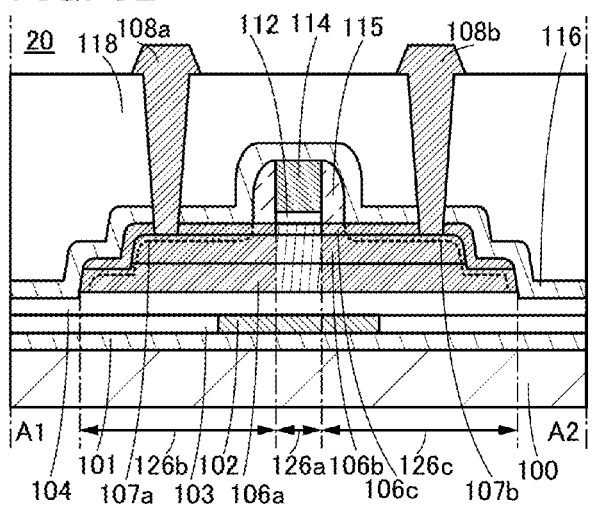
Figure 6C:
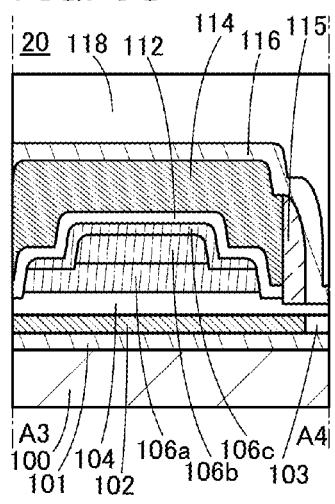

A structure of a transistor 20 will be described with reference to FIGS. 6A to 6C. FIG. 6A is a top view of the transistor 20. FIG. 6B is a cross-sectional view taken along dashed-dotted line A1-A2 in FIG. 6A. FIG. 6C is a cross-sectional view taken along dashed-dotted line A3-A4 in FIG. 6A. A region along dashed-dotted line A1-A2 shows a structure of the transistor 20 in the channel length direction, and a region along dashed-dotted line A3-A4 shows a structure of the transistor 20 in the channel width direction.

The transistor 20 includes the semiconductor 106b, the conductor 114, the insulator 106a, the insulator 106c, the insulator 112, an insulator 115, and the insulator 116. The semiconductor 106b is provided over the insulator 106a, the insulator 106c is provided over the semiconductor 106b, the insulator 112 is provided over the insulator 106c, the conductor 114 is provided over the insulator 112, and the insulator 115 is provided in contact with a side surface of the conductor 114. The insulator 116 is provided over the conductor 114 and the insulator 115, and the insulator 115 and the insulator 116 each include a region in contact with the top surface of the insulator 106c. The semiconductor 106b includes a region that overlaps with the conductor 114 with the insulator 106c and the insulator 112 provided therebetween. When seen from above as illustrated in FIG. 6A, the peripheries of the insulator 106a and the insulator 106c are located outside the periphery of the semiconductor 106b. Here, the transistor 20 is different from the transistor 10 described in the above embodiment in that the insulator 115 is provided.

For example, as illustrated in FIGS. 6A to 6C, the transistor 20 includes the insulator 101, the conductor 102, the insulator 103, and the insulator 104 that are formed over the substrate 100; the insulator 106a, the semiconductor 106b, and the insulator 106c that are formed over the insulator 104; the insulator 112, the insulator 115, and the conductor 114 formed over the insulator 106c; and the insulator 116, the insulator 118, the conductor 108a, and the conductor 108b that are formed over the conductor 114 and the insulator 115.

Here, the substrate 100, the insulator 101, the insulator 103, the insulator 104, the insulator 106a, the insulator 106c, the insulator 112, the insulator 116, the insulator 118, the conductor 102, the conductor 108a, the conductor 108b, the conductor 114, and the semiconductor 106b can be similar to those described in the above embodiment. Thus, the above embodiment can be referred to for the details.

The insulator 115 can be formed using an insulator similar to that of the insulator 112.

The insulator 103 is formed over the insulator 101 formed over the substrate 100, and the conductor 102 is formed to be embedded in the insulator 103. The insulator 104 is formed over the insulator 103 and the conductor 102. Here, the insulator 101 is preferably formed using an insulator that has an effect of blocking oxygen, hydrogen, water, and the like. The insulator 104 is preferably formed using an insulator containing oxygen.

Figure 6D:
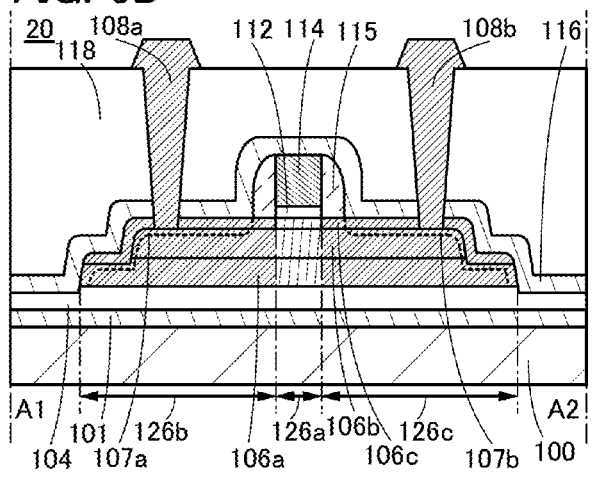
Figure 6E:
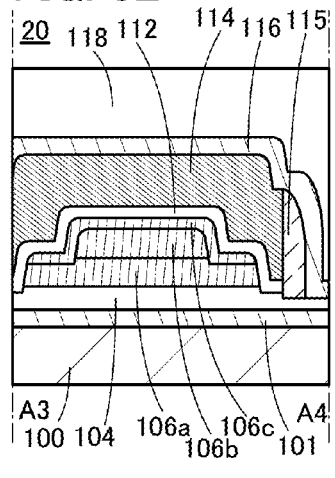

Although the transistor 20 includes the conductor 102 and the insulator 103, a structure of a semiconductor device in this embodiment is not limited to the above structure. For example, a structure without the conductor 102 and the insulator 103 as illustrated in FIGS. 6D and 6E may be employed.

The insulator 106a is formed over the insulator 104, the semiconductor 106b is formed in contact with the top surface of the insulator 106a, and the insulator 106c is formed in contact with the top surface of the insulator 106a and the top surface of the semiconductor 106b. Here, it is preferable that at least part of the semiconductor 106b overlap with the conductor 102. The end portion of the side surface of the semiconductor 106b, especially, the end portion of the side surface thereof in the channel width direction is in contact with the insulator 106a and the insulator 106c. The end portion of the side surface of the insulator 106a, especially, the end portion of the side surface thereof in the channel width direction is substantially aligned with the end portion of the side surface of the insulator 106c, especially, an end portion of a side surface thereof in the channel width direction. Accordingly, in the transistor 20, the semiconductor 106b is surrounded by the insulator 106a and the insulator 106c.

Patterning is performed such that the end portion of the side surface of the semiconductor 106b is located inward from the end portion of the side surface of the insulator 106a as illustrated in FIGS. 6B and 6C, whereby the number of times of etching the insulator 104 at the time of etching the insulator 106a or the semiconductor 106b can be reduced. A portion of a surface of the insulator 104 that is to be etched can be away from the conductor 102, leading to an increase in withstand voltage of the transistor 20.

Although the end portion of the side surface of the insulator 106a and the end portion of the side surface of the insulator 106c are aligned with each other in FIGS. 6B and 6C, the transistor described in this embodiment is not limited to this structure. For example, the periphery of the insulator 106a may be located outside the periphery of the insulator 106c and the periphery of the insulator 106c may be located outside the periphery of the insulator 106a.

In the insulator 106a, the semiconductor 106b, and the insulator 106c of the transistor 20 in this embodiment, a region 126a, a region 126b, and a region 126c are formed and the regions 126b and 126c have a higher concentration of a dopant and lower resistance than the region 126a. Here, the region 126a of the insulator 106a, the semiconductor 106b, and the insulator 106c approximately overlaps with the conductor 114, and the regions 126b and 126c are regions other than the region 126a. However, the boundary between the region 126a and the region 126b and the boundary between the region 126a and the region 126c might change depending on the conditions of the addition of a dopant at the time of formation of the regions 126a to 126c, for example. It is preferable that the region 126b and the region 126c be partly and substantially in contact with a region of the semiconductor 106b overlapping with the conductor 114 (channel formation region) or partly overlap with the region.

The low-resistance region 107a and the low-resistance region 107b are formed in the insulator 106a, the semiconductor 106b, and the insulator 106c in the vicinity of the interface with the insulator 116 (indicated with a dotted line in FIG. 6B). The low-resistance region 107a and the low-resistance region 107b contain at least one of the elements contained in the insulator 116.

Since a large region of the insulator 106c is in contact with the insulator 116, the low-resistance region 107a and the low-resistance region 107b are easily formed in the insulator 106c. The concentration of the element contained in the insulator 116 is higher in the low-resistance region 107a and the low-resistance region 107b included in the insulator 106c than in a region of the insulator 106c other than the low-resistance region 107a and the low-resistance region 107b (e.g., a region of the insulator 106c overlapping with the conductor 114). It is preferable that the low-resistance region 107a and the low-resistance region 107b be partly and substantially in contact with a region of the insulator 106c overlapping with the insulator 115 or partly overlap with the region.

The low-resistance region 107a is formed in the region 126b and the low-resistance region 107b is formed in the region 126c. Here, ideally, the concentration of added elements is the highest in the low-resistance region 107a and the low-resistance region 107b. The concentration of added elements is the second highest in regions of the region 126b and the region 126c other than the low-resistance region 107a and the low-resistance region 107b. The concentration of added elements is the lowest in the region 126a. Here, the added elements include the dopant for forming the region 126b and the region 126c and the element added from the insulator 116 to the low-resistance region 107a and the low-resistance region 107b.

The insulator 112 is formed over the insulator 106c, and the conductor 114 is formed over the insulator 112. The insulator 115 is provided in contact with the side surface of the conductor 114. At least part of each of the insulator 112 and the conductor 114 overlaps with the conductor 102 and the semiconductor 106b. It is preferable that the end portion of the side surface of the conductor 114 in the channel length direction be substantially aligned with the end portion of the side surface of the insulator 112 in the channel length direction. Here, the insulator 112 serves as a gate insulating film of the transistor 20, the conductor 114 serves as a gate electrode of the transistor 20, and the insulator 115 serves as a sidewall insulating film of the transistor 20.

It is preferable that the end portion of the side surface of the conductor 114 in the channel length direction be substantially aligned with the end portion of the side surface of the insulator 112 in the channel length direction. With such a structure, the regions 126b and 126c are substantially in contact with or partly overlap with the region of the semiconductor 106b that overlaps with the conductor 114 (channel formation region), whereby on-state current can be increased.

The insulator 116 is formed over the conductor 114, the insulator 115, the insulator 106c, and the insulator 104. The insulator 116 is preferably in contact with a region of the insulator 106c that does not overlap with the insulator 112 and the insulator 115. The insulator 116 may be in contact with at least part of the insulator 104. The insulator 118 is formed over the insulator 116. Here, the insulator 116 serves as a protective insulating film of the transistor 20 and the insulator 118 serves as an interlayer insulating film of the transistor 20. The insulator 116 is preferably formed using an insulator that has an effect of blocking oxygen.

The conductor 108a and the conductor 108b are formed over the insulator 118. The conductor 108a and the conductor 108b are in contact with the low-resistance region 107a and the low-resistance region 107b through openings formed in the insulator 118, the insulator 116, and the insulator 106c. The conductor 108a and the conductor 108b are spaced and are preferably formed to face each other with the conductor 114 provided therebetween as illustrated in FIG. 6B. Here, the conductor 108a functions as one of a source electrode and a drain electrode of the transistor 20, and the conductor 108b functions as the other of the source electrode and the drain electrode of the transistor 20. Although the conductor 108a and the conductor 108b are in contact with the semiconductor 106b in FIG. 6B, this embodiment is not limited to this structure. As long as the contact resistance with the low-resistance region 107a and the low-resistance region 107b is sufficiently low, the conductor 108a and the conductor 108b may be in contact with the insulator 106c.

The insulator 106a, the semiconductor 106b, and the insulator 106c are oxides that have a low impurity concentration and a low density of defect states (few oxygen vacancies) and thus, the insulator 106a, the semiconductor 106b, and the insulator 106c have a low carrier density. As a result, the insulator 106, the semiconductor 106b, and the insulator 106c tend to have large contact resistance with the conductor 108a and the conductor 108b serving as the source electrode and the drain electrode. In view of the above, in the transistor 20 described in this embodiment, the conductor 108a and the conductor 108b are connected to the insulator 106a, the semiconductor 106b, and the insulator 106c through the low-resistance region 107a in the region 126b and the low-resistance region 107b in the region 126c to reduce contact resistance.

As described above, in the insulator 106a, the semiconductor 106b, and the insulator 106c, a region 126a, a region 126b, and a region 126c are formed and the regions 126b and 126c have a higher concentration of a dopant and lower resistance than the region 126a. Here, the region 126a of the insulator 106a, the semiconductor 106b, and the insulator 106c approximately overlaps with the conductor 114 and the regions 126b and 126c are regions other than the region 126a. The low-resistance region 107a and the low-resistance region 107b are formed in the vicinity of the interface between the insulator 116 and the insulator 106a, the semiconductor 106b, and the insulator 106c. In the region 126b, the region 126c, the low-resistance region 107a, and the low-resistance region 107b, a dopant and an element contained in the insulator 116 are added to cause formation of a defect. Such a defect is formed in such a manner that, for example, oxygen is extracted owing to the added dopant or the element added from the insulator 116 and an oxygen vacancy is formed, or the dopant or the element added from the insulator 116 serves as a carrier generation source. Such a defect forms a donor level and carrier density is increased; thus, the regions to which the dopant or the element contained in the insulator 116 is added serve as the region 126b, the region 126c, the low-resistance region 107a, and the low-resistance region 107b.

Because many oxygen vacancies are formed in the region 126b, the region 126c, the low-resistance region 107a, and the low-resistance region 107b, the oxygen concentration measured by SIMS in the regions is lower than that in the region 126a (e.g., a region of the semiconductor 106b that overlaps with the conductor 114).

Although details are described later, the region 126b and the region 126c are formed by adding a dopant. Thus, the concentration of the dopant measured by SIMS is higher in the region 126b and the region 126c than in the region 126a. Since the same applies to the regions of the region 126b and the region 126c other than the low-resistance region 107a and the low-resistance region 107b, the regions of the insulator 106a, the semiconductor 106b, and the insulator 106c that overlap with the insulator 115 have the concentration of the dopant measured by SIMS higher than that in the region overlapping with the conductor 114.

Examples of the dopant added to the region 126b and the region 126c include helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. Among these elements, helium, neon, argon, krypton, xenon, nitrogen, fluorine, phosphorus, chlorine, arsenic, and boron are preferable because these elements can be added relatively easily by an ion implantation method, an ion doping method, a plasma immersion ion implantation method, or the like.

Because the element contained in the insulator 116 is added to the low-resistance region 107a and the low-resistance region 107b, the concentration of the element measured by SIMS in the regions is higher than that in the region of the semiconductor 106b other than the low-resistance region 107a and the low-resistance region 107b (e.g., a region of the semiconductor 106b that overlaps with the conductor 114 and the insulator 115).

The element added to the low-resistance region 107a and the low-resistance region 107b is preferably boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, or tungsten, for example. These elements relatively easily form an oxide that can serve as a semiconductor or an insulator and thus, these elements are favorable as the element added to the insulator 106a, the semiconductor 106b, or the insulator 106c. For example, the low-resistance region 107a and the low-resistance region 107b preferably contain the above element at higher than or equal to $1 \times 10^{14}/cm^2$ and lower than or equal to $2 \times 10^{16}/cm^2$. The concentration of the above element is higher in the low-resistance region 107a and the low-resistance region 107b included in the insulator 106c than in a region of the insulator 106c other than the low-resistance region 107a and the low-resistance region 107b (e.g., a region of the insulator 106c overlapping with the conductor 114 and the insulator 115).

Because the low-resistance region 107a and the low-resistance region 107b can become n-type by containing nitrogen, the concentration of nitrogen measured by SIMS in the regions is higher than that in the region of the semiconductor 106b other than the low-resistance region 107a and the low-resistance region 107b (e.g., a region of the semiconductor 106b that overlaps with the conductor 114).

The formation of the region 126b, the region 126c, the low-resistance region 107a, and the low-resistance region 107b leads to a reduction in contact resistance between the conductor 108a or 108b and the insulator 106a, the semiconductor 106b, or the insulator 106c, whereby the transistor 20 can have high on-state current.

As illustrated in FIG. 6B, it is preferable that the end portion of the side surface of the conductor 114 in the channel length direction be substantially aligned with the end portion of the side surface of the insulator 112 in the channel length direction. With such a structure, the regions 126b and 126c are substantially in contact with the region of the semiconductor 106b that overlaps with the conductor 114 (channel formation region), whereby on-state current can be increased.

In the transistor 20, the semiconductor 106b is surrounded by the insulator 106a and the insulator 106c. Accordingly, the end portion of the side surface of the semiconductor 106b, especially, the vicinity of the end portion of the side surface thereof in the channel width direction is in contact with the insulator 106a and the insulator 106c. As a result, in the vicinity of the end portion of the side surface of the semiconductor 106b, continuous junction is formed between the insulator 106a and the semiconductor 106b or between the insulator 106c and the semiconductor 106b and the density of defect states is reduced. Thus, even when on-state current easily follows owing to the low-resistance region 107a and the low-resistance region 107b, the end portion of the side surface of the semiconductor 106b in the channel width direction does not serve as a parasitic channel, which enables stable electrical characteristics.

Furthermore, the low-resistance region 107a (the low-resistance region 107b) serving as a source region or a drain region, and the region 126b (the region 126c) having higher resistance than the low-resistance region and serving as a lightly doped drain (LDD) region are provided between the conductor 108a (the conductor 108b) and the region 126a of the semiconductor 106b serving as the channel formation region. Accordingly, electric field concentration in the vicinity of the drain of the transistor 20 can be reduced, which prevents damage to the vicinity of the drain due to the electric field concentration. The transistor 20 can be more resistant to a short channel effect. In addition, leakage current in an off state can be reduced.

With the above structure, a transistor with stable electrical characteristics can be provided. A transistor having a low leakage current in an off state can be provided. A transistor having a high on-state current can be provided. A transistor with normally-off electrical characteristics can be provided. A transistor with a small subthreshold swing value can be provided. A highly reliable transistor can be provided.

Modification Example 2 of Transistor

Modification examples of the transistor 20 are described below with reference to FIGS. 7A to 7D and FIGS. 8A to 8C. FIGS. 7A to 7D and FIGS. 8A to 8C are cross-sectional views in the channel length direction and those in the channel width direction like FIGS. 6B and 6C. Note that the components in the following modification examples of the transistor 20 can be combined with each other as appropriate.

Figure 7A:
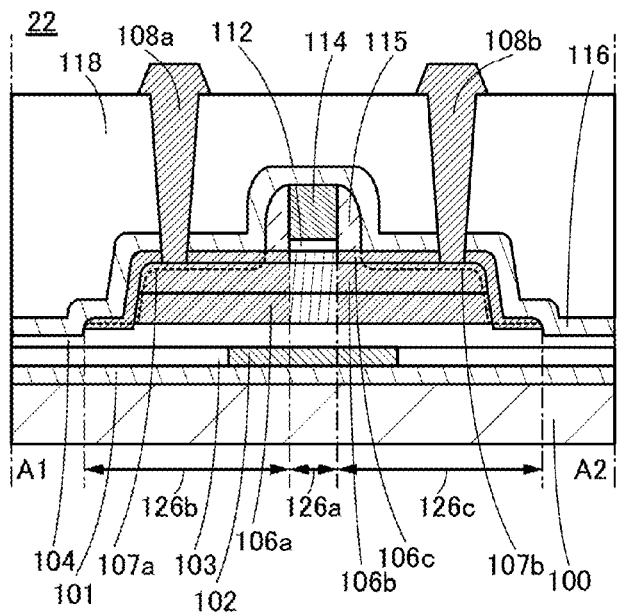
FIGS. 7A to 7D are cross-sectional views illustrating transistors of embodiments of the present invention.
Figure 7B:
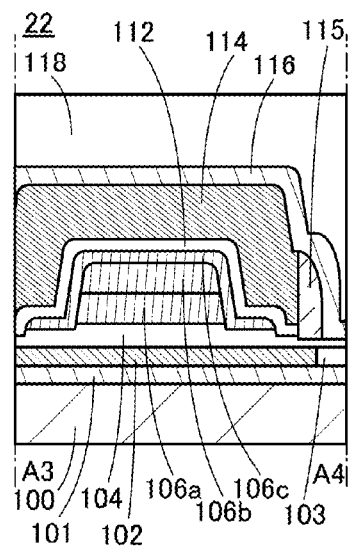
Figure 7C:
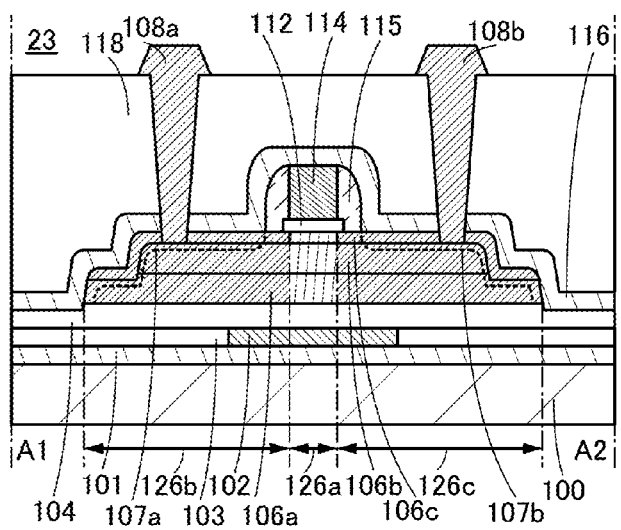
Figure 7D:
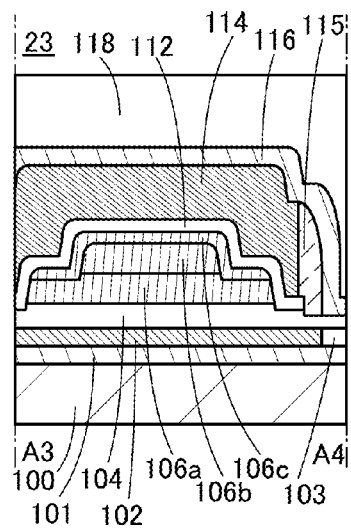

A transistor 22 illustrated in FIGS. 7A and 7B is different from the transistor 20 in that the end portion of the side surface of the insulator 106a is substantially aligned with the end portion of the side surface of the semiconductor 106b. Here, the thickness of the insulator 106a is preferably larger than the sum of the thicknesses of the insulator 106c and the insulator 112. With such a structure, substantially the entire side surface of the semiconductor 106b in the channel width direction can face the conductor 114 with the insulator 106c and the insulator 112 positioned therebetween.

With the above structure, as illustrated in FIG. 7B, the semiconductor 106b can be electrically surrounded by an electric field of the conductor 114. Therefore, a channel is formed in the entire semiconductor 106b in some cases. In the s-channel structure, a large amount of current can flow between a source and a drain of a transistor, so that a high on-state current can be obtained.

In the case where the transistor has the s-channel structure, a channel is formed also in the side surface of the semiconductor 106b. Therefore, as the semiconductor 106b has a larger thickness, the channel region becomes larger. In other words, the thicker the semiconductor 106b is, the larger the on-state current of the transistor is. In addition, when the semiconductor 106b is thicker, the proportion of the region with a high carrier controllability increases, leading to a smaller subthreshold swing value. For example, the semiconductor 106b has a region with a thickness greater than or equal to 10 nm, preferably greater than or equal to 20 nm, further preferably greater than or equal to 30 nm, still further preferably greater than or equal to 50 nm. Since the productivity of the semiconductor device might be decreased, the semiconductor 106b has a region with a thickness of, for example, less than or equal to 300 nm, preferably less than or equal to 200 nm, further preferably less than or equal to 150 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, still further preferably less than or equal to 20 nm and a region having a channel width of preferably less than or equal to 40 nm, further preferably less than or equal to 30 nm, still further preferably less than or equal to 20 nm.

In the transistor 20 illustrated in FIGS. 6A and 6B, the end portion of the side surface of the conductor 114 in the channel length direction is substantially aligned with the end portion of the side surface of the insulator 112 in the channel length direction; however, the structure described in this embodiment is not limited to the above structure. For example, as in a transistor 23 illustrated in FIGS. 7C and 7D, the width of the conductor 114 in the channel length direction may be smaller than the width of the insulator 112 in the channel length direction.

Figure 8A:
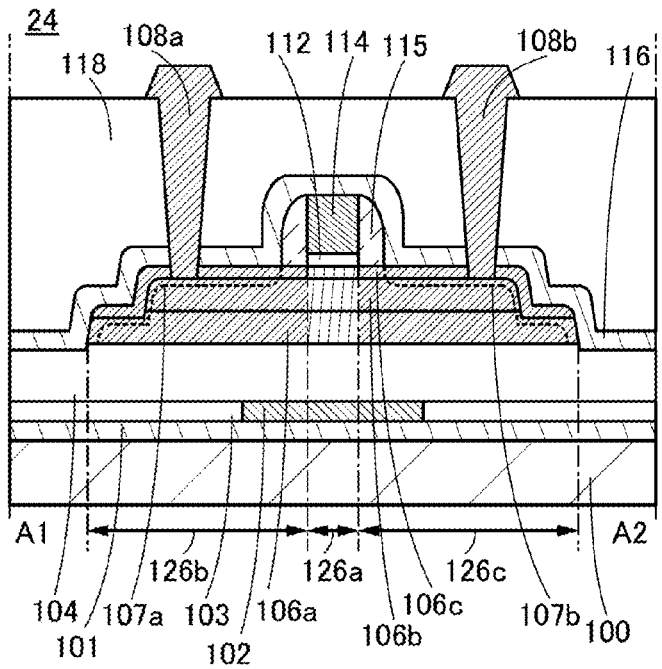
FIGS. 8A to 8C are cross-sectional views illustrating a transistor of one embodiment of the present invention.
Figure 8B:
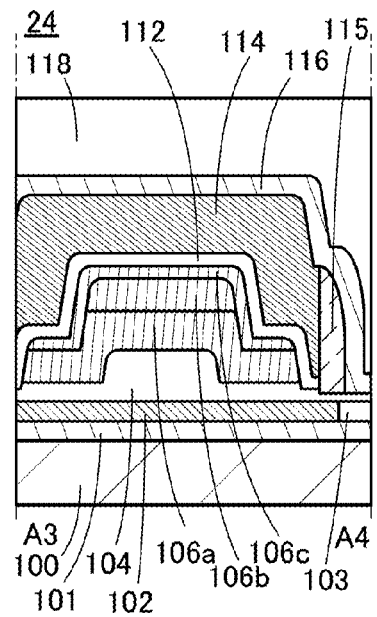

A transistor 24 illustrated in FIGS. 8A and 8B is different from the transistor 20 in that part of the insulator 104 has a larger thickness. The end portion of the side surface of the thick region of the insulator 104 in the channel width direction is preferably located inward from the end portion of the side surface of the semiconductor 106b in the channel width direction. In other words, the insulator 104 has a projection and when seen from above, the periphery of the projection is located inside the periphery of the semiconductor 106b. It is further preferable that the end portion of the side surface of the thick region of the insulator 104 in the channel width direction be located inward from the end portion of the side surface of the semiconductor 106b in the channel width direction by a distance approximately equal to the thickness of the insulator 106a. Here, a difference between the thickness of the thick region of the insulator 104 and the thin region thereof is preferably larger than the sum of the thicknesses of the insulator 106c and the insulator 112. With such a structure, substantially the entire side surface of the semiconductor 106b in the channel width direction can face the conductor 114 with the insulator 106c and the insulator 112 positioned therebetween.

With the above structure, the transistor 24 can have an s-channel structure similarly to the above transistor 22. Thus, in the transistor 24, a large amount of current can flow between a source and a drain, so that a high on-state current can be obtained.

Figure 8C:
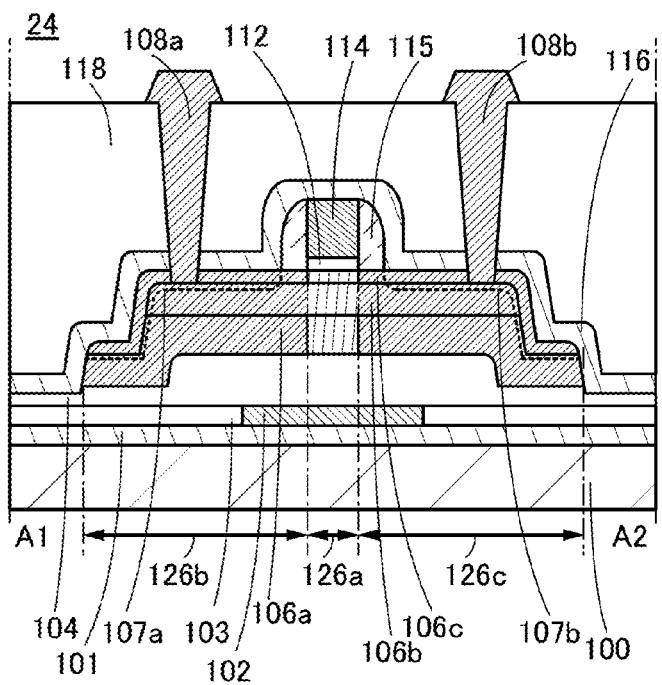

Although the thick region of the insulator 104 extends in the channel length direction in the transistor 24 illustrated in FIG. 8A, the structure described in this embodiment is not limited to the above structure. For example, as illustrated in FIG. 8C, the end portion of the side surface of the thick region of the insulator 104 in the channel length direction may be located inward from the end portion of the side surface of the semiconductor 106b in the channel length direction.

The structure and method described in this embodiment can be implemented by being combined as appropriate with any of the structures and methods described in the other embodiments.

Embodiment 4

In this embodiment, a method for manufacturing the semiconductor device of one embodiment of the present invention will be described with reference to FIGS. 9A to 9F and FIGS. 10A to 10F.

<Method 2 for Manufacturing Transistor>

A method for manufacturing the transistor 20 illustrated in FIGS. 6A to 6E will be described below.

First, the substrate 100 is prepared. Any of the above-mentioned substrates can be used for the substrate 100.

Next, the insulator 101 is formed. For the formation of the insulator 101, the description of the above embodiment can be referred to.

Then, the insulator 103 is formed. For the formation of the insulator 103, the description of the above embodiment can be referred to.

Next, a resist or the like is formed over the insulator 103 and an opening is formed in the insulator 103. For the formation of the resist or the like, the description of the above embodiment can be referred to.

Next, a conductor to be the conductor 102 is formed. For the formation of the conductor to be the conductor 102, the description of the above embodiment can be referred to.

Next, the conductor to be the conductor 102 over the insulator 103 is removed by CMP treatment. As a result, the conductor 102 remains only in the opening formed in the insulator 103.

Figure 9A:
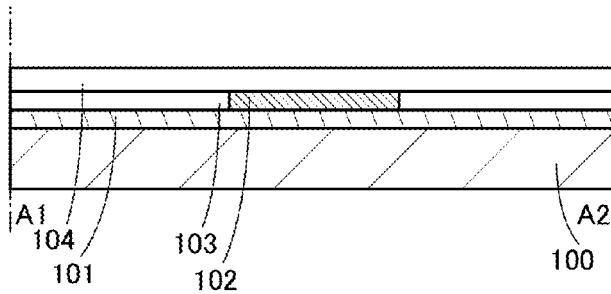
FIGS. 9A to 9F are cross-sectional views illustrating a method for manufacturing a transistor of one embodiment of the present invention.
Figure 9B:
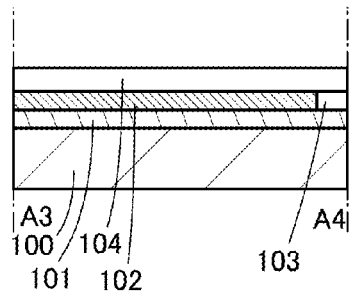

Then, the insulator 104 is formed (see FIGS. 9A and 9B). For the formation of the insulator 104, the description of the above embodiment can be referred to.

Then, an insulator to be the insulator 106a in a later step is formed. For the formation of the insulator, the description of the above embodiment can be referred to.

Next, a semiconductor to be the semiconductor 106b in a later step is formed. For the formation of the semiconductor, the description of the above embodiment can be referred to.

Next, heat treatment is preferably performed. The heat treatment can reduce the hydrogen concentration of the insulator 106a and the semiconductor 106b formed in later steps in some cases. The heat treatment can reduce oxygen vacancies in the insulator 106a and the semiconductor 106b formed in later steps in some cases. For the heat treatment, the description of the above embodiment can be referred to.

Furthermore, high-density plasma treatment or the like may be performed. High-density plasma may be generated using microwaves. For the high-density plasma treatment, the description of the above embodiment can be referred to.

Figure 9C:
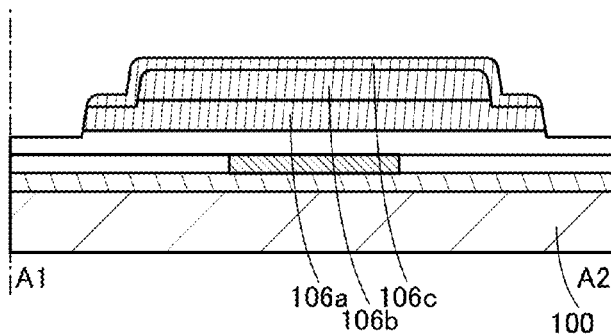
Figure 9D:
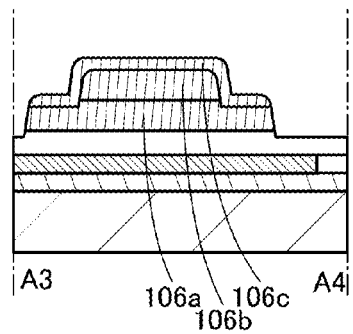

Next, a resist or the like is formed over the semiconductor to be the semiconductor 106b and processing is performed using the resist or the like, whereby the semiconductor 106b is formed. As illustrated in FIGS. 9C and 9D, an exposed surface of the insulator 106a is removed at the time of formation of the semiconductor 106b in some cases.

Then, an insulator to be the insulator 106c in a later step is formed. For the formation of the insulator, the description of the above embodiment can be referred to.

Next, a resist or the like is formed over the insulator to be the insulator 106c and processing is performed using the resist or the like, whereby the insulator 106a and the insulator 106c are formed (see FIGS. 9C and 9D). As illustrated in FIGS. 9C and 9D, an exposed surface of the insulator 104 is removed at the time of formation of the insulator 106a and the insulator 106c in some cases. For the formation of the patterned insulator 106a and insulator 106c, the description of the above embodiment can be referred to.

Then, an insulator to be the insulator 112 in a later step is formed. For the formation of the insulator, the description of the above embodiment can be referred to.

Next, a conductor to be the conductor 114 in a later step is formed. For the formation of the conductor, the description of the above embodiment can be referred to.

Next, a resist or the like is formed over the conductor to be the conductor 114 and processing is performed with the resist or the like, whereby the insulator 112 and the conductor 114 are formed. For the formation of the patterned insulator 112 and conductor 114, the description of the above embodiment can be referred to.

Figure 9E:
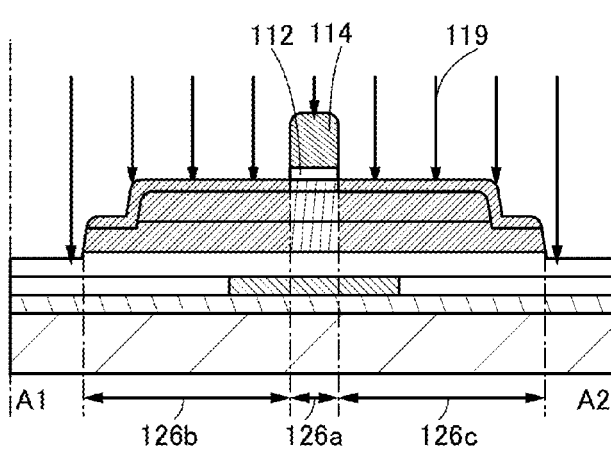
Figure 9F:
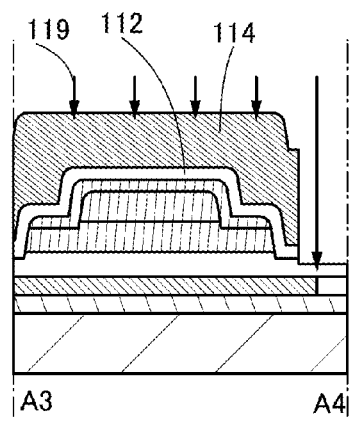

Next, a dopant 119 is added to the insulator 106a, the semiconductor 106b, and the insulator 106c with the use of the conductor 114 and the insulator 112 as masks (see FIGS. 9E and 9F). As a result, the region 126a, the region 126b, and the region 126c are formed in the insulator 106a, the semiconductor 106b, and the insulator 106c. Thus, the concentration of the dopant 119 measured by SIMS is higher in the region 126b and the region 126c than in the region 126a. Examples of a method for adding the dopant 119 include an ion implantation method, an ion doping method, and a plasma immersion ion implantation method.

The addition of the dopant 119 may be controlled by setting the addition conditions such as the acceleration voltage and the dosage as appropriate. The dosage of the dopant 119 is, for example, greater than or equal to $1 \times 10^{12}$ ions/cm$^2$ and less than or equal to $1 \times 10^{16}$ ions/cm$^2$, preferably greater than or equal to $1 \times 10^{13}$ ions/cm$^2$ and less than or equal to $1 \times 10^{15}$ ions/cm$^2$. The acceleration voltage at the time of addition of the dopant 119 is higher than or equal to 2 kV and lower than or equal to 50 kV, preferably higher than or equal to 5 kV and lower than or equal to 30 kV.

Examples of the dopant 119 include helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. Among these elements, helium, neon, argon, krypton, xenon, nitrogen, fluorine, phosphorus, chlorine, arsenic, and boron are preferable because these elements can be added relatively easily by an ion implantation method, an ion doping method, a plasma immersion ion implantation method, or the like.

After the addition of the dopant 119, heat treatment may be performed. The heat treatment may be performed at higher than or equal to 250° C. and lower than or equal to 650° C., preferably higher than or equal to 350° C. and lower than or equal to 450° C. in a nitrogen atmosphere, or under reduced pressure or air (ultra dry air), for example.

Next, an insulator to be the insulator 115 in a later step is formed. Any of the above-described insulators can be used for the insulator. The insulator 115 can be formed by a sputtering method, a CVD method, an MBE method, a PLD method, an ALD method, or the like.

Figure 10A:
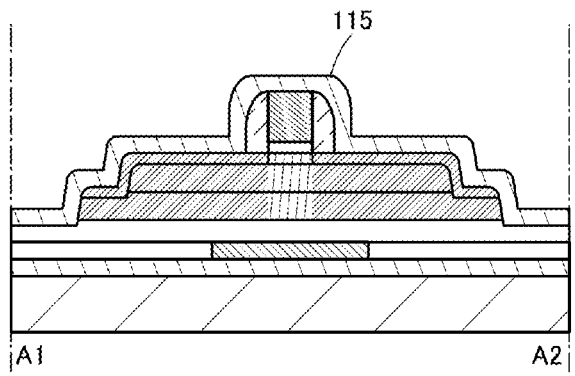
FIGS. 10A to 10F are cross-sectional views illustrating a method for manufacturing a transistor of one embodiment of the present invention.
Figure 10B:
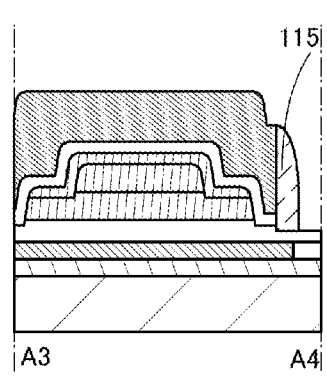

Next, the insulator to be the insulator 115 is subjected to anisotropic etching, so that the insulator 115 is formed to be in contact with a side surface of the conductor 114 in a self-aligned manner (see FIGS. 10A and 10B). Here, the etching of the insulator to be the insulator 115 can be performed by, for example, a reactive ion etching (RIE) method.

Figure 10C:
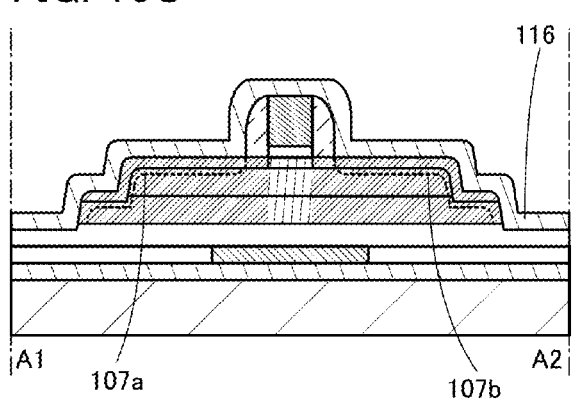
Figure 10D:
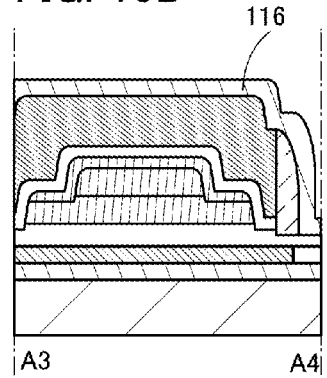
Figure 10E:
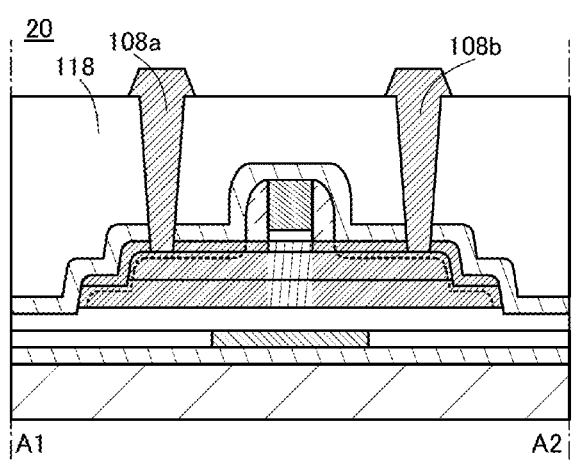
Figure 10F:
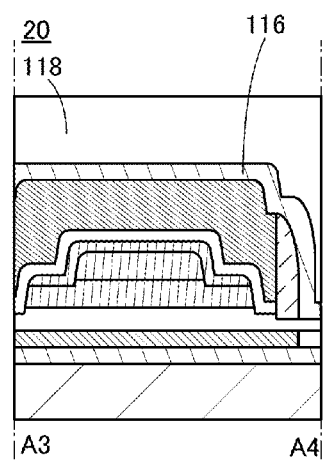

Then, the insulator 116 is formed (see FIGS. 10C and 10D). For the formation of the insulator 116, the description of the above embodiment can be referred to. By the formation of the insulator 116, the low-resistance region 107a and the low-resistance region 107b are formed in the insulator 106a, the semiconductor 106b, and the insulator 106c in the vicinity of the interface with the insulator 116.

Any of the above elements or a rare gas (e.g., helium, neon, argon, krypton, or xenon) may be added after deposition of the insulator 116 to further reduce the resistance of the low-resistance region 107a and the low-resistance region 107b. By the above addition, an element contained in the insulator 116 can be pushed into (knocked on) the insulator 106a, the semiconductor 106b, and the insulator 106c. For the method for the addition, the description of the above embodiment can be referred to.

Next, heat treatment is preferably performed. By the heat treatment, oxygen can be supplied from the insulator 104 or the like to the insulator 106a, the semiconductor 106b, and the insulator 106c. For the heat treatment, the description of the above embodiment can be referred to.

Then, the insulator 118 is formed. For the formation of the insulator 118, the description of the above embodiment can be referred to.

Next, a resist or the like is formed over the insulator 118, and openings are formed in the insulator 118, the insulator 116, and the insulator 106c. Then, a conductor to be the conductor 108a and the conductor 108b is formed. For the formation of the conductor to be the conductor 108a and the conductor 108b, the description of the above embodiment can be referred to.

Then, a resist or the like is formed over the conductor to be the conductor 108a and the conductor 108b, and the conductor is processed with the use of the resist or the like; thus, the conductor 108a and the conductor 108b are formed (see FIGS. 10C and 10D).

Through the above steps, the transistor 20 of one embodiment of the present invention can be manufactured.

When the above-described manufacturing method is employed, in a line where top-gate transistors are formed by a gate-first method using LTPS, LTPS can be easily replaced with an oxide semiconductor.

With the above structure, a transistor with stable electrical characteristics can be provided. A transistor having a low leakage current in an off state can be provided. A transistor having a high on-state current can be provided. A transistor with normally-off electrical characteristics can be provided. A transistor with a small subthreshold swing value can be provided. A highly reliable transistor can be provided.

The structure and method described in this embodiment can be implemented by being combined as appropriate with any of the structures and methods described in the other embodiments.

Embodiment 5

In this embodiment, the oxide semiconductor included in a semiconductor device of one embodiment of the present invention will be described in detail below.

<Structure of Oxide Semiconductor>

A structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 11A:
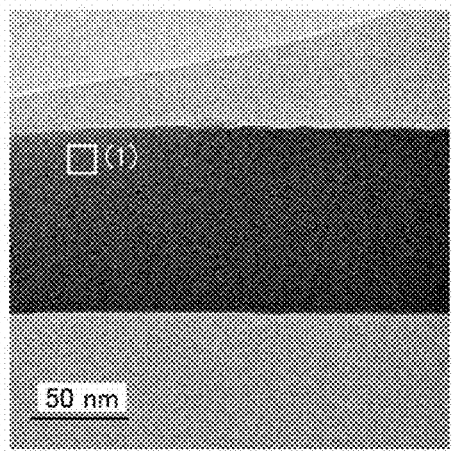
FIGS. 11A to 11D are Cs-corrected high-resolution TEM images of a cross section of a CAAC-OS and a schematic cross-sectional view of a CAAC-OS.

A CAAC-OS observed with TEM is described below. FIG. 11A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 11B:
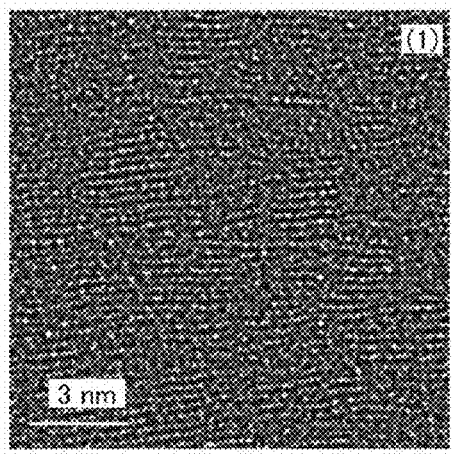

FIG. 11B is an enlarged Cs-corrected high-resolution TEM image of a region (1) in FIG. 11A. FIG. 11B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 11C:
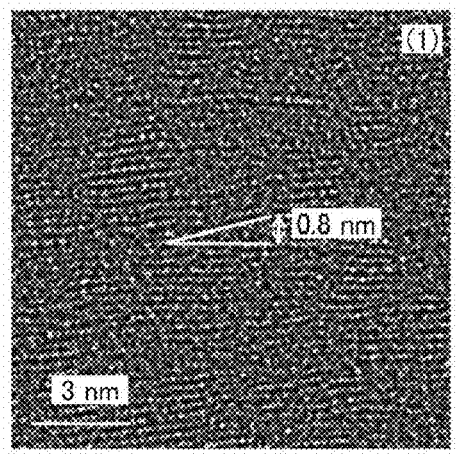

As shown in FIG. 11B, the CAAC-OS has a characteristic atomic arrangement. The characteristic atomic arrangement is denoted by an auxiliary line in FIG. 11C. FIGS. 11B and 11C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 11D:
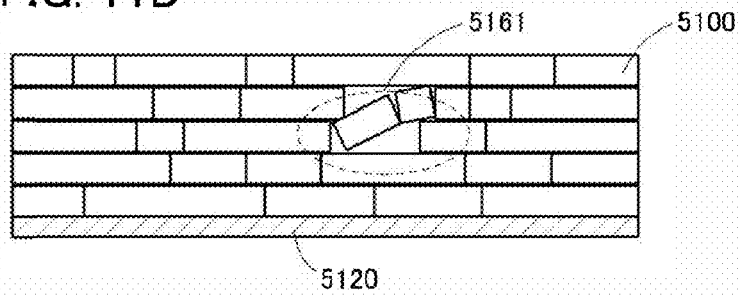

Here, according to the Cs-corrected high-resolution TEM images, the schematic arrangement of pellets 5100 of a CAAC-OS over a substrate 5120 is illustrated by such a structure in which bricks or blocks are stacked (see FIG. 11D). The part in which the pellets are tilted as observed in FIG. 11C corresponds to a region 5161 shown in FIG. 11D.

FIG. 12A shows a Cs-corrected high-resolution TEM image of a plane of the CAAC-OS observed from a direction substantially perpendicular to the sample surface. FIGS. 12B, 12C, and 12D are enlarged Cs-corrected high-resolution TEM images of regions (1), (2), and (3) in FIG. 12A, respectively. FIGS. 12B, 12C, and 12D indicate that metal atoms are arranged in a triangular, quadrangular, or hexagonal configuration in a pellet. However, there is no regularity of arrangement of metal atoms between different pellets.

Figure 13A:
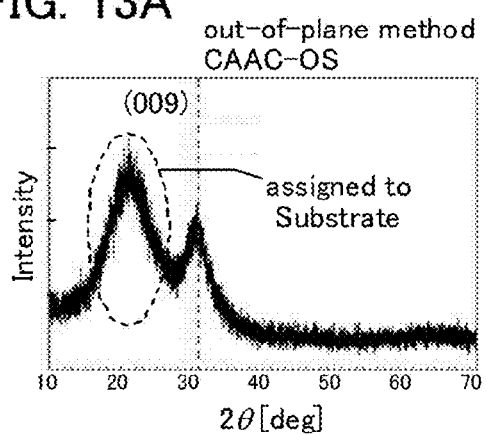
FIGS. 13A to 13C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 13A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 13B:
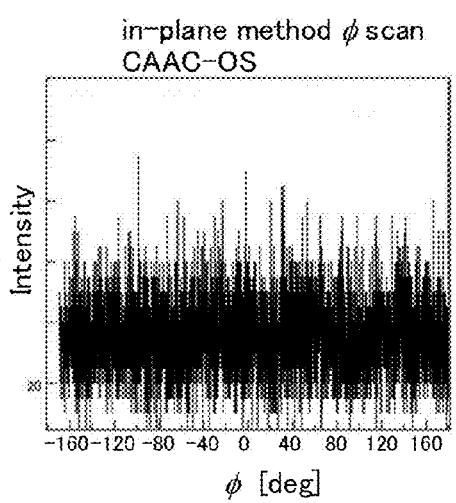
Figure 13C:
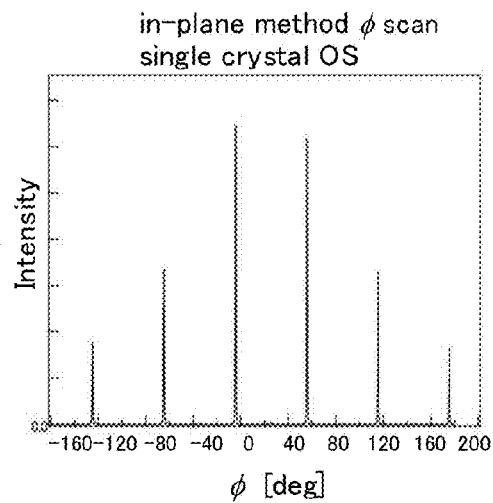

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 13B, a peak is not clearly observed. In contrast, in the case of a single crystal oxide semiconductor of $InGaZnO_4$, when $\phi$ scan is performed with $2\theta$ fixed at around 56°, as shown in FIG. 13C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 14A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 14B shows a diffraction pattern obtained in such a manner that an electron beam with a probe diameter of 300 nm is incident on the same sample in a direction perpendicular to the sample surface. As shown in FIG. 14B, a ring-like diffraction pattern is observed. Thus, the electron diffraction also indicates that the a-axes and b-axes of the pellets included in the CAAC-OS do not have regular alignment. The first ring in FIG. 14B is considered to be derived from the (010) plane, the (100) plane, and the like of the $InGaZnO_4$ crystal. The second ring in FIG. 14B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 15:
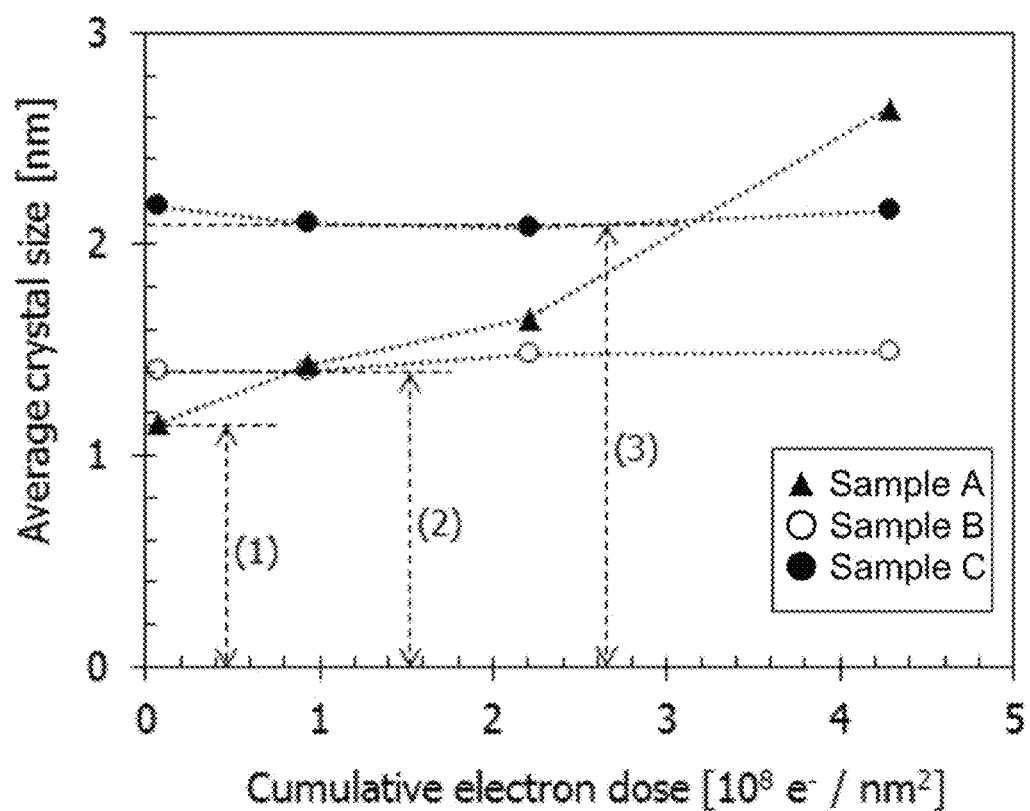
FIG. 15 shows a change of crystal parts of an In—Ga—Zn oxide due to electron irradiation.

FIG. 15 shows change in the average size of crystal parts (at 22 points to 45 points) in each sample. Note that the crystal part size corresponds to the length of a lattice fringe. FIG. 15 indicates that the crystal part size in the a-like OS increases with an increase in the cumulative electron dose. Specifically, as shown by (1) in FIG. 15, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 15, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

The structure and method described in this embodiment can be implemented by being combined as appropriate with any of the structures and methods described in the other embodiments.

Embodiment 6

In this embodiment, an example of a circuit of a semiconductor device including a transistor or the like of one embodiment of the present invention will be described.

<CMOS Inverter>

Figure 16A:
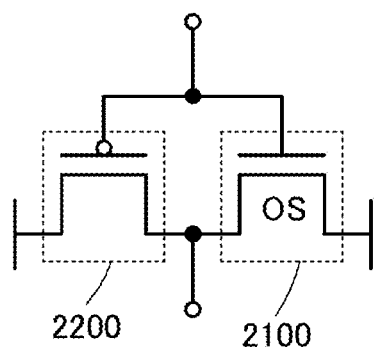
FIGS. 16A and 16B are circuit diagrams illustrating a semiconductor device of one embodiment of the present invention.

A circuit diagram in FIG. 16A shows a configuration of what is called a CMOS inverter in which a p-channel transistor 2200 and an n-channel transistor 2100 are connected to each other in series and in which gates of them are connected to each other.

<Structure of Semiconductor Device>

Figure 17:
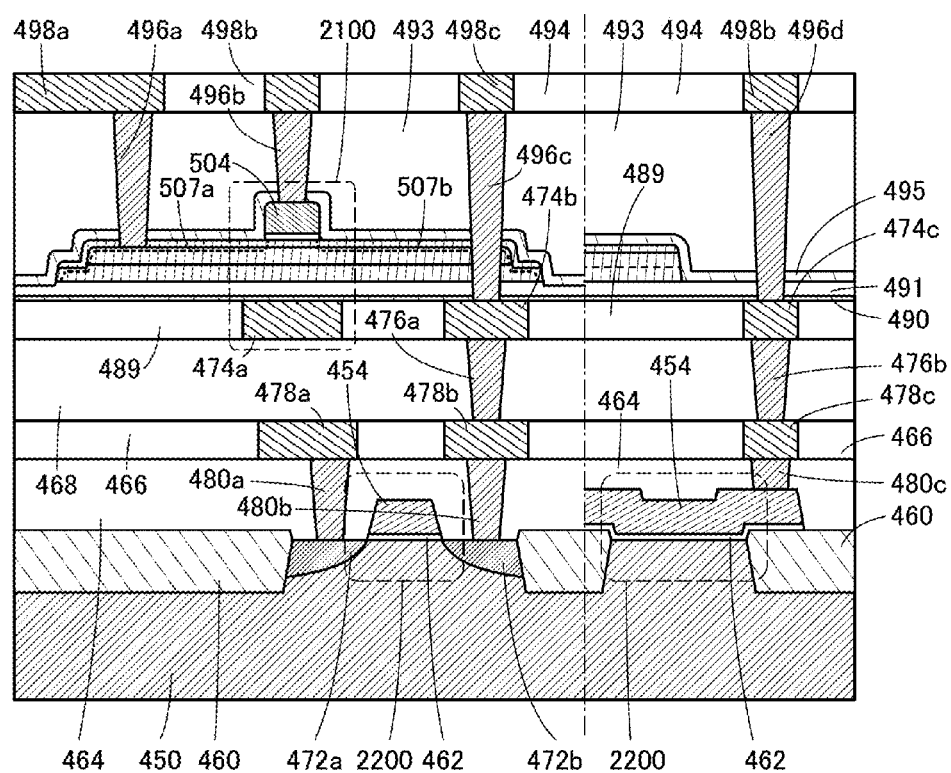
FIG. 17 is a cross-sectional view illustrating a semiconductor device of one embodiment of the present invention.
Figure 18:
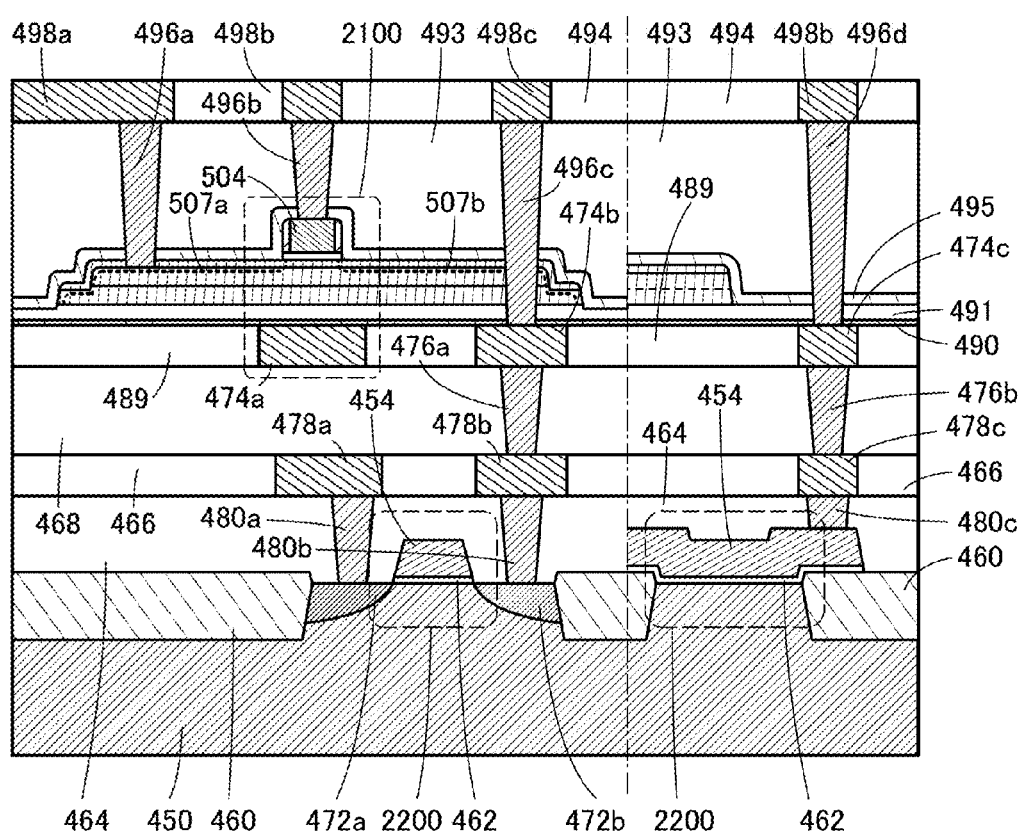
FIG. 18 is a cross-sectional view illustrating a semiconductor device of one embodiment of the present invention.

FIG. 17 is a cross-sectional view of the semiconductor device of FIG. 16A. The semiconductor device shown in FIG. 17 includes the transistor 2200 and the transistor 2100. The transistor 2100 is placed above the transistor 2200. Any of the transistors described in Embodiments 1 and 2 can be used as the transistor 2100. Furthermore, any of the transistors described in Embodiments 3 and 4 can be used as the transistor 2100 as illustrated in FIG. 18. Thus, the description regarding the above-mentioned transistors can be referred to for the transistor 2100 as appropriate.

The transistor 2200 shown in FIG. 17 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 has a function of a gate insulator. The conductor 454 has a function of a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device illustrated in FIG. 17 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 489, an insulator 490, an insulator 491, an insulator 492, an insulator 493, an insulator 494, and an insulator 495.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 493 is placed over the transistor 2100. The insulator 494 is placed over the insulator 493.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 504 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable. Note that the conductor 474a corresponds to the conductor 102 in the above embodiment and thus, the description of the conductor 102 can be referred to for details about the conductor 474a.

The insulator 490 includes an opening reaching the conductor 474b and an opening reaching the conductor 474c. Note that the insulator 490 can be formed using the insulator that is used for the insulator 101 in the above embodiment.

The insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 2100.

The insulator 491 includes the opening reaching the conductor 474b and the opening reaching the conductor 474c. Note that the insulator 491 corresponds to the insulator 104 in the above embodiment and thus, the description of the insulator 104 can be referred to for details about the insulator 491.

The insulator 495 includes the opening reaching the conductor 474b through a region 507b that is one of a source and a drain of the transistor 2100, an opening reaching a region 507a that is the other of the source and the drain of the transistor 2100, an opening reaching the conductor 504 that is the gate electrode of the transistor 2100, and the opening reaching the conductor 474c. Note that the insulator 495 corresponds to the insulator 116 in the above embodiment and thus, the description of the insulator 116 can be referred to for details about the insulator 495.

The insulator 493 includes the opening reaching the conductor 474b through the region 507b that is one of the source and the drain of the transistor 2100, the opening reaching the region 507a that is the other of the source and the drain of the transistor 2100, the opening reaching the conductor 504 that is the gate electrode of the transistor 2100, and the opening reaching the conductor 474c. In the openings, the conductor 496a, the conductor 496b, the conductor 496c, and the conductor 496d are embedded. Note that in some cases, an opening provided in a component of the transistor 2100 or the like is positioned between openings provided in other components. Note that the insulator 493 corresponds to the insulator 118 in the above embodiment and thus, the description of the insulator 118 can be referred to for details about the insulator 493.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 489, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, 489, 493, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 19:
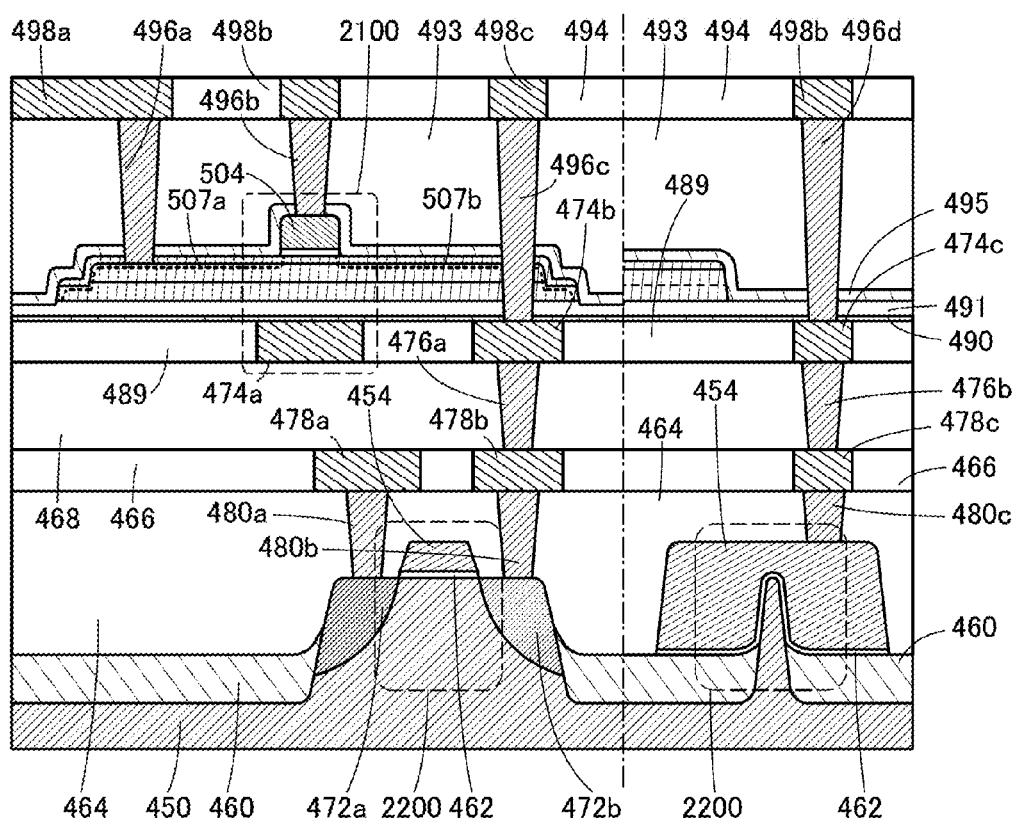
FIG. 19 is a cross-sectional view illustrating a semiconductor device of one embodiment of the present invention.
Figure 20:
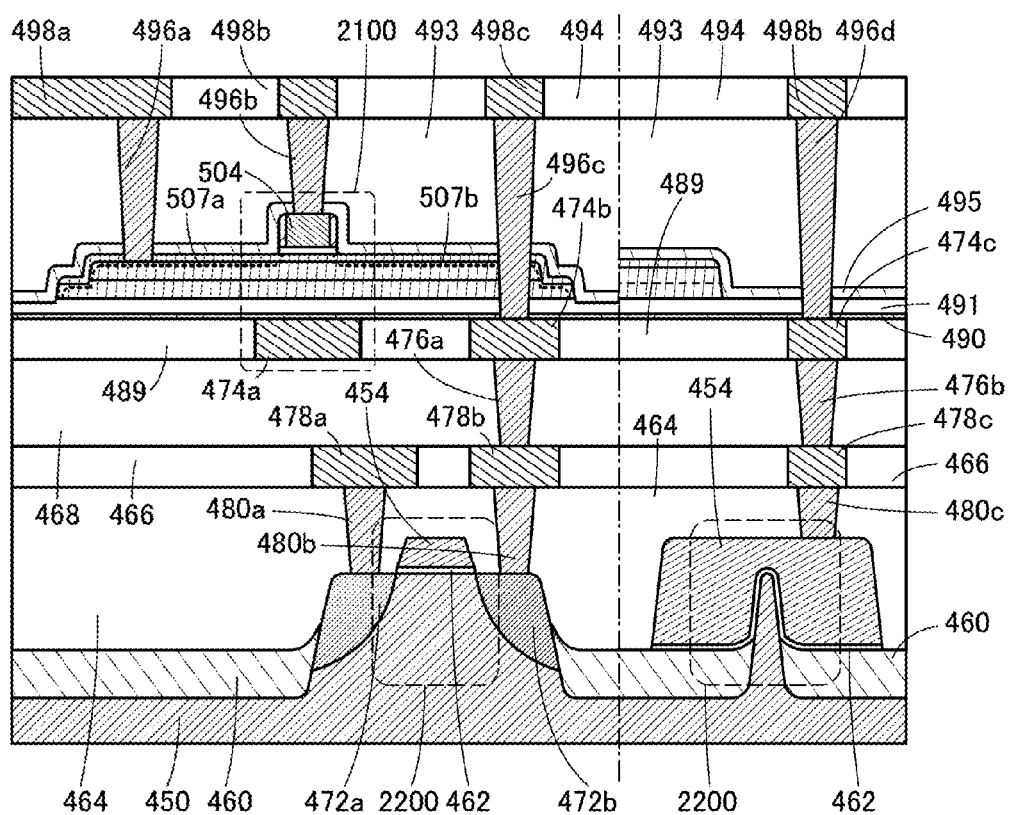
FIG. 20 is a cross-sectional view illustrating a semiconductor device of one embodiment of the present invention.

Note that a semiconductor device in FIG. 19 is the same as the semiconductor device in FIG. 17 except for the structure of the transistor 2200. A semiconductor device in FIG. 20 is the same as the semiconductor device in FIG. 18 except for the structure of the transistor 2200. Therefore, the description of the semiconductor device in FIG. 17 is referred to for the semiconductor devices in FIG. 19 and FIG. 20. In the semiconductor devices in FIG. 19 and FIG. 20, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved.

Figure 21:
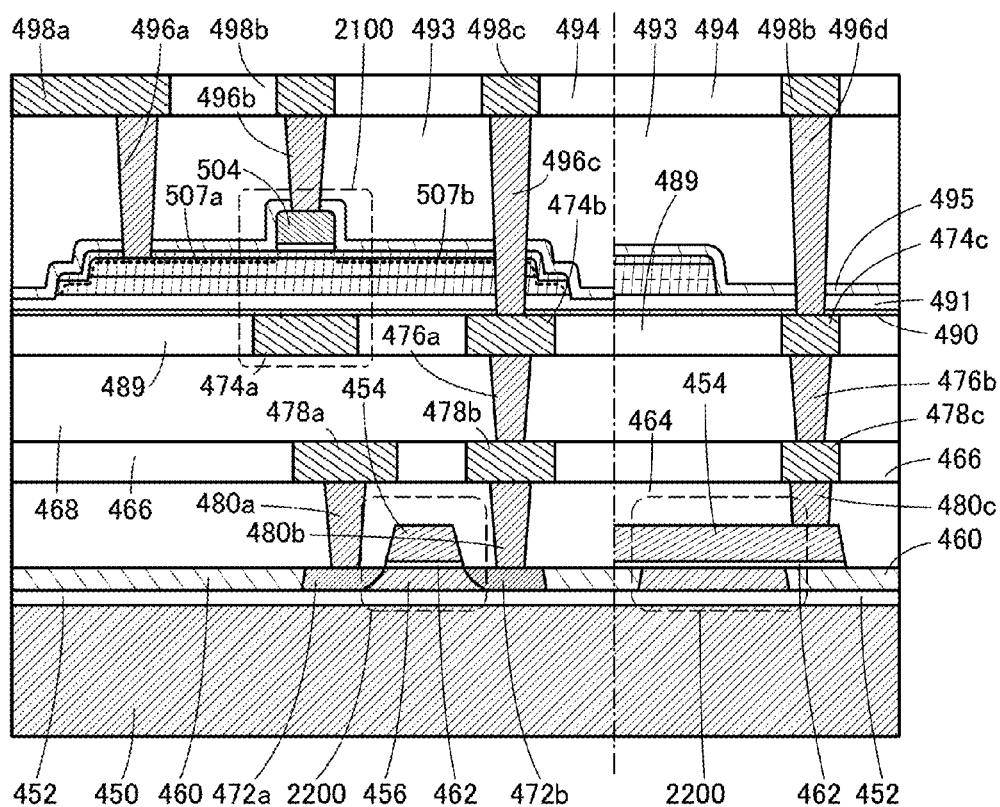
FIG. 21 is a cross-sectional view illustrating a semiconductor device of one embodiment of the present invention.
Figure 22:
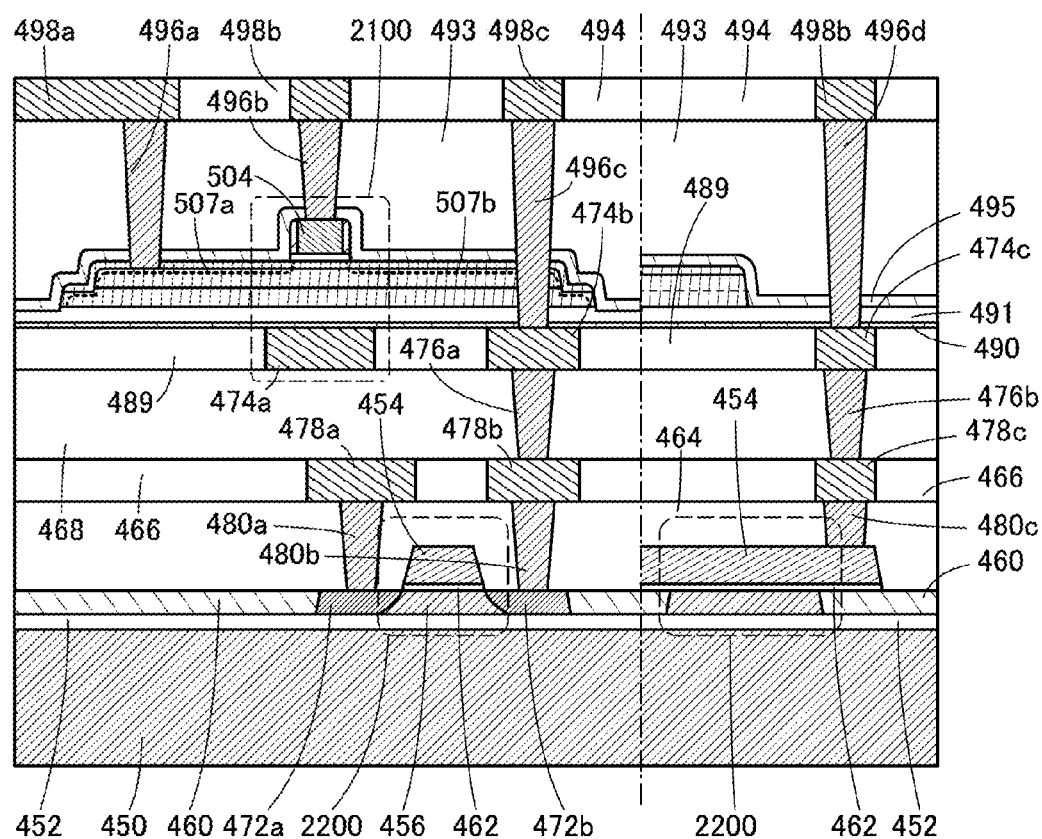
FIG. 22 is a cross-sectional view illustrating a semiconductor device of one embodiment of the present invention.

Note that a semiconductor device in FIG. 21 is the same as the semiconductor device in FIG. 17 except for the structure of the transistor 2200. Note that a semiconductor device in FIG. 22 is the same as the semiconductor device in FIG. 18 except for the structure of the transistor 2200. Therefore, the description of the semiconductor device in FIG. 17 is referred to for the semiconductor devices in FIG. 21 and FIG. 22. Specifically, in the semiconductor devices in FIG. 21 and FIG. 22, the transistor 2200 is formed in the semiconductor substrate 450 that is an SOI substrate.

In the structures in FIG. 21 and FIG. 22, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 17, FIG. 18, FIG. 19, FIG. 20, FIG. 21, and FIG. 22, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of LDD regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 16B:
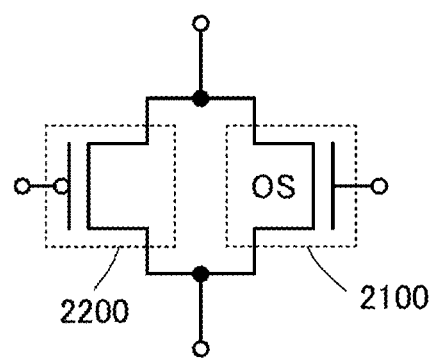

A circuit diagram in FIG. 16B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 23A:
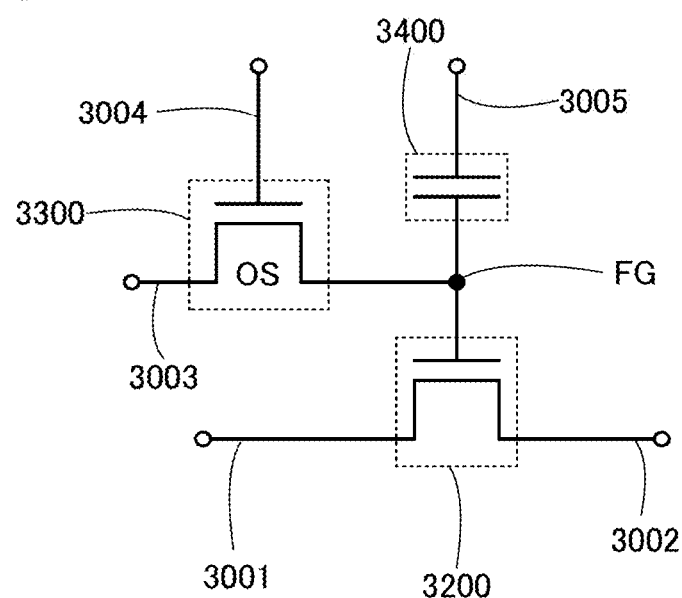
FIGS. 23A and 23B are circuit diagrams each illustrating a memory device of one embodiment of the present invention.
Figure 23B:
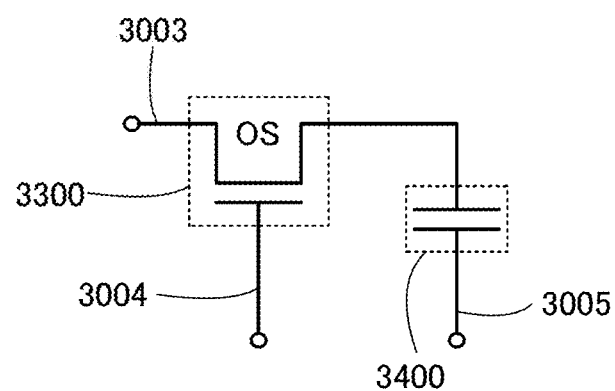

An example of a semiconductor device (memory device) which includes the transistor of one embodiment of the present invention, which can retain stored data even when not powered, and which has an unlimited number of write cycles is shown in FIGS. 23A and 23B.

The semiconductor device illustrated in FIG. 23A includes a transistor 3200 using a first semiconductor, a transistor 3300 using a second semiconductor, and a capacitor 3400. Note that a transistor similar to the transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 23A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 23A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. For example, a configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

<Structure of Memory Device 1>

Figure 24:
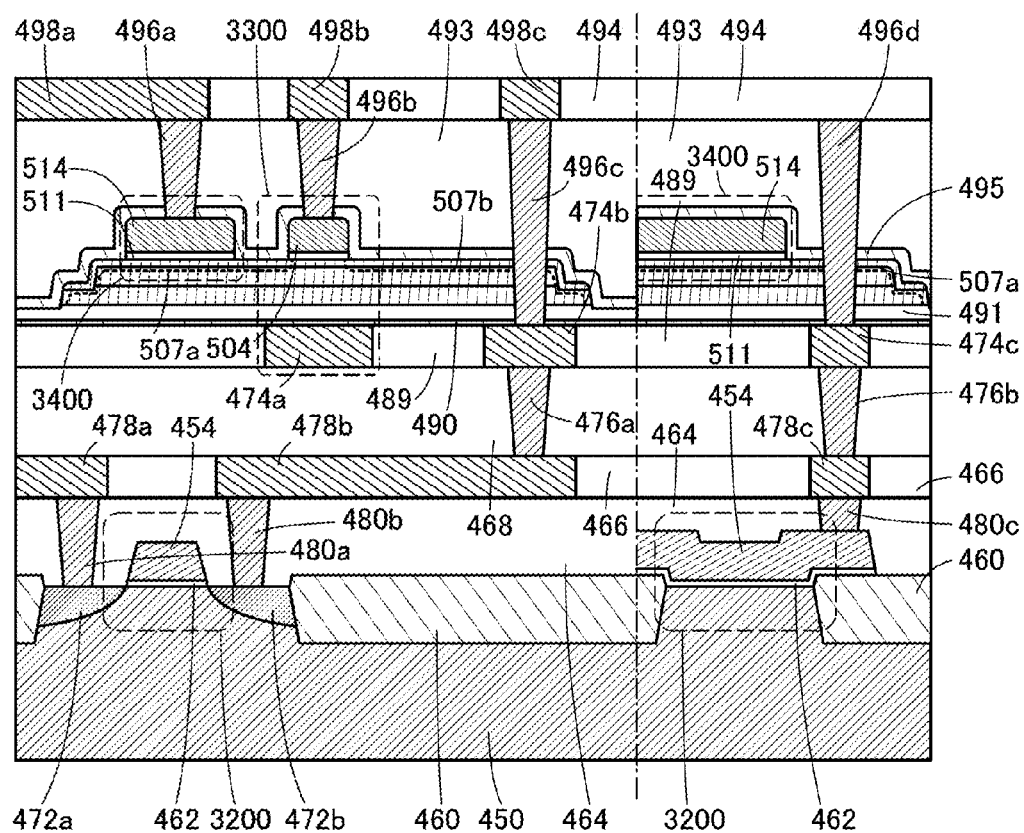
FIG. 24 is a cross-sectional view illustrating a semiconductor device of one embodiment of the present invention.
Figure 25:
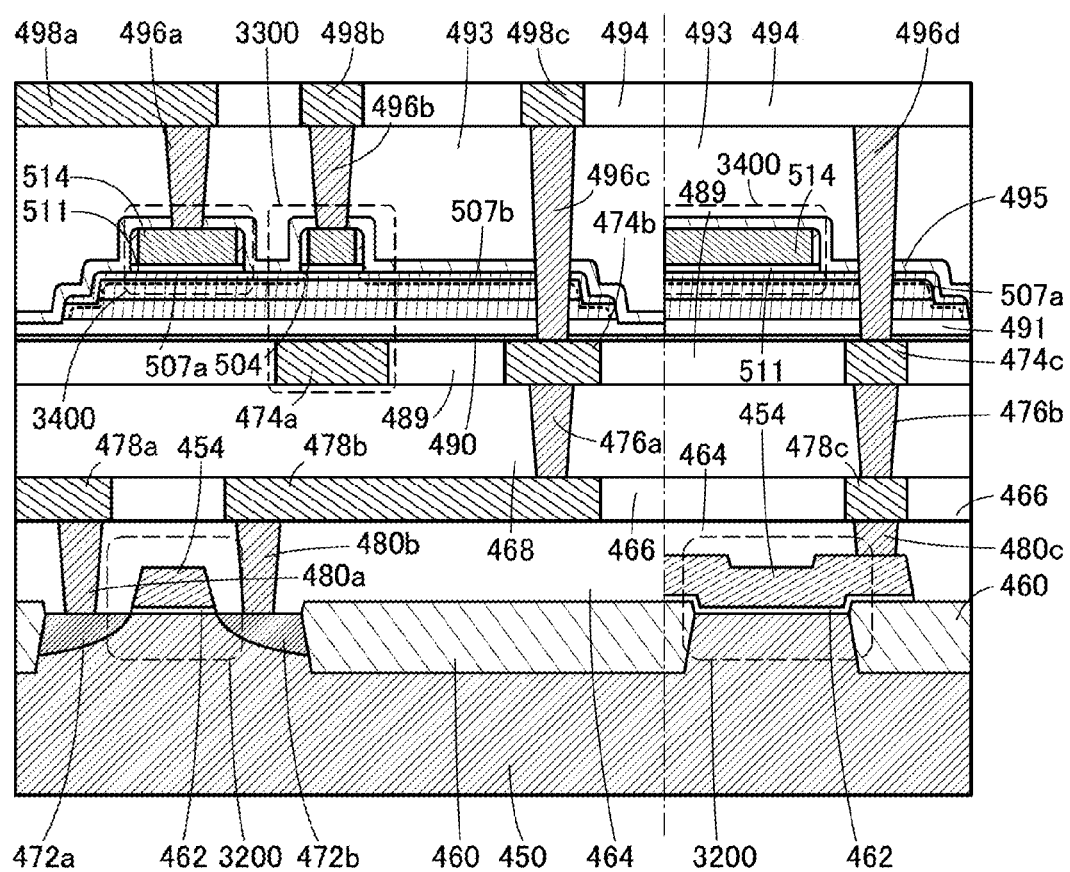
FIG. 25 is a cross-sectional view illustrating a semiconductor device of one embodiment of the present invention.

FIG. 24 is a cross-sectional view of the semiconductor device of FIG. 23A. The semiconductor device shown in FIG. 24 includes the transistor 3200, the transistor 3300, and the capacitor 3400. The transistor 3300 and the capacitor 3400 are placed above the transistor 3200. Note that for the transistor 3300, the description of the above transistor 2100 is referred to. Here, as the transistor 2100, the transistor described in Embodiment 1 or 2 may be used as illustrated in FIG. 24 or alternatively, the transistor described in Embodiment 3 or 4 may be used as illustrated in FIG. 25. Furthermore, for the transistor 3200, the description of the transistor 2200 in FIG. 17 is referred to. Note that although the transistor 2200 is illustrated as a p-channel transistor in FIG. 17, the transistor 3200 may be an n-channel transistor.

The transistor 3200 illustrated in FIG. 24 is a transistor using the semiconductor substrate 450. The transistor 3200 includes the region 472a in the semiconductor substrate 450, the region 472b in the semiconductor substrate 450, the insulator 462, and the conductor 454.

The semiconductor device illustrated in FIG. 24 includes the insulator 464, the insulator 466, the insulator 468, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, the insulator 489, the insulator 490, the insulator 491, the insulator 492, the insulator 493, the insulator 494, and the insulator 495.

The insulator 464 is provided over the transistor 3200. The insulator 466 is provided over the insulator 464. The insulator 468 is provided over the insulator 466. The insulator 489 is provided over the insulator 468. The transistor 3300 is provided over the insulator 489. The insulator 493 is provided over the transistor 3300. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 3300, an opening reaching the conductor 476a, and an opening reaching the conductor 476b. In the openings, the conductor 474a, the conductor 474b, and the conductor 474c are embedded.

The conductor 474a may have a function of a bottom gate electrode of the transistor 3300. Alternatively, for example, electrical characteristics such as the threshold voltage of the transistor 3300 may be controlled by application of a constant potential to the conductor 474a. Further alternatively, for example, the conductor 474a and the conductor 504 that is a top gate electrode of the transistor 3300 may be electrically connected to each other. Thus, the on-state current of the transistor 3300 can be increased. A punch-through phenomenon can be suppressed; thus, stable electrical characteristics in a saturation region of the transistor 3300 can be obtained.

The insulator 490 includes an opening reaching the conductor 474b and an opening reaching the conductor 474c. Note that the insulator 490 can be formed using the insulator that is used for the insulator 101 in the above embodiment. The insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 3300.

The insulator 491 includes the opening reaching the conductor 474b and the opening reaching the conductor 474c. Note that the insulator 491 corresponds to the insulator 104 in the above embodiment and thus, the description of the insulator 104 can be referred to for details about the insulator 491.

The insulator 495 includes the opening reaching the conductor 474b through the region 507b that is one of the source and the drain of the transistor 3300, an opening reaching the conductor 514 that overlaps with the region 507a that is the other of the source and the drain of the transistor 3300, with an insulator 511 positioned therebetween, an opening reaching the conductor 504 that is the gate electrode of the transistor 3300, and the opening reaching the conductor 474c through the region 507a that is the other of the source and the drain of the transistor 3300. Note that the insulator 495 corresponds to the insulator 116 in the above embodiment and thus, the description of the insulator 116 can be referred to for details about the insulator 495.

The insulator 493 includes the opening reaching the conductor 474b through the region 507b that is one of the source and the drain of the transistor 3300, the opening reaching the conductor 514 that overlaps with the region 507a that is the other of the source and the drain of the transistor 3300, with the insulator 511 positioned therebetween, the opening reaching the conductor 504 that is the gate electrode of the transistor 3300, and the opening reaching the conductor 474c through the region 507a that is the other of the source and the drain of the transistor 3300. In the openings, the conductor 496a, the conductor 496b, the conductor 496c, and the conductor 496d are embedded. Note that in some cases, an opening provided in a component of the transistor 3300 or the like is positioned between openings provided in other components. Note that the insulator 493 corresponds to the insulator 118 in the above embodiment and thus, the description of the insulator 118 can be referred to for details about the insulator 493.

The insulator 494 includes an opening reaching the conductor 496a, an opening reaching the conductor 496b, and an opening reaching the conductor 496c. In the openings, the conductors 498a, 498b, and 498c are embedded.

At least one of the insulators 464, 466, 468, 489, 493, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The source or drain of the transistor 3200 is electrically connected to the region 507b that is one of the source and the drain of the transistor 3300 through the conductor 480b, the conductor 478b, the conductor 476a, the conductor 474b, and the conductor 496c. The conductor 454 that is the gate electrode of the transistor 3200 is electrically connected to the region 507a that is the other of the source and the drain of the transistor 3300 through the conductor 480c, the conductor 478c, the conductor 476b, the conductor 474c, and the conductor 496d.

The capacitor 3400 includes the region 507a that is the other of the source and the drain of the transistor 3300, the conductor 514, and the insulator 511. Because the insulator 511 can be formed by the same step as the insulator functioning as a gate insulator of the transistor 3300, productivity can be preferably increased in some cases. When a layer formed by the same step as the conductor 504 functioning as the gate electrode of the transistor 3300 is used as the conductor 514, productivity can be preferably increased in some cases.

For the structures of other components, the description of FIG. 17 and the like can be referred to as appropriate.

Figure 26:
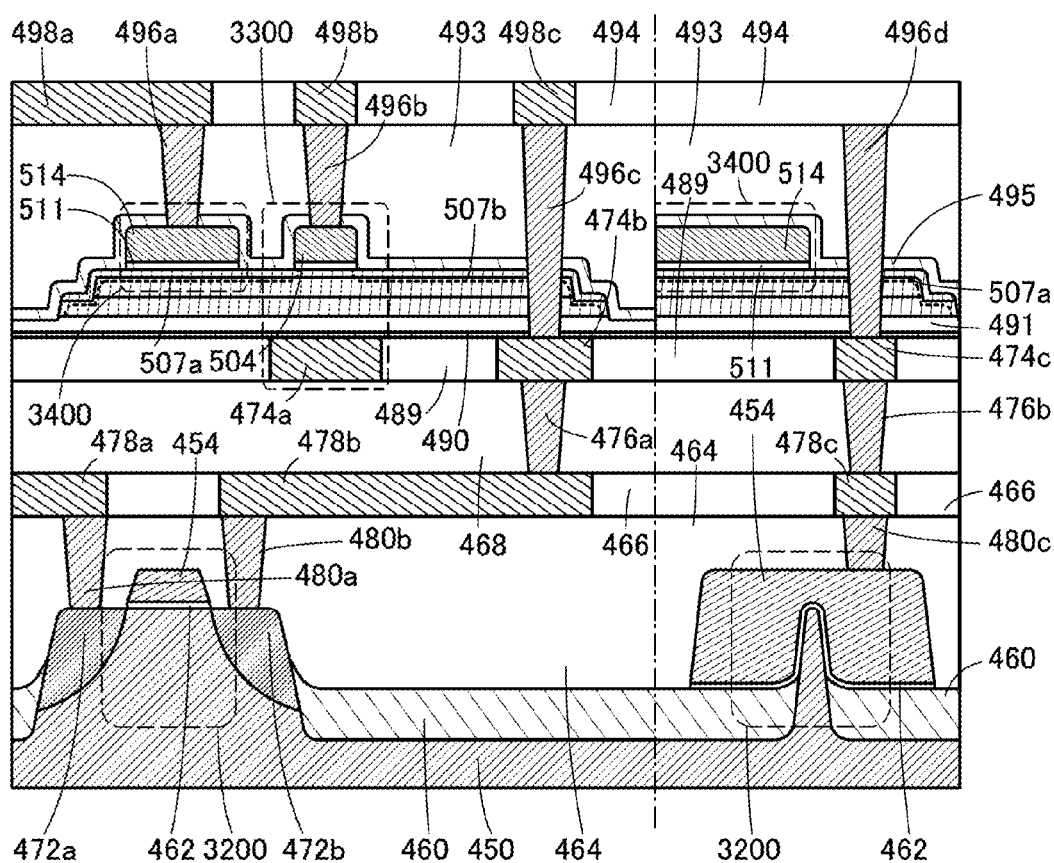
FIG. 26 is a cross-sectional view illustrating a semiconductor device of one embodiment of the present invention.
Figure 27:
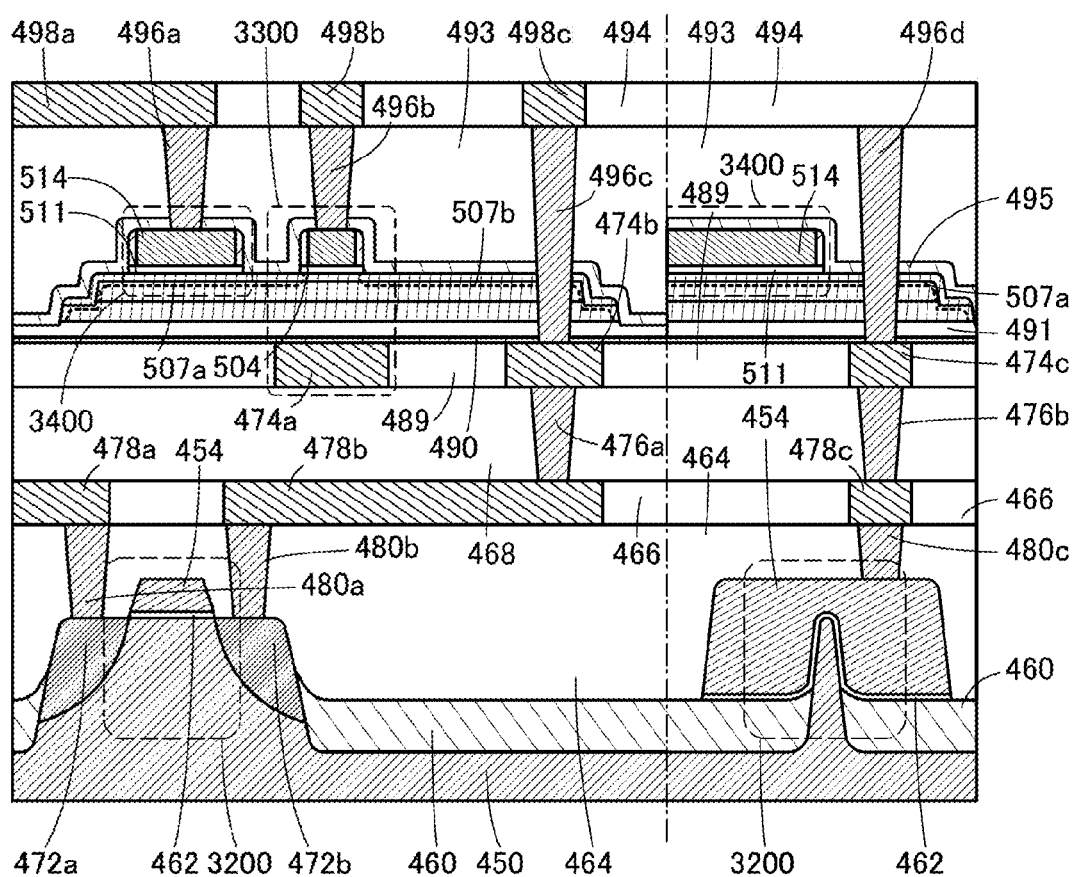
FIG. 27 is a cross-sectional view illustrating a semiconductor device of one embodiment of the present invention.

A semiconductor device in FIG. 26 is the same as the semiconductor device in FIG. 24 except for the structure of the transistor 3200. Note that a semiconductor device in FIG. 27 is the same as the semiconductor device in FIG. 25 except for the structure of the transistor 3200. Therefore, the description of the semiconductor device in FIG. 24 is referred to for the semiconductor devices in FIG. 26 and FIG. 27. Specifically, in the semiconductor devices in FIG. 26 and FIG. 27, the transistor 3200 is a Fin-type transistor. For the Fin-type transistor 3200, the description of the transistor 2200 in FIG. 19 is referred to. Note that although the transistor 2200 is illustrated as a p-channel transistor in FIG. 19, the transistor 3200 may be an n-channel transistor.

Figure 28:
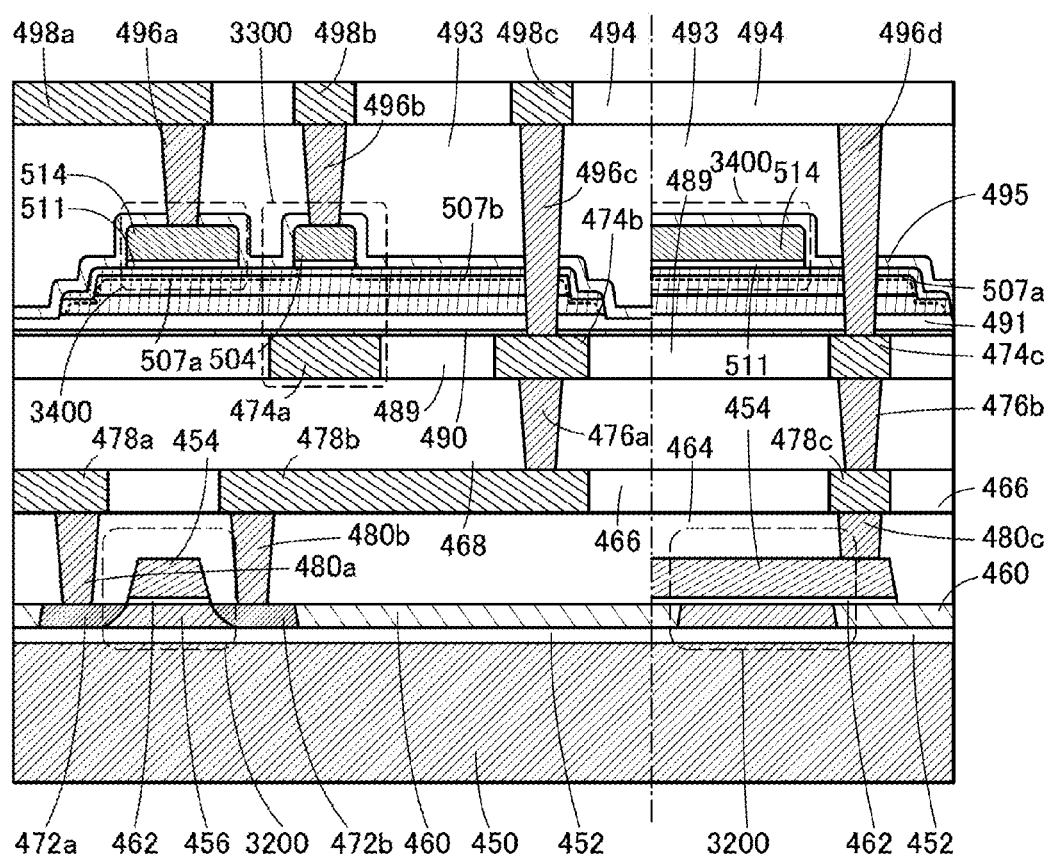
FIG. 28 is a cross-sectional view illustrating a semiconductor device of one embodiment of the present invention.
Figure 29:
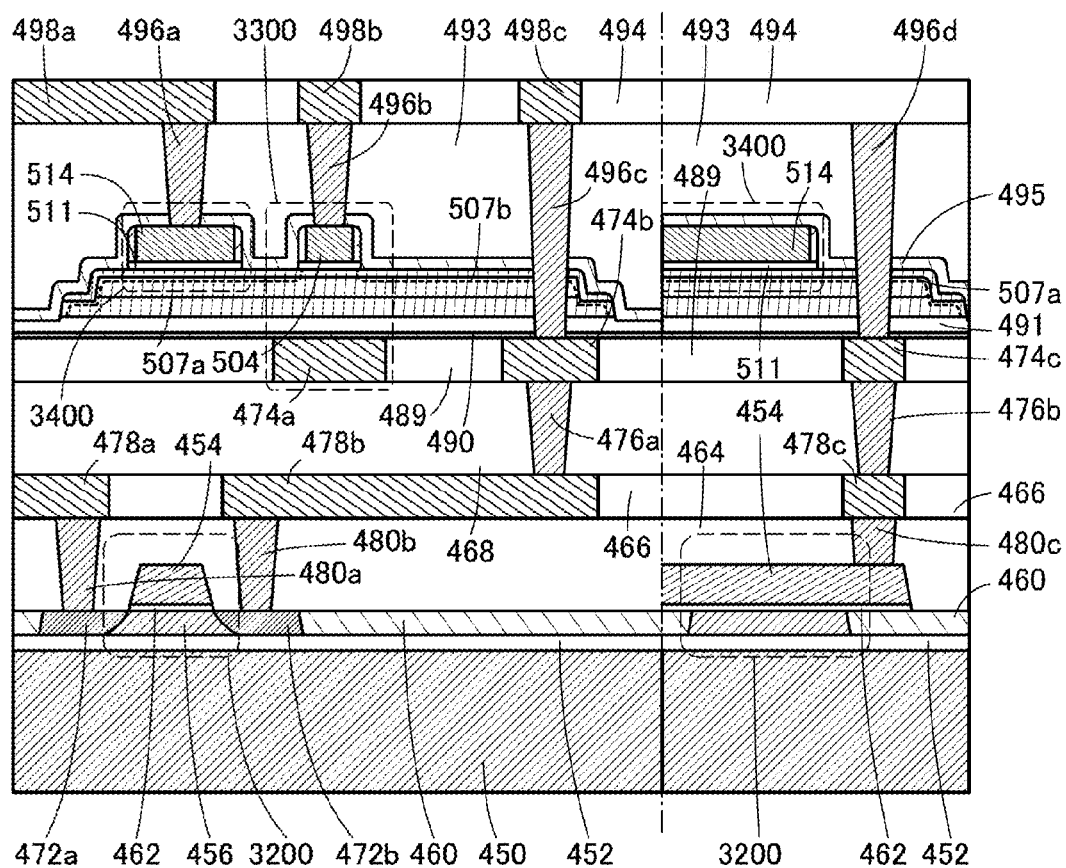
FIG. 29 is a cross-sectional view illustrating a semiconductor device of one embodiment of the present invention.

A semiconductor device in FIG. 28 is the same as the semiconductor device in FIG. 24 except for the structure of the transistor 3200. A semiconductor device in FIG. 29 is the same as the semiconductor device in FIG. 25 except for the structure of the transistor 3200. Therefore, the description of the semiconductor device in FIG. 24 is referred to for the semiconductor devices in FIG. 28 and FIG. 29. Specifically, in the semiconductor devices in FIG. 28 and FIG. 29, the transistor 3200 is provided in the semiconductor substrate 450 that is an SOI substrate. For the transistor 3200, which is provided in the semiconductor substrate 450 (SOI substrate), the description of the transistor 2200 in FIG. 21 is referred to. Note that although the transistor 2200 is illustrated as a p-channel transistor in FIG. 21, the transistor 3200 may be an n-channel transistor.

<Memory Device 2>

The semiconductor device in FIG. 23B is different from the semiconductor device in FIG. 23A in that the transistor 3200 is not provided. In this case, data can be written and retained in a manner similar to that of the semiconductor device in FIG. 23A, too.

Reading of data in the semiconductor device in FIG. 23B is described. When the transistor 3300 is brought into an on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 23A will be described with reference to a circuit diagram in FIG. 30.

Figure 30:
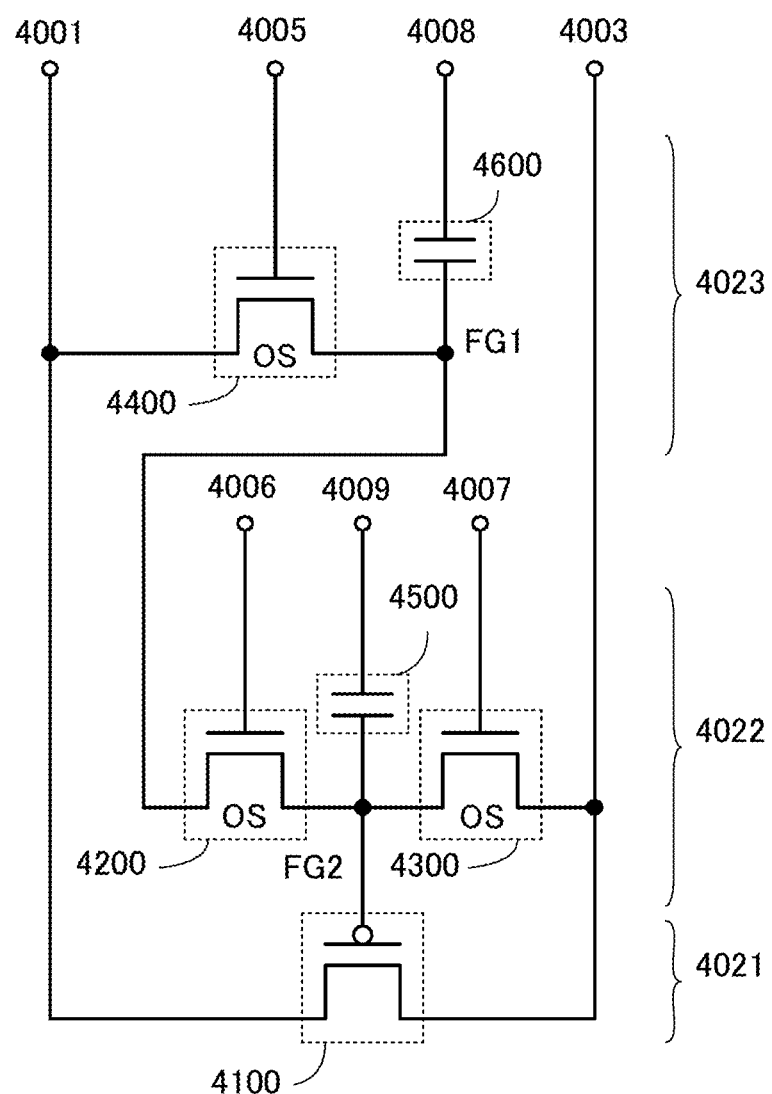
FIG. 30 is a circuit diagram illustrating a semiconductor device of one embodiment of the present invention.

The semiconductor device illustrated in FIG. 30 includes a transistor 4100, a transistor 4200, a transistor 4300, a transistor 4400, a capacitor 4500, and a capacitor 4600. Here, a transistor similar to the transistor 3200 can be used as the transistor 4100, and transistors similar to the transistor 3300 can be used as the transistors 4200, 4300, and 4400. Although not illustrated in FIG. 30, a plurality of semiconductor devices in FIG. 30 are provided in a matrix. The semiconductor devices in FIG. 30 can control writing and reading of a data voltage in accordance with a signal or a potential supplied to a wiring 4001, a wiring 4003, a wiring 4005, a wiring 4006, a wiring 4007, a wiring 4008, and a wiring 4009.

One of a source and a drain of the transistor 4100 is connected to the wiring 4003. The other of the source and the drain of the transistor 4100 is connected to the wiring 4001. Although the transistor 4100 is a p-channel transistor in FIG. 30, the transistor 4100 may be an n-channel transistor.

The semiconductor device in FIG. 30 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200, 4300, and 4400 are n-channel transistors in FIG. 30, the transistors 4200, 4300, and 4400 may be p-channel transistors.

The transistors 4200 and 4300 and the transistor 4400 are preferably provided in different layers even when the transistors 4200, 4300, and 4400 are transistors including oxide semiconductors. In other words, the semiconductor device in FIG. 30 preferably includes, as illustrated in FIG. 30, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 30 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state increases, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between the gate and the source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 30, after data voltages are written to the plurality of data retention portions, the wiring 4009 is set at the high level, so that the potentials of the nodes FG1 and FG2 are increased. Then, the transistors are turned off to stop movement of electric charges; thus, the written data voltages are retained.

By the above-described writing operation of the data voltage to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multilevel data. Therefore, in the case where the data retention portions each retain 4-bit data, 16-value "$V_{D1}-V_{th}$" and 16-value "$V_{D2}-V_{th}$" can be obtained.

Next, operation of reading data from the semiconductor device illustrated in FIG. 30 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$." The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$," by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$." In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$." Thus, the capacitance of the capacitor 4600 is preferably larger than the capacitance of the capacitor 4500. Alternatively, the potential written to the node FG1, "$V_{D1}-V_{th}$," is preferably larger than the potential corresponding to the same data, "$V_{D2}-V_{th}$." By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$." The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$," by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$." In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 30, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled to be read. As a result, the memory capacity per memory cell can be improved and read data can be close to accurate data; thus, the data reliability becomes excellent.

Figure 31:
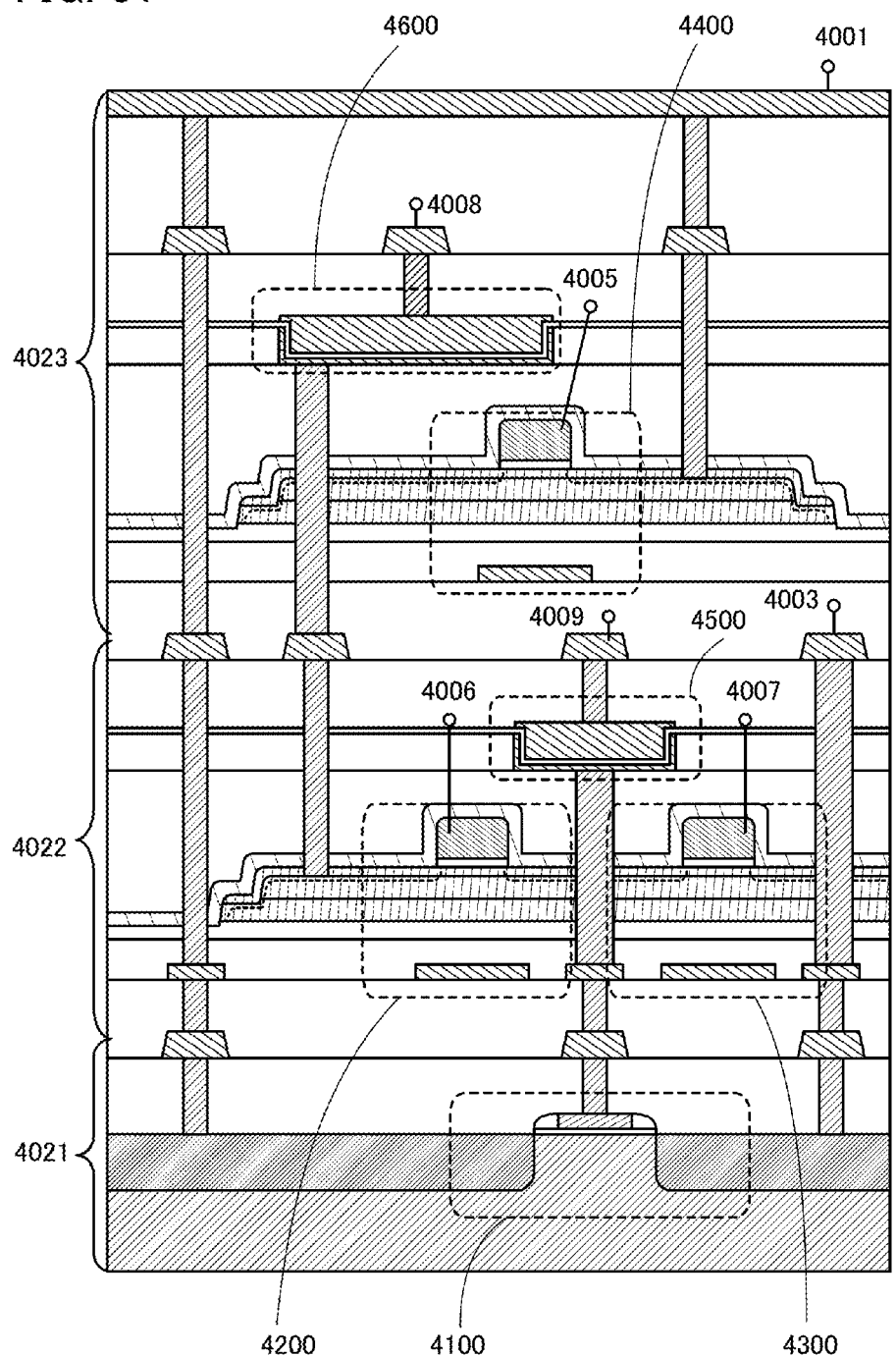
FIG. 31 is a cross-sectional view illustrating a semiconductor device of one embodiment of the present invention.
Figure 32:
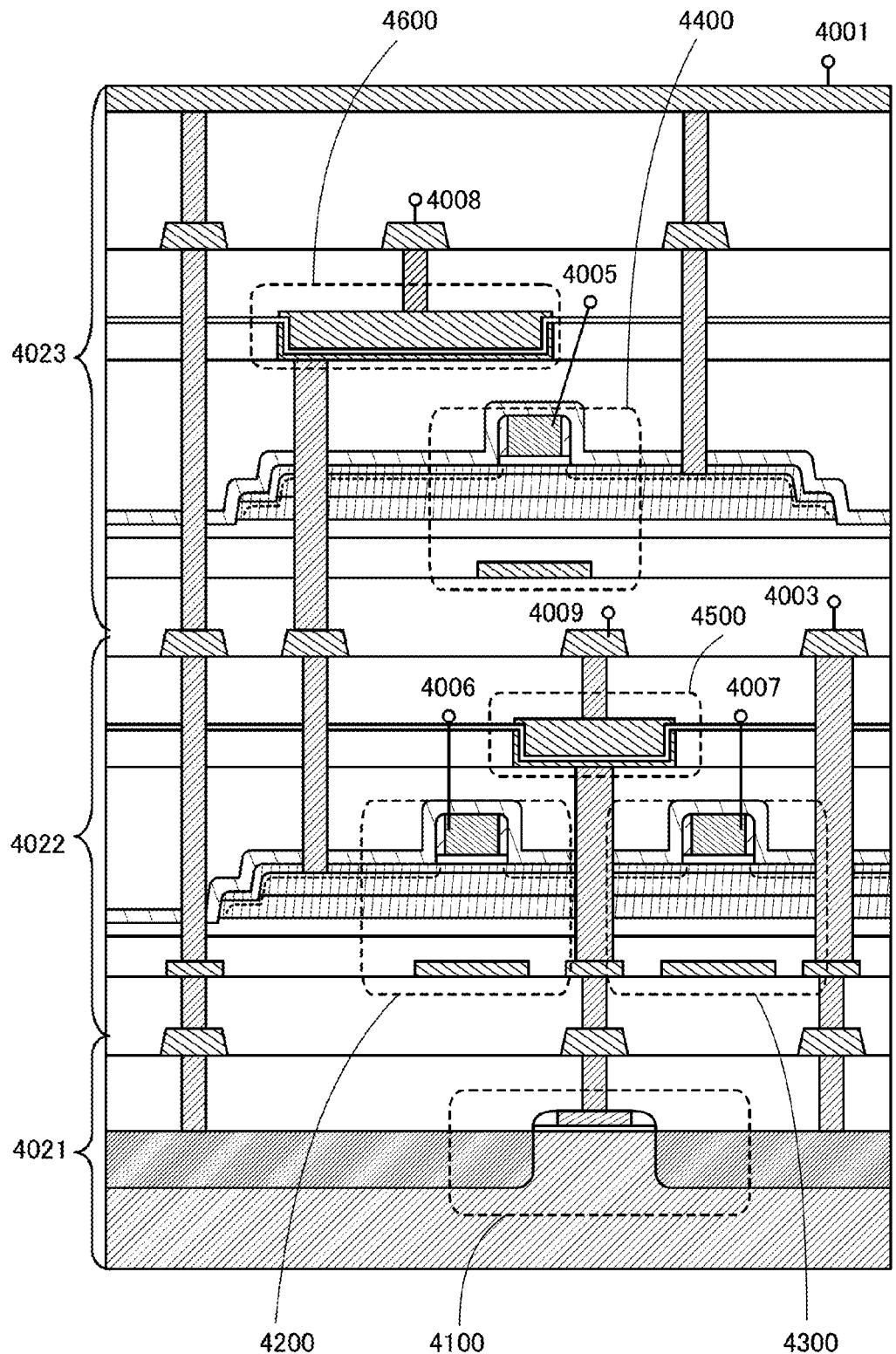
FIG. 32 is a cross-sectional view illustrating a semiconductor device of one embodiment of the present invention.

FIG. 31 is a cross-sectional view of the semiconductor device of FIG. 30. The semiconductor device illustrated in FIG. 31 includes the transistors 4100, 4200, 4300, and 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023. In the semiconductor device illustrated in FIG. 31, the transistor described in Embodiment 1 or 2 is used as each of the transistors 4200, 4300, and 4400. As illustrated in FIG. 32, the transistor described in Embodiment 3 or 4 may be used as each of the transistors 4200, 4300, and 4400.

Here, the description of the transistor 3300 can be referred to for the transistors 4200 to 4400, and the description of the transistor 3200 can be referred to for the transistor 4100. The description made with reference to FIG. 24 can be appropriately referred to for other wirings, other insulators, and the like.

Note that the capacitors 4500 and 4600 are formed by including the conductive layers each having a trench-like shape, while the conductive layer of the capacitor 3400 in the semiconductor device in FIG. 24 is parallel to the substrate. With this structure, a larger capacity can be obtained without increasing the occupation area.

The structure and method described in this embodiment can be implemented by being combined as appropriate with any of the structures and methods described in the other embodiments.

Embodiment 7

In this embodiment, an example of an imaging device including the transistor or the like of one embodiment of the present invention will be described.

<Configuration of Imaging Device>

Figure 33A:
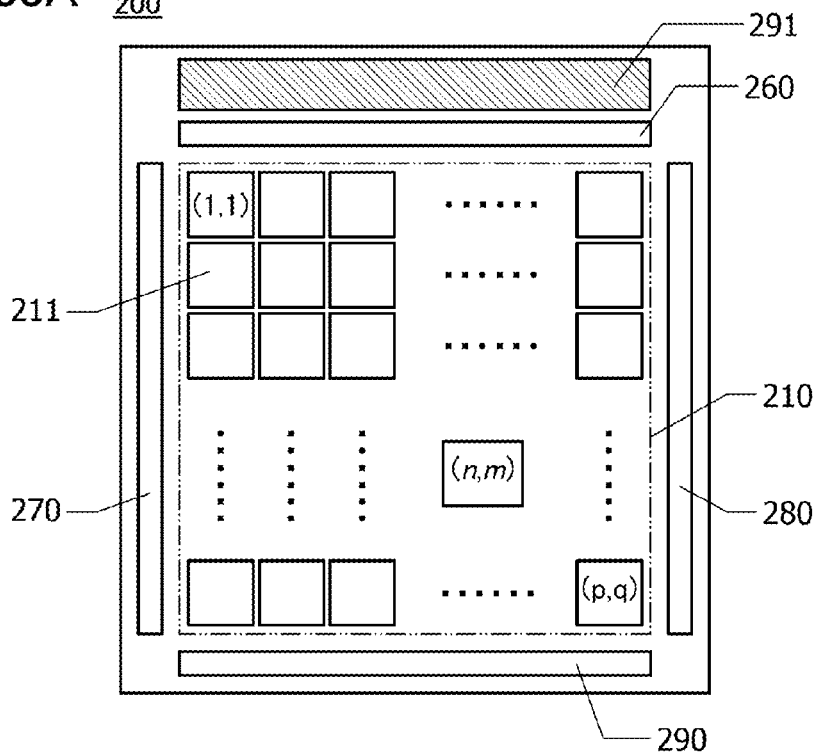
FIGS. 33A and 33B are top views each illustrating a semiconductor device of one embodiment of the present invention.

FIG. 33A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 33B:
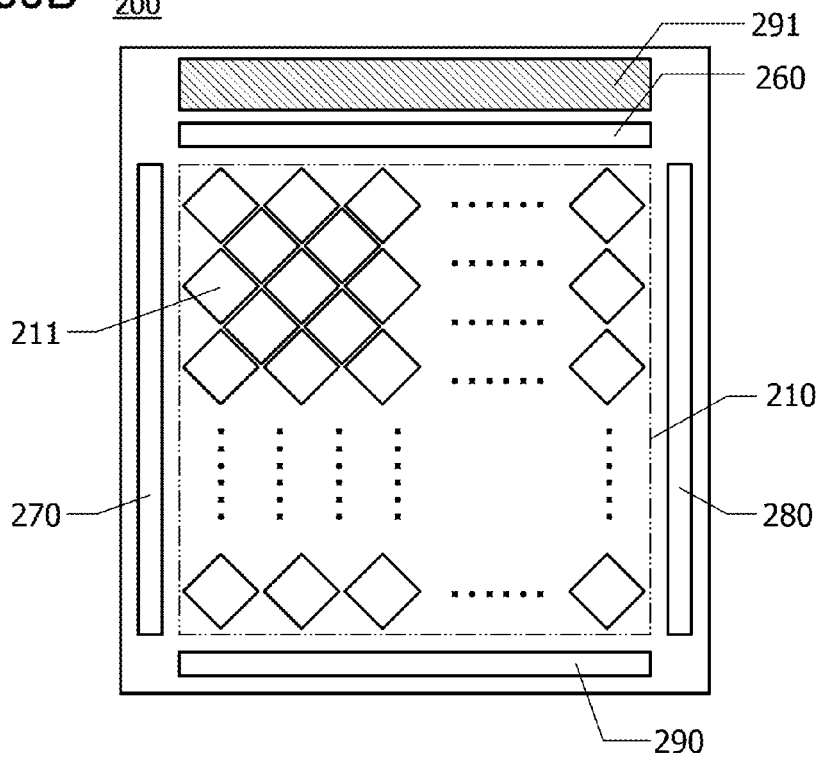

As illustrated in FIG. 33B, the pixels 211 may be obliquely arranged in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

Configuration Example 1 of Pixel

The pixel 211 included in the imaging device 200 is formed with a plurality of subpixels 212, and each subpixel 212 is combined with a filter (color filter) which transmits light in a specific wavelength range, whereby data for achieving color image display can be obtained.

Figure 34A:
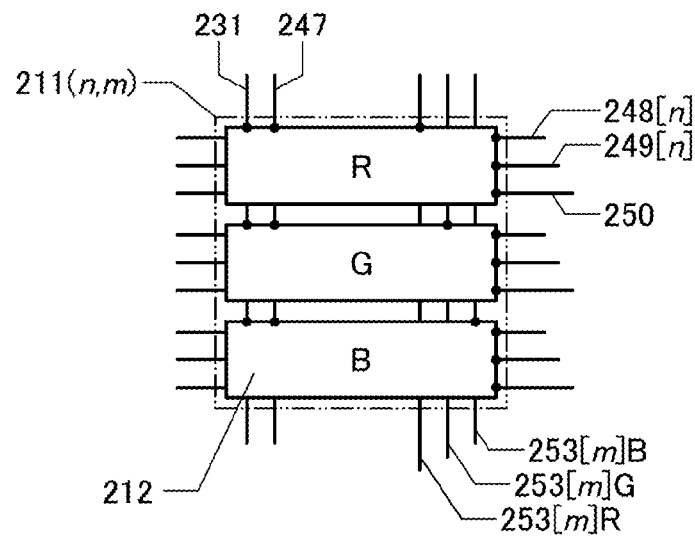
FIGS. 34A and 34B are block diagrams each illustrating a semiconductor device of one embodiment of the present invention.

FIG. 34A is a top view showing an example of the pixel 211 with which a color image is obtained. The pixel 211 illustrated in FIG. 34A includes a subpixel 212 provided with a color filter that transmits light in a red (R) wavelength range (also referred to as a subpixel 212R), a subpixel 212 provided with a color filter that transmits light in a green (G) wavelength range (also referred to as a subpixel 212G), and a subpixel 212 provided with a color filter that transmits light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n], respectively. For example, the wiring 253 connected to the pixel 211 in the m-th column is referred to as a wiring 253[m]. Note that in FIG. 34A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B, respectively. The subpixels 212 are electrically connected to the peripheral circuit through the above wirings.

Figure 34B:
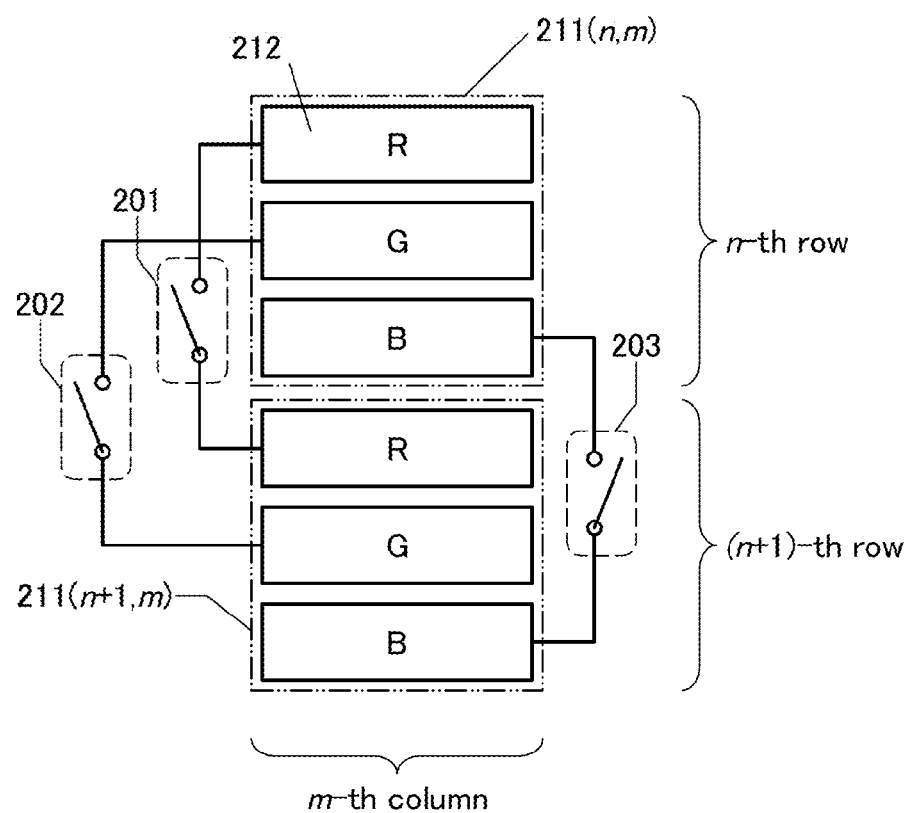

The imaging device 200 has a structure in which the subpixel 212 is electrically connected to the subpixel 212 in an adjacent pixel 211 which is provided with a color filter transmitting light in the same wavelength range as the subpixel 212, via a switch. FIG. 34B shows a connection example of the subpixels 212: the subpixel 212 in the pixel 211 arranged in the n-th (n is an integer greater than or equal to 1 and less than or equal to p) row and the m-th (m is an integer greater than or equal to 1 and less than or equal to q) column and the subpixel 212 in the adjacent pixel 211 arranged in an (n+1)-th row and the m-th column. In FIG. 34B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 34A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) may be set at red:green:blue=1:6:1.

Although the number of the subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 35A and 35B. With the lens 255, the photoelectric conversion element can receive incident light efficiently. Specifically, as illustrated in FIG. 35A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed-two dotted lines, however, part of the light 256 indicated by arrows might be blocked by some wirings 257. Thus, a preferable structure is such that the lens 255 and the filter 254 are provided on the photoelectric conversion element 220 side as illustrated in FIG. 35B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 35A:
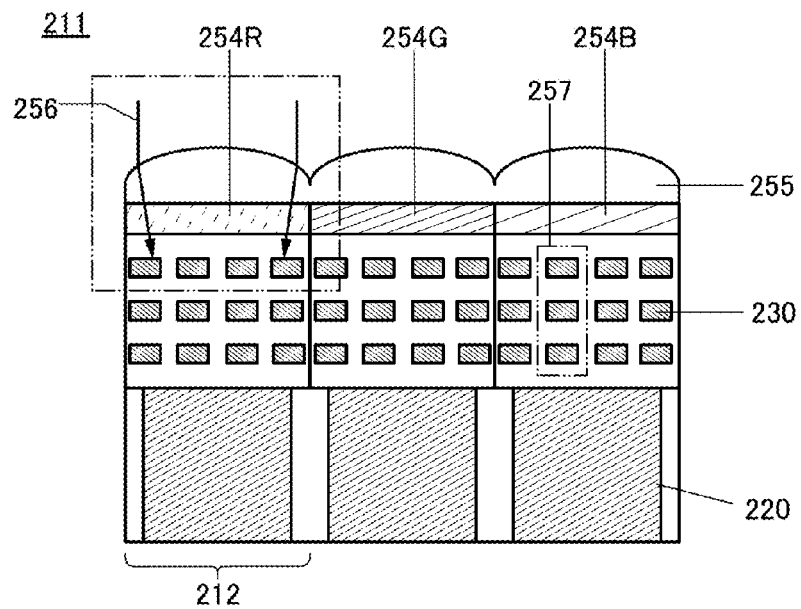
FIGS. 35A and 35B are cross-sectional views each illustrating a semiconductor device of one embodiment of the present invention.
Figure 35B:
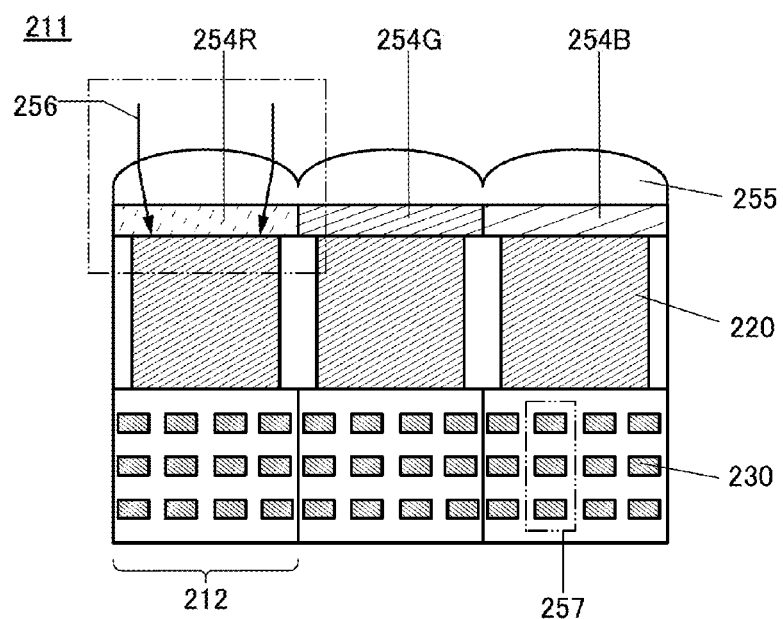

As the photoelectric conversion element 220 illustrated in FIGS. 35A and 35B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 34A and 34B.

Configuration Example 2 of Pixel

An example of a pixel including a transistor using silicon and a transistor using an oxide semiconductor will be described below.

Figure 36A:
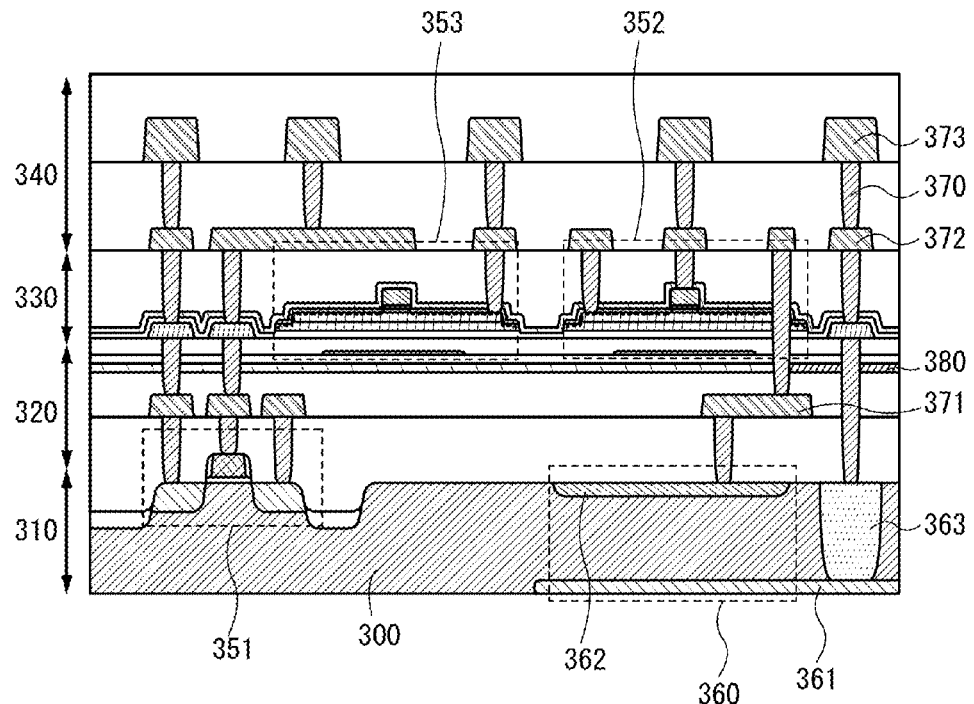
FIGS. 36A and 36B are cross-sectional views each illustrating a semiconductor device of one embodiment of the present invention.
Figure 36B:
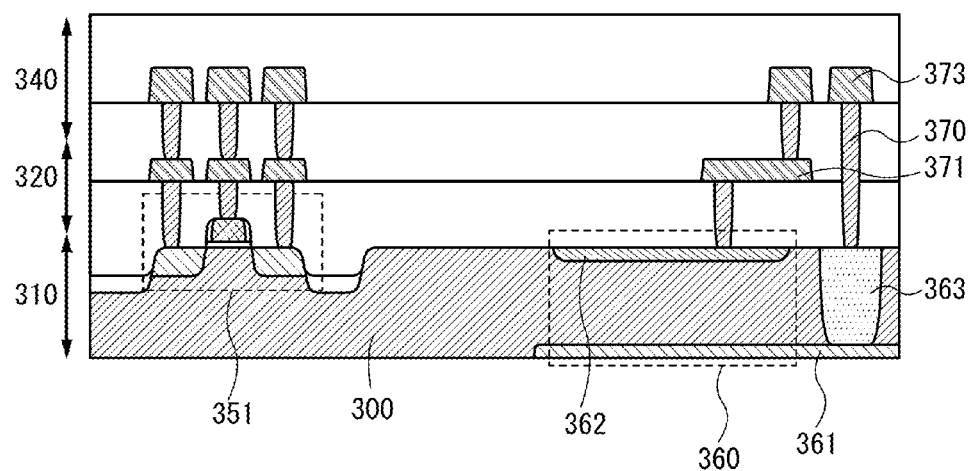
Figure 37:
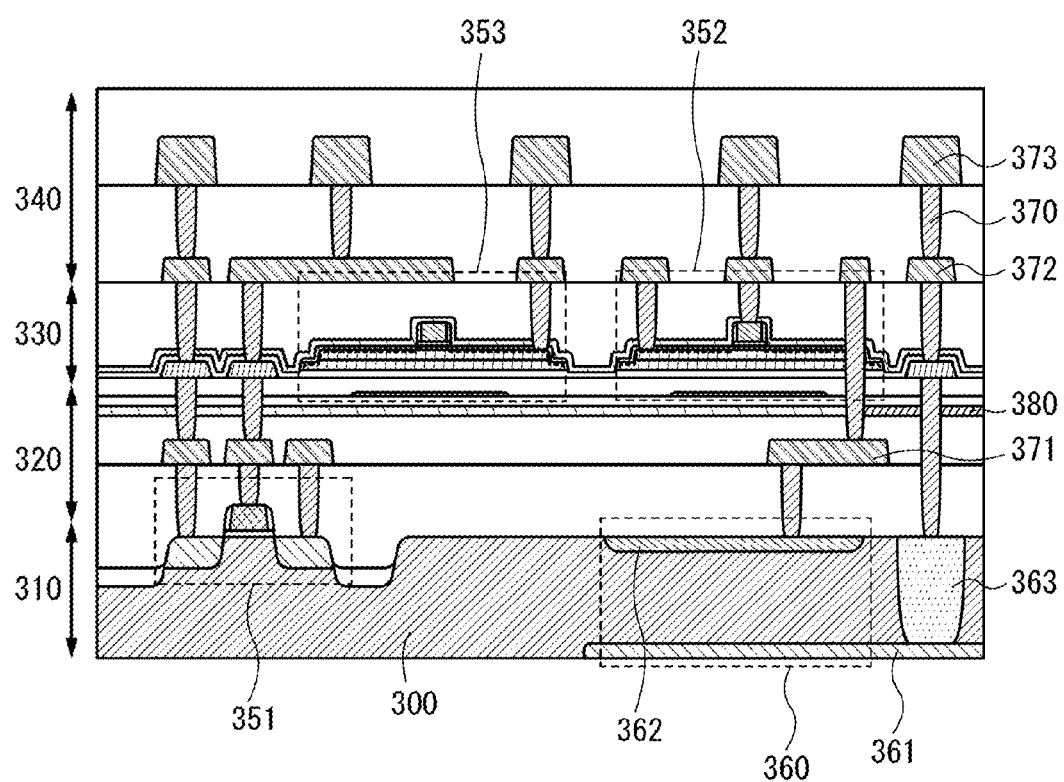
FIG. 37 is a cross-sectional view illustrating a semiconductor device of one embodiment of the present invention.

FIGS. 36A and 36B are each a cross-sectional view of an element included in an imaging device. The imaging device illustrated in FIG. 36A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363. Note that as the transistors 352 and 353 which include an oxide semiconductor, the transistor described in Embodiment 1 or 2 may be used as illustrated in FIG. 36A or alternatively, the transistor described in Embodiment 3 or 4 may be used as illustrated in FIG. 37.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 36A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted to form a pixel with use of only transistors using an oxide semiconductor.

In the case where a pixel is formed with use of only transistors using silicon, the layer 330 may be omitted. An example of a cross-sectional view in which the layer 330 is not provided is shown in FIG. 36B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 36A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 38A1 and FIG. 38B1, part or the whole of the imaging device can be bent. FIG. 38A1 illustrates a state in which the imaging device is bent in the direction of a dashed-dotted line X1-X2. FIG. 38A2 is a cross-sectional view illustrating a portion indicated by the dashed-dotted line X1-X2 in FIG. 38A1. FIG. 38A3 is a cross-sectional view illustrating a portion indicated by a dashed-dotted line Y1-Y2 in FIG. 38A1.

FIG. 38B1 illustrates a state where the imaging device is bent in the direction of a dashed-dotted line X3-X4 and the direction of a dashed-dotted line Y3-Y4. FIG. 38B2 is a cross-sectional view illustrating a portion indicated by the dashed-dotted line X3-X4 in FIG. 38B1. FIG. 38B3 is a cross-sectional view illustrating a portion indicated by the dashed-dotted line Y3-Y4 in FIG. 38B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

The structures described in this embodiment can be used in appropriate combination with any of the structures described in the other embodiments.

Embodiment 8

In this embodiment, examples of CPUs including semiconductor devices such as the transistor of one embodiment of the present invention and the above-described memory device will be described.

<Configuration of CPU>

Figure 39:
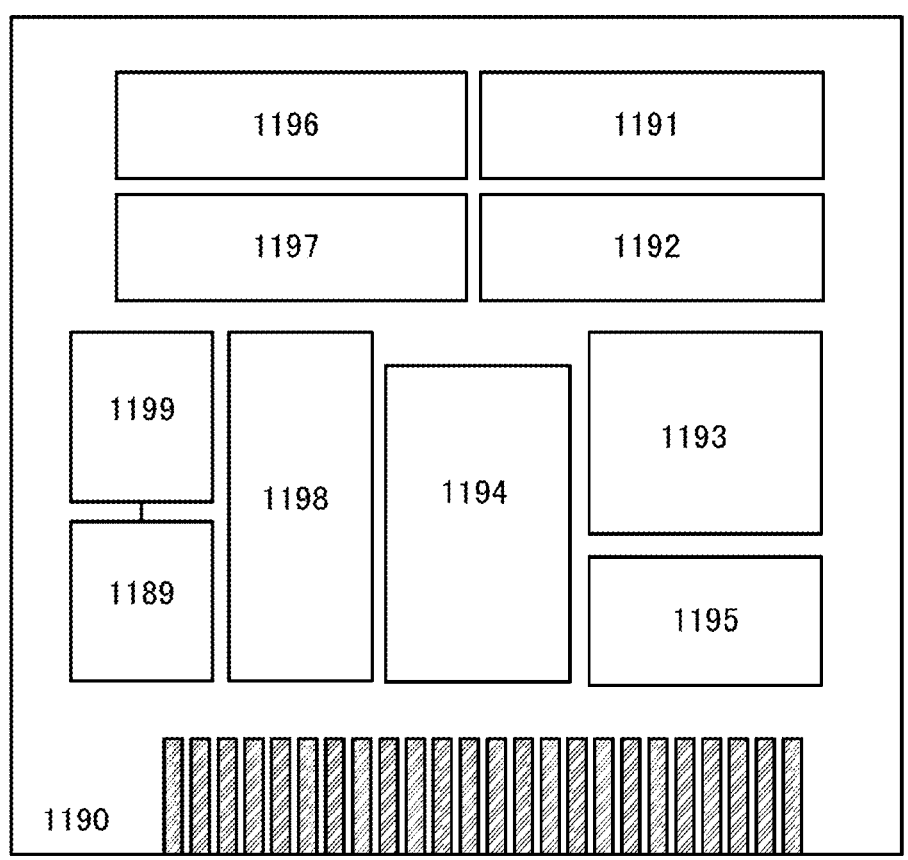
FIG. 39 is a block diagram illustrating a semiconductor device of one embodiment of the present invention.

FIG. 39 is a block diagram illustrating a configuration example of a CPU including any of the above-described transistors as a component.

The CPU illustrated in FIG. 39 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 39 is just an example in which the configuration has been simplified, and an actual CPU may have a variety of configurations depending on the application. For example, the CPU may have the following configuration: a structure including the CPU illustrated in FIG. 39 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 39, a memory cell is provided in the register 1196. For the memory cell of the register 1196, any of the above-described transistors, the above-described memory device, or the like can be used.

In the CPU illustrated in FIG. 39, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 40:
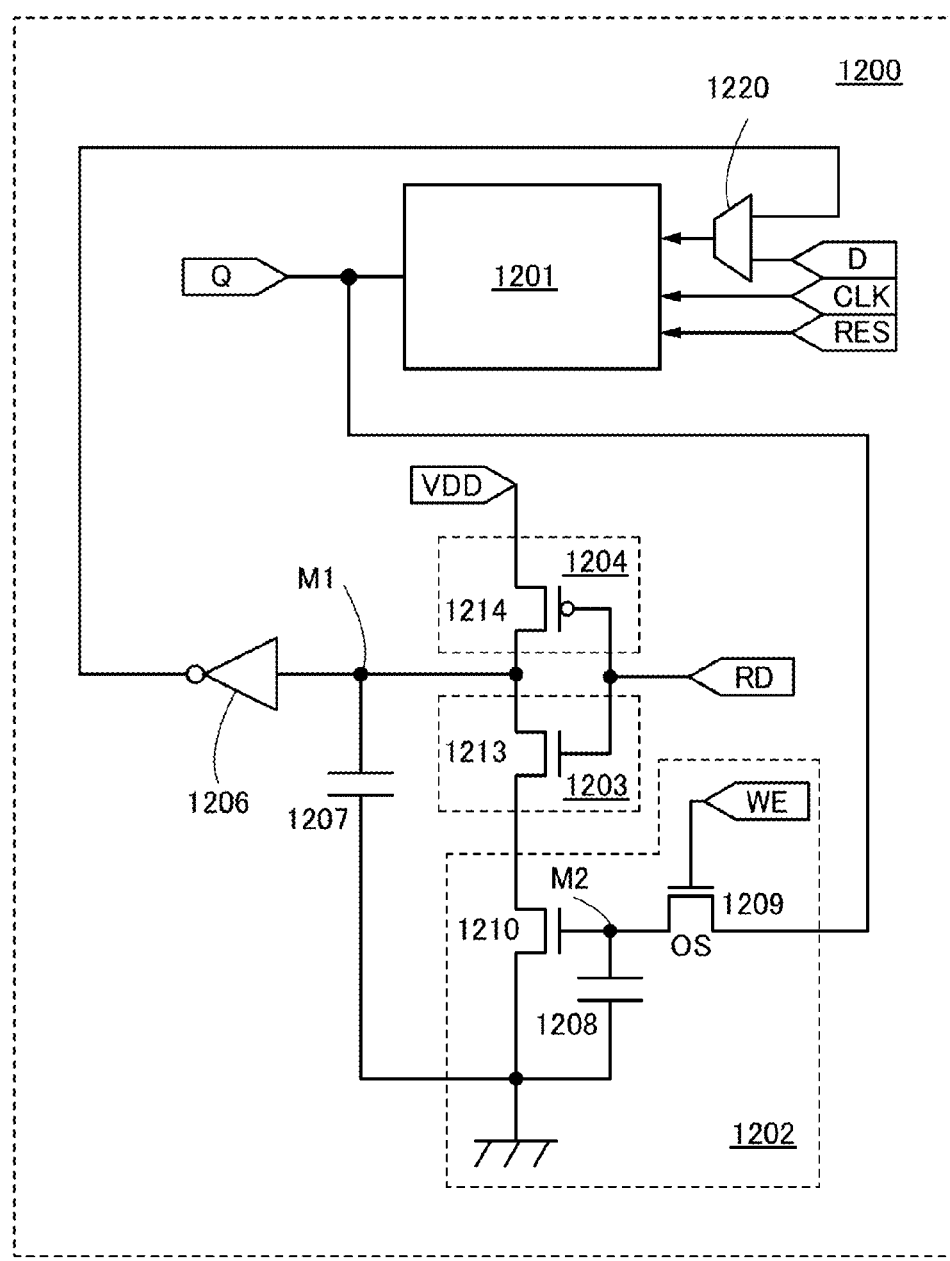
FIG. 40 is a circuit diagram illustrating a semiconductor device of one embodiment of the present invention.

FIG. 40 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 40 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 40, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 40, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 40, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP) or a custom LSI, and a radio frequency (RF) device. The memory element 1200 can also be used in an LSI such as a programmable logic circuit (or a programmable logic device: PLD) including a field programmable gate array (FPGA) or a complex programmable logic device (CPLD).

The structures described in this embodiment can be used in appropriate combination with any of the structures described in the other embodiments.

Embodiment 9

In this embodiment, display devices each including the transistor or the like of one embodiment of the present invention will be described with reference to FIGS. 41A to 41C, FIGS. 42A and 42B, and FIGS. 43A and 43B.

<Configuration of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 41A:
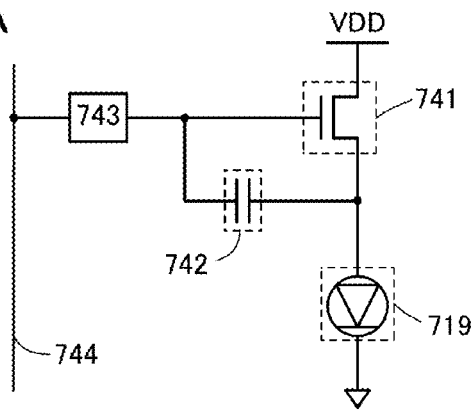
FIGS. 41A to 41C are a circuit diagram, a top view, and a cross-sectional view illustrating a semiconductor device of one embodiment of the present invention.
Figure 41B:
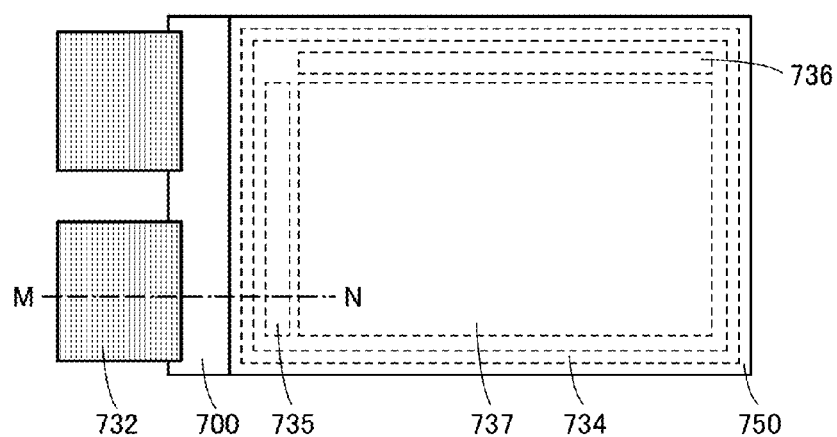
Figure 41C:
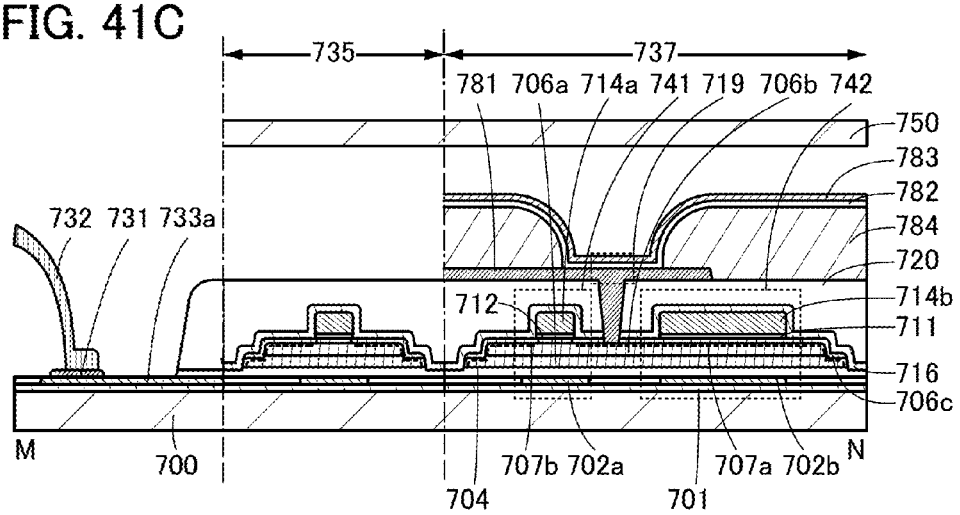

FIGS. 41A to 41C illustrate an example of an EL display device of one embodiment of the present invention. FIG. 41A is a circuit diagram of a pixel in an EL display device. FIG. 41B is a plan view showing the whole of the EL display device. FIG. 41C is a cross-sectional view taken along part of dashed-dotted line M-N in FIG. 41B.

FIG. 41A is an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 41A includes a switching element 743, a transistor 741, a capacitor 742, and a light-emitting element 719.

Note that FIG. 41A and the like each illustrate an example of a circuit structure; therefore, a transistor can be provided additionally. In contrast, for each node in FIG. 41A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 41B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 41C is a cross-sectional view of the EL display device taken along part of dashed-dotted line M-N in FIG. 41B.

Figure 43A:
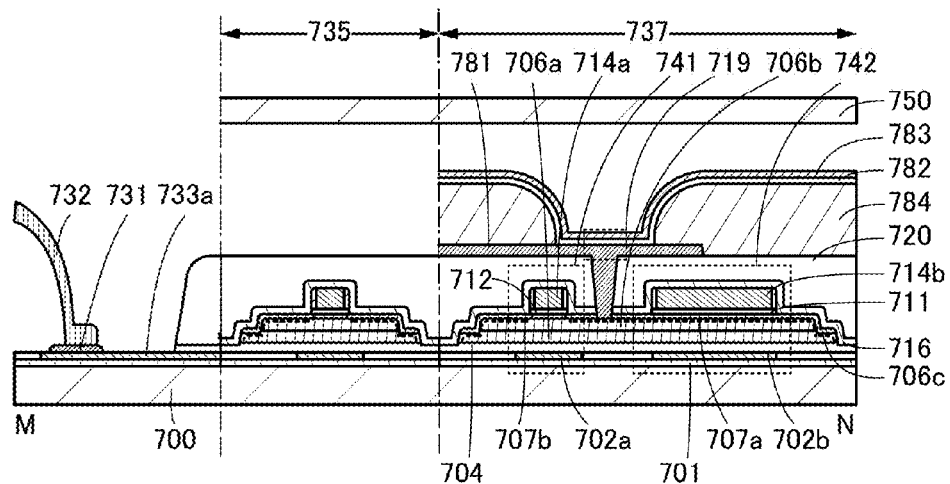
FIGS. 43A and 43B are cross-sectional views each illustrating a semiconductor device of one embodiment of the present invention.

FIG. 41C illustrates the transistor 741 that includes an insulator 701 over the substrate 700, a conductor 702a over the insulator 701, an insulator 704 over the conductor 702a, an insulator 706a provided over the insulator 704 and overlapping with the conductor 702a, a semiconductor 706b over the insulator 706a, an insulator 706c over the semiconductor 706b, a region 707a and a region 707b provided in the insulator 706c and the semiconductor 706b, an insulator 712 over the insulator 706c, a conductor 714a over the insulator 712, and an insulator 716 over the insulator 706c and the conductor 714a. Note that the structure of the transistor 741 is just an example; the transistor 741 may have a structure different from that illustrated in FIG. 41C. For example, as the transistor 741, the transistor described in Embodiment 1 or 2 may be used as illustrated in FIG. 41C or alternatively, the transistor described in Embodiment 3 or 4 may be used as illustrated in FIG. 43A.

Thus, in the transistor 741 illustrated in FIG. 41C, the conductor 702a functions as a gate electrode, the insulator 712 functions as a gate insulator, the region 707a functions as a source, the region 707b functions as a drain, the insulator 712 functions as a gate insulator, and the conductor 714a functions as a gate electrode. Note that in some cases, electrical characteristics of the semiconductor 706b change if light enters the semiconductor 706b. To prevent this, it is preferable that one or more of the conductor 702a and the conductor 714a have a light-blocking property.

FIG. 41C illustrates the capacitor 742 that includes a conductor 702b over the insulator 701, the insulator 704 over the conductor 702b, the region 707a provided over the insulator 704 and overlapping with the conductor 702b, an insulator 711 over the region 707a, and a conductor 714b provided over the insulator 711 and overlapping with the region 707a.

In the capacitor 742, each of the conductor 702b and the conductor 714b functions as one electrode, and the region 707a functions as the other electrode.

Thus, the capacitor 742 can be formed using a film of the transistor 741. The conductor 702a and the conductor 702b are preferably conductors of the same kind, in which case the conductor 702a and the conductor 702b can be formed through the same step. Furthermore, the conductor 714a and the conductor 714b are preferably conductors of the same kind, in which case the conductor 714a and the conductor 714b can be formed through the same step. The insulator 712 and the insulator 711 are preferably insulators of the same kind, in which case the insulator 712 and the insulator 711 can be formed through the same step.

The capacitor 742 illustrated in FIG. 41C has a large capacitance per area occupied by the capacitor. Therefore, the EL display device illustrated in FIG. 41C has high display quality.

An insulator 720 is provided over the transistor 741 and the capacitor 742. Here, the insulator 716 and the insulator 720 may have an opening portion reaching the region 707a that serves as the source of the transistor 741. A conductor 781 is provided over the insulator 720. The conductor 781 is electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

So far, examples of the EL display device are described. Next, an example of a liquid crystal display device is described.

Figure 42A:
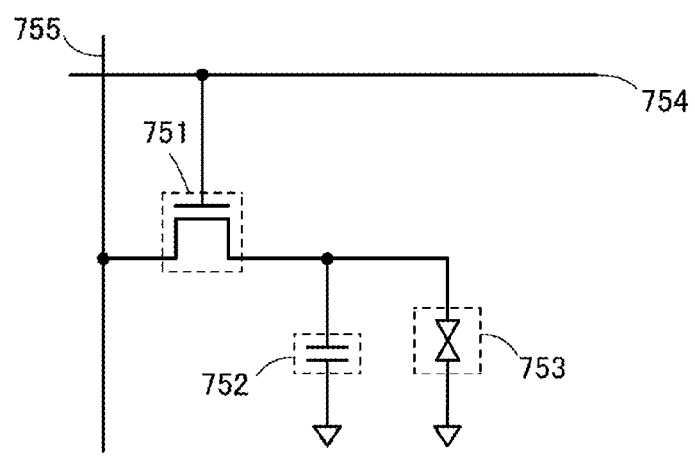
FIGS. 42A and 42B are a circuit diagram and a cross-sectional view illustrating a semiconductor device of one embodiment of the present invention.

FIG. 42A is a circuit diagram illustrating a configuration example of a pixel of a liquid crystal display device. A pixel shown in FIGS. 42A and 42B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 42B:
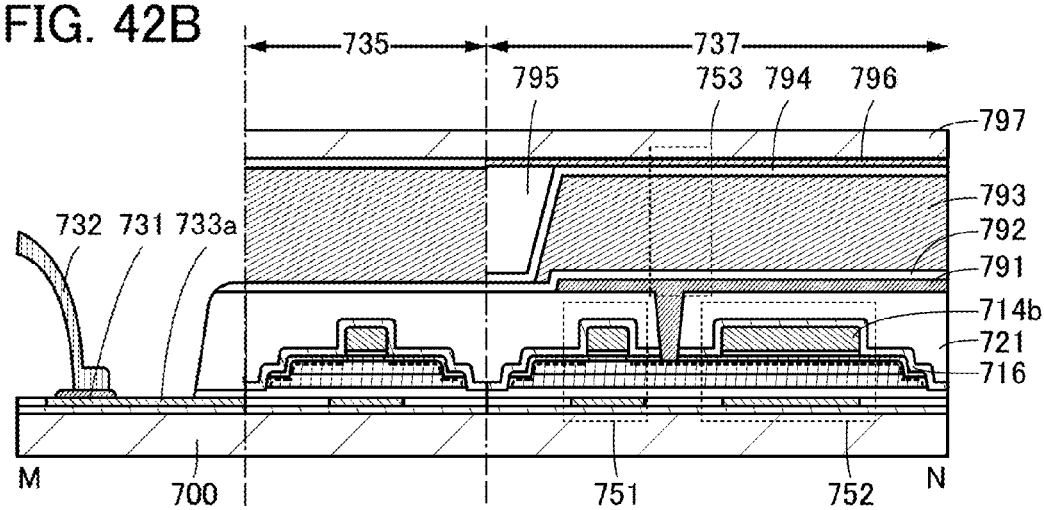

Note that the description of the liquid crystal display device is made on the assumption that the plan view of the liquid crystal display device is similar to that of the EL display device. FIG. 42B is a cross-sectional view of the liquid crystal display device taken along dashed-dotted line M-N in FIG. 41B. In FIG. 42B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

Figure 43B:
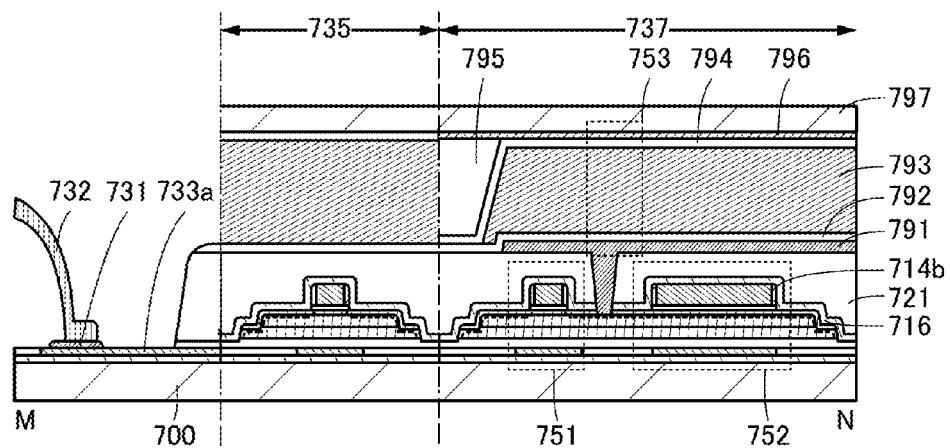

For the transistor 751, the description of the transistor 741 is referred to. As in the case of the transistor 741, as the transistor 751, the transistor described in Embodiment 1 or 2 may be used as illustrated in FIG. 42B or alternatively, the transistor described in Embodiment 3 or 4 may be used as illustrated in FIG. 43B. For the capacitor 752, the description of the capacitor 742 is referred to. Note that the structure of the capacitor 752 in FIG. 42B corresponds to, but is not limited to, the structure of the capacitor 742 in FIG. 41C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly, a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, an ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structures described in this embodiment can be used in appropriate combination with any of the structures described in the other embodiments.

Embodiment 10

In this embodiment, electronic devices each including the transistor or the like of one embodiment of the present invention will be described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 44A to 44F illustrate specific examples of these electronic devices.

Figure 44A:
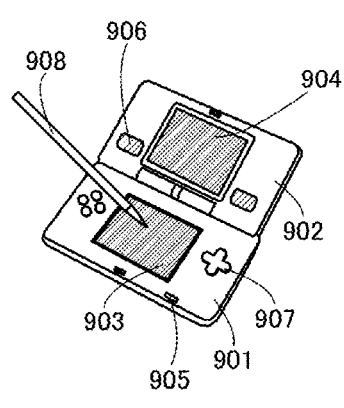
FIGS. 44A to 44F are perspective views each illustrating an electronic device of one embodiment of the present invention.

FIG. 44A illustrates a portable game console including a housing 901, a housing 902, a display portion 903, a display portion 904, a microphone 905, a speaker 906, an operation key 907, a stylus 908, and the like. Although the portable game console in FIG. 44A has the two display portions 903 and 904, the number of display portions included in a portable game console is not limited to this.

Figure 44B:
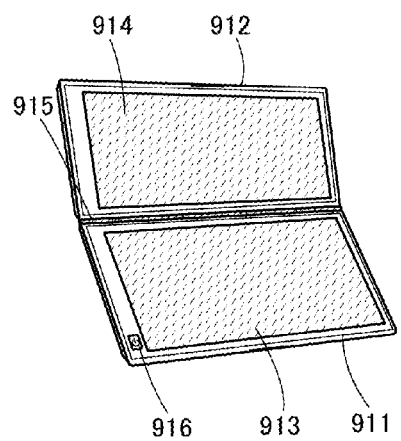

FIG. 44B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 44C:
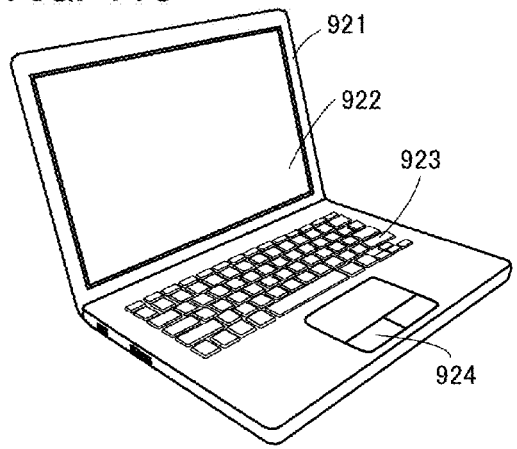

FIG. 44C illustrates a notebook personal computer, which includes a housing 921, a display portion 922, a keyboard 923, a pointing device 924, and the like.

Figure 44D:
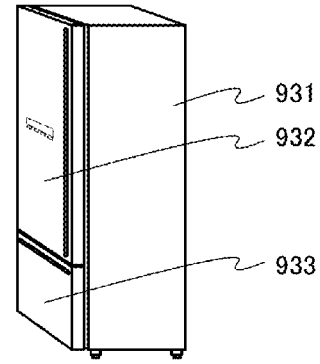

FIG. 44D illustrates an electric refrigerator-freezer, which includes a housing 931, a door for a refrigerator 932, a door for a freezer 933, and the like.

Figure 44E:
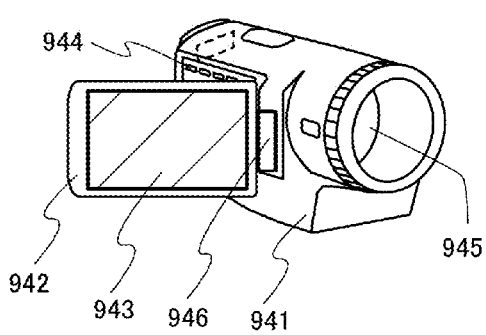

FIG. 44E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 44F:
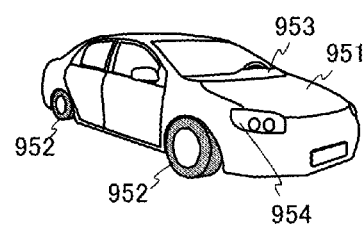

FIG. 44F illustrates a car including a car body 951, wheels 952, a dashboard 953, lights 954, and the like.

The structures described in this embodiment can be used in appropriate combination with any of the structures described in the other embodiments.

Embodiments of the present invention have been described in the above embodiments. Note that one embodiment of the present invention is not limited to these. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

This application is based on Japanese Patent Application serial no. 2015-056580 filed with Japan Patent Office on Mar. 19, 2015, and Japanese Patent Application serial no. 2015-056585 filed with Japan Patent Office on Mar. 19, 2015 the entire contents of which are hereby incorporated by reference.

What is claimed is:

1. A semiconductor device comprising:
a first insulator;
an oxide semiconductor over the first insulator;
a second insulator over the oxide semiconductor;
a third insulator over the second insulator;
a first conductor over the third insulator;
a fourth insulator over the first conductor, the fourth insulator in contact with a top surface of the second insulator and a side surface of the second insulator,
a fifth insulator between a substrate and the first insulator; and
a second conductor between the substrate and the fifth insulator,
wherein the oxide semiconductor overlaps the second conductor with the fifth insulator and the first insulator between the second conductor and the oxide semiconductor,
wherein the first conductor overlaps the oxide semiconductor with the second insulator and the third insulator between the oxide semiconductor and the first conductor, and
wherein a periphery of the first insulator and a periphery of the second insulator are located outside a periphery of the oxide semiconductor in a top view.

2. The semiconductor device according to claim 1,
wherein the fourth insulator comprises a first element,
wherein the second insulator comprises a first region, a second region and a third region,
wherein the first region and the first conductor overlap each other,
wherein the second region and a first edge of the first conductor overlap each other,
wherein the third region and a second edge of the first conductor overlap each other, and
wherein each of the second region and the third region has a higher concentration of the first element than the first region.

3. The semiconductor device according to claim 2, wherein the first element is one selected from the group consisting of aluminum, boron, magnesium, silicon, titanium, vanadium, chromium, nickel, zinc, gallium, germanium, yttrium, zirconium, niobium, molybdenum, indium, tin, lanthanum, cerium, neodymium, hafnium, tantalum and tungsten.

4. The semiconductor device according to claim 1,
wherein the oxide semiconductor comprises oxygen and a second element, and
wherein one of the first insulator and the second insulator comprises oxygen and the second element.

5. The semiconductor device according to claim 4, wherein the second element is gallium.

6. The semiconductor device according to claim 1,
wherein the fifth insulator comprises a projection, and
wherein a periphery of the projection of the fifth insulator is located inside the periphery of the oxide semiconductor in the top view.

7. A semiconductor device comprising:
a first insulator;
an oxide semiconductor over the first insulator;
a second insulator over the oxide semiconductor;
a third insulator over the second insulator;
a first conductor over the third insulator;
a fourth insulator in contact with each of a side surface of the first conductor and a top surface of the third insulator;
a fifth insulator over the first conductor and the fourth insulator, the fifth insulator in contact with a top surface of the second insulator and a side surface of the second insulator,
a sixth insulator between a substrate and the first insulator; and
a second conductor between the substrate and the sixth insulator,
wherein the oxide semiconductor overlaps the second conductor with the sixth insulator and the first insulator between the second conductor and the oxide semiconductor,
wherein the first conductor overlaps the oxide semiconductor with the second insulator and the third insulator between the oxide semiconductor and the first conductor, and
wherein each of a periphery of the first insulator and a periphery of the second insulator is located outside a periphery of the oxide semiconductor in a top view.

8. The semiconductor device according to claim 7,
wherein the fifth insulator comprises a first element,
wherein the second insulator comprises a first region, a second region and a third region,
wherein the first conductor or the fourth insulator overlaps the first region,
wherein the second region and a first edge of the first conductor overlap each other,
wherein the third region and a second edge of the first conductor overlap each other, and
wherein each of the second region and the third region has a higher concentration of the first element than the first region.

9. The semiconductor device according to claim 8, wherein the first element is one selected from the group consisting of aluminum, boron, magnesium, silicon, titanium, vanadium, chromium, nickel, zinc, gallium, germanium, yttrium, zirconium, niobium, molybdenum, indium, tin, lanthanum, cerium, neodymium, hafnium, tantalum and tungsten.

10. The semiconductor device according to claim 7,
wherein the oxide semiconductor comprises oxygen and a second element, and
wherein one of the first insulator and the second insulator comprises oxygen and the second element.

11. The semiconductor device according to claim 10, wherein the second element is gallium.

12. The semiconductor device according to claim 8,
wherein the first region comprises a first portion and a second portion,
wherein the first portion and the first conductor overlap each other,
wherein the second portion and the fourth insulator overlap each other,
wherein the second portion has a higher concentration of a third element than the first portion, and
wherein the third element is one selected from the group consisting of helium, neon, argon, krypton, xenon, boron, nitrogen, fluorine, phosphorus, chlorine and arsenic.

13. The semiconductor device according to claim 7, wherein the sixth insulator comprises a projection, and wherein a periphery of the projection of the sixth insulator is located inside the periphery of the oxide semiconductor in the top view.

* * * * *